United States Patent
Hase

(10) Patent No.: US 12,267,050 B2
(45) Date of Patent: Apr. 1, 2025

(54) POWER AMPLIFIER CIRCUIT, POWER AMPLIFIER DEVICE, AND RF CIRCUIT MODULE

(71) Applicant: Murata Manufacturing Co., Ltd., Kyoto-fu (JP)

(72) Inventor: Masatoshi Hase, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 700 days.

(21) Appl. No.: 17/549,626

(22) Filed: Dec. 13, 2021

(65) Prior Publication Data
US 2022/0190795 A1 Jun. 16, 2022

(30) Foreign Application Priority Data

Dec. 14, 2020 (JP) .................. 2020-206717

(51) Int. Cl.
*H03F 1/30* (2006.01)
*H03F 3/195* (2006.01)
*H03F 3/24* (2006.01)

(52) U.S. Cl.
CPC ............. *H03F 3/245* (2013.01); *H03F 1/302* (2013.01); *H03F 3/195* (2013.01); *H03F 2200/451* (2013.01)

(58) Field of Classification Search
CPC .......... H03F 3/245; H03F 1/302; H03F 3/195; H03F 2200/451; H03F 1/3205; H03F 2200/18; H03F 2200/301; H03F 2200/456; H03F 2200/555; H03F 2200/75; H03F 1/3211; H03F 3/19; H03F 3/4508; H01L 2223/6644; H01L 23/66; H01L 27/0727

USPC .......................................................... 330/296
See application file for complete search history.

(56) References Cited

U.S. PATENT DOCUMENTS

| 7,439,810 B2 * | 10/2008 | Manicone | ............... H03F 3/193 330/296 |
| 2002/0067209 A1 * | 6/2002 | Luo | ........................ H03F 1/302 330/296 |

FOREIGN PATENT DOCUMENTS

JP 2010-283556 A 12/2010

* cited by examiner

Primary Examiner — Andrea Lindgren Baltzell
Assistant Examiner — Khiem D Nguyen
(74) Attorney, Agent, or Firm — Studebaker Brackett PLLC

(57) ABSTRACT

A power amplifier circuit includes an amplifier transistor which amplifies a radio frequency signal applied to its base and outputs the amplified signal; a resistance element having a first end, and a second end electrically connected to the base of the amplifier transistor; a first bias transistor having a collector to which a first voltage is applied, a base to which a first bias voltage is applied, and an emitter electrically connected to the first end of the resistance element and which supplies a bias current to the base of the amplifier transistor through the resistance element; and a second bias transistor having an emitter electrically connected to the emitter of the first bias transistor and the first end of the resistance element, a base to which a second bias voltage is applied, and a collector to which a second voltage lower than the first voltage is applied.

18 Claims, 57 Drawing Sheets

POWER AMPLIFIER CIRCUIT, POWER AMPLIFIER DEVICE, AND RF CIRCUIT MODULE

CROSS-REFERENCE TO RELATED APPLICATION

This application claims benefit of priority to Japanese Patent Application No. 2020-206717, filed Dec. 14, 2020, the entire content of which is incorporated herein by reference.

BACKGROUND

Technical Field

The present disclosure relates to a power amplifier circuit, a power amplifier device, and an RF circuit module.

Background Art

In a mobile communication device such as a mobile phone, the power of a radio frequency (RF) signal to be transmitted to a base station is amplified using a radio-frequency amplifier. In some radio-frequency amplifiers, a bias transistor of an emitter follower circuit may supply a bias to a radio-frequency amplifier transistor, as described, for example, in Japanese Unexamined Patent Application Publication No. 2010-283556.

As in a radio-frequency amplifier described in Japanese Unexamined Patent Application Publication No. 2010-283556, in which an emitter follower circuit is used to supply a bias to a radio-frequency amplifier transistor, if the current of an RF signal (which may be hereinafter referred to as an RF current) is increased in amplitude, the emitter follower circuit may be brought into a cut-off state.

FIG. 56 is a diagram illustrating a radio-frequency amplifier circuit 901 in a reference example. FIG. 57 is a diagram for describing the cut-off state. As illustrated in FIG. 56 and FIG. 57, in the radio-frequency amplifier circuit 901, a radio-frequency amplifier transistor 911 has a base to which an RF signal input to an input terminal 931 is to be input through a capacitor 914, a collector from which an amplified signal obtained by amplifying the RF signal is to be output to an output terminal 932, and an emitter that is grounded. A power supply voltage Vcc is supplied to the collector of the radio-frequency amplifier transistor 911 through an inductor 916. The base bias of the radio-frequency amplifier transistor 911 is supplied through a resistance element 912 disposed between a Bout terminal 934 and the base of the radio-frequency amplifier transistor 911.

A base bias circuit 921 outputs a base bias voltage and current from the Bout terminal 934, based on a bias control signal input to a bias input terminal 933. Specifically, in the base bias circuit 921, a bias transistor 913 has a base connected to the bias input terminal 933, a collector connected to a terminal to which a battery voltage Vbat is to be supplied, and an emitter connected to the Bout terminal 934. A capacitor 915 is disposed between the bias input terminal 933 and ground.

When the radio-frequency amplifier transistor 911 is in operation, a base bias current Ieef flowing from the Bout terminal 934 to the resistance element 912 is, for example, a current obtained by superimposing an AC RF current on a DC current. Specifically, for example, when an RF current having a small amplitude changes with time along a sine curve, a base bias current I941 (see FIG. 57) having a waveform where the sine curve is shifted in the positive direction flows from the Bout terminal 934 to the resistance element 912.

However, for example, when an RF current having a large amplitude changes with time along a sine curve, the base bias circuit 921 may be brought into a cut-off state in which the base bias current Ieef is not supplied for a certain period of time. Specifically, a base bias current I942 in which a portion of the waveform of the RF current changing along the sine curve where a negative current is to flow has zero amperes flows from the Bout terminal 934 to the resistance element 912 (see FIG. 57). This is because the rectification effect of the junction between the base and the emitter of the bias transistor 913 prevents a flow of the base bias current Ieef less than zero.

Since the base bias current I942 has zero amperes at a portion where a negative current is to flow, a DC current DC942 obtained by time averaging the base bias current I942 is larger than a DC current DC941 obtained by time averaging the base bias current I941.

That is, the time average of the base bias current Ieef increases with an increase in the amplitude of the RF current, which changes the operating point of the radio-frequency amplifier transistor 911. Typically, if the operating point of the radio-frequency amplifier transistor 911 changes, the amplification factor of the radio-frequency amplifier transistor 911 changes, causing deterioration of the linearity of the relationship between the input and output of the radio-frequency amplifier circuit 901, which is not desirable.

SUMMARY

The present disclosure has been made in view of the foregoing situation, and provides a power amplifier circuit, a power amplifier device, and an RF circuit module that suppress a change in the operating point of an amplifier transistor and suppress deterioration in the linearity of a relationship between input and output.

A power amplifier circuit according to an aspect of the present disclosure includes an amplifier transistor having a base to which a radio frequency signal is to be supplied and configured to amplify the radio frequency signal and output the amplified radio frequency signal; a resistance element having a first end, and a second end electrically connected to the base of the amplifier transistor; a first bias transistor having a collector to which a first voltage is to be applied, a base to which a first bias voltage is to be applied, and an emitter electrically connected to the first end of the resistance element and configured to supply a bias current to the base of the amplifier transistor through the resistance element; and a second bias transistor having an emitter electrically connected to the emitter of the first bias transistor and the first end of the resistance element, a base to which a second bias voltage is to be applied, and a collector to which a second voltage lower than the first voltage is to be applied.

According to the present disclosure, it is possible to provide a power amplifier circuit, a power amplifier device, and an RF circuit module that suppress a change in the operating point of an amplifier transistor and suppress deterioration in the linearity of a relationship between input and output.

DETAILED DESCRIPTION

Figure 1A:
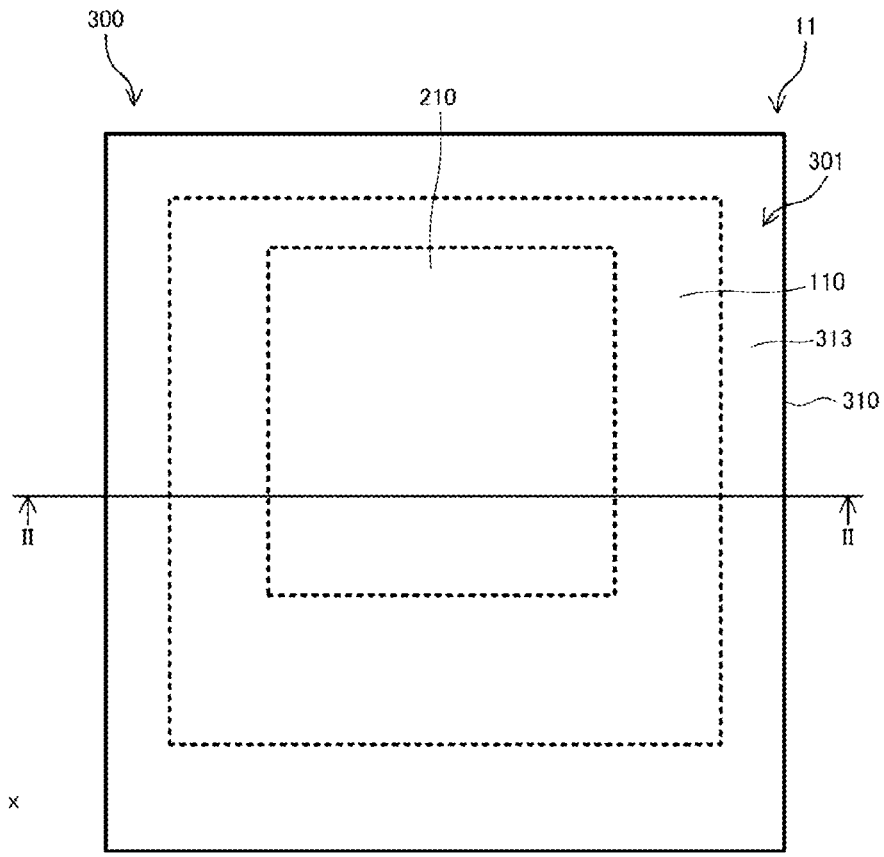
FIG. 1A is a plan view of an RF circuit module 300.

Embodiments of the present disclosure will be described in detail hereinafter with reference to the drawings. The same elements are denoted by the same reference numerals, and a redundant description thereof will be omitted.

First Embodiment

An overview of an RF circuit module according to a first embodiment will be described.

Figure 1B:
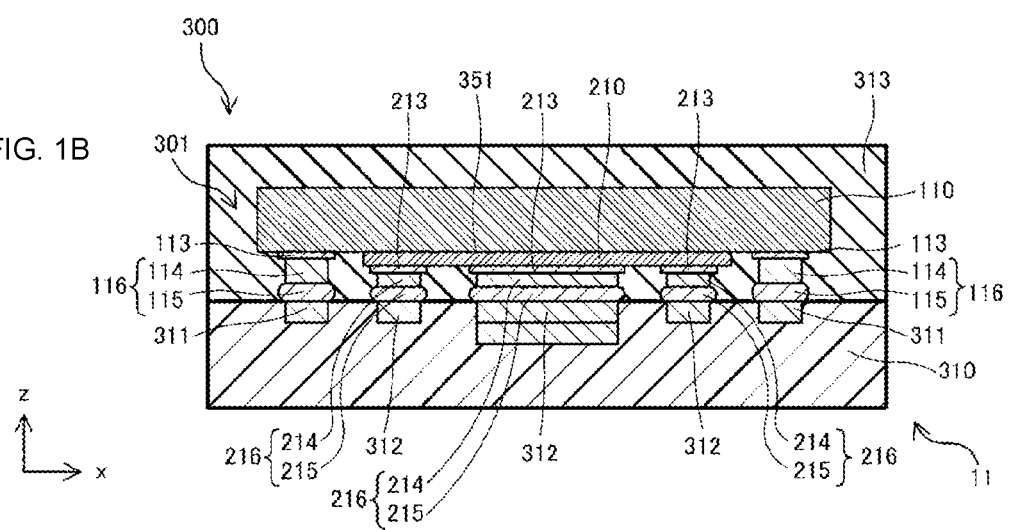
FIG. 1B is a schematic sectional view of the RF circuit module 300, taken along line II-II of FIG. 1A.

FIG. 1A is a plan view of an RF circuit module 300. FIG. 1B is a schematic sectional view of the RF circuit module 300, taken along line II-II of FIG. 1A.

As illustrated in FIG. 1A and FIG. 1B, the RF circuit module 300 includes a power amplifier device 11 and a mold resin 313. The power amplifier device 11 includes a power amplifier (PA) circuit element 301 and a module substrate 310. The PA circuit element 301 includes a first member 110, a second member 210, first-member-side electrodes 113, first conductor protrusions 116 (first member-side conductor protrusion portion), second-member-side electrodes 213, second conductor protrusions 216 (second member-side conductor protrusion portion), and a member-to-member connection conductor 351. Each of the first conductor protrusions 116 includes a conductor pillar 114 and a solder layer 115. Each of the second conductor protrusions 216 includes a conductor pillar 214 and a solder layer 215.

Some drawings may illustrate an x axis, a y axis, and a z axis. The x axis, the y axis, and the z axis form a three-dimensional right-handed Cartesian coordinate system. In the following, the direction of an arrow along the z axis may be referred to as the positive direction of the z axis, and a direction opposite to the direction of the arrow may be referred to as the negative direction of the z axis. The same applies to the other axes. The positive direction of the z axis and the negative direction of the z axis may be referred to as the "upward direction" and the "downward direction", respectively.

The module substrate 310 is, for example, a printed circuit board (PCB) such as a glass substrate or an epoxy substrate and has a rectangular parallelepiped shape. The module substrate 310 includes substrate-side electrodes 311 and 312 for mounting components. The mold resin 313 is, for example, an epoxy resin.

The first member 110 has higher thermal conductivity than the second member 210. The second member 210 has a smaller thickness than the first member 110. In this embodiment, the first member 110 is, for example, a member made of an elemental semiconductor and has a rectangular parallelepiped shape. Specifically, the first member 110 is manufactured by an integrated circuit process (which may be hereinafter referred to as a first integrated circuit process) using as a material a semiconductor containing a group IV element as a main component.

The semiconductor containing a group IV element as a main component is, for example, a semiconductor containing silicon (Si) as a main component. The first integrated circuit process is, for example, a complementary metal oxide semiconductor (CMOS) or bipolar CMOS (BiCMOS) process. That is, a semiconductor containing silicon (Si) as a main component has a circuit (which may be hereinafter referred to as a first circuit), which is formed by the first integrated circuit process. The first member 110 may be manufactured by a first integrated circuit process using as a material a semiconductor containing silicon germanium (SiGe), carbon (C), or silicon carbide (SiC) as a main component.

In this embodiment, the second member 210 is, for example, a member made of a compound semiconductor and has a rectangular parallelepiped shape. Specifically, the second member 210 is manufactured by an integrated circuit process (which may be hereinafter referred to as a second integrated circuit process) using as a material a semiconductor containing a compound of a group III element and a group V element as a main component. The semiconductor described above is, for example, a semiconductor containing gallium arsenide (GaAs) as a main component. The second integrated circuit process is, for example, a GaAs heterojunction bipolar transistor (HBT) or GaAs pseudo-morphic high electron mobility transistor (pHEMT) process. That is, a semiconductor containing GaAs as a main component has a circuit (which may be hereinafter referred to as a second circuit), which is formed by the GaAs HBT or GaAs pHEMT process. The second circuit includes, for example, an amplifier that amplifies an RF signal (radio frequency signal).

The second member 210 may be manufactured by a second integrated circuit process (for example, InP HBT or InP pHEMT) using as a material a semiconductor containing indium phosphide (InP) as a main component or by a second integrated circuit process (for example, GaN HBT or GaN HEMT) using as a material a semiconductor containing gallium nitride (GaN) as a main component.

The first circuit in the first member 110 and the second circuit in the second member 210 are electrically connected to each other by the member-to-member connection conductor 351 without the intervention of the module substrate 310. In this embodiment, the member-to-member connection conductor 351 is a conductor formed on or in any one of the first member 110 and the second member 210, for example.

Figure 2A:
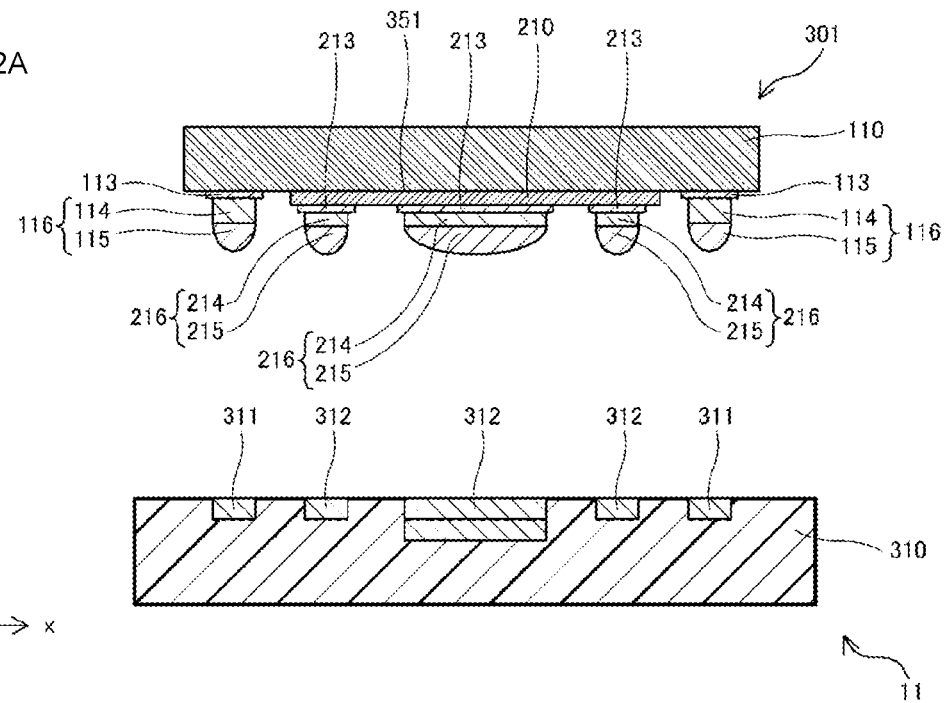
FIGS. 2A and 2B are views illustrating manufacturing steps for the RF circuit module 300.
Figure 2B:
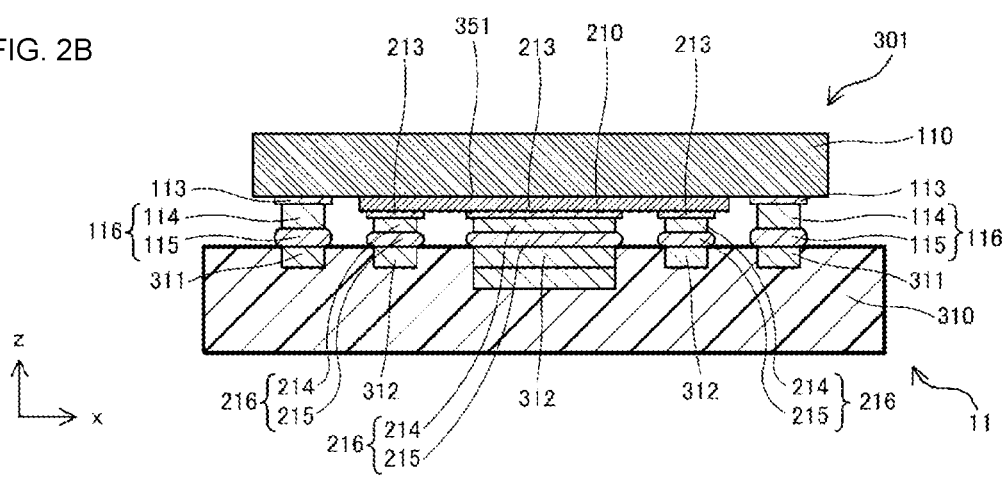

FIG. 2A and FIG. 2B are views illustrating manufacturing steps for the RF circuit module 300. FIG. 2A is a sectional view of the PA circuit element 301 immediately before the PA circuit element 301 is mounted on the module substrate 310. FIG. 2B is a sectional view of the PA circuit element 301 after the PA circuit element 301 is mounted on the module substrate 310.

A method for forming the PA circuit element 301 will be described below. The PA circuit element 301 has on a lower surface thereof the first conductor protrusions 116 and the second conductor protrusions 216. The first conductor protrusions 116 and the second conductor protrusions 216 of the PA circuit element 301 are aligned with the substrate-side electrodes 311 and the substrate-side electrodes 312 in the module substrate 310, respectively, and are heated under pressure. As a result, as illustrated in FIG. 2B, the solder layers 115 of the first conductor protrusions 116 and the solder layers 215 of the second conductor protrusions 216 of the PA circuit element 301 are connected to the substrate-side electrodes 311 and the substrate-side electrodes 312, respectively.

Figure 3:
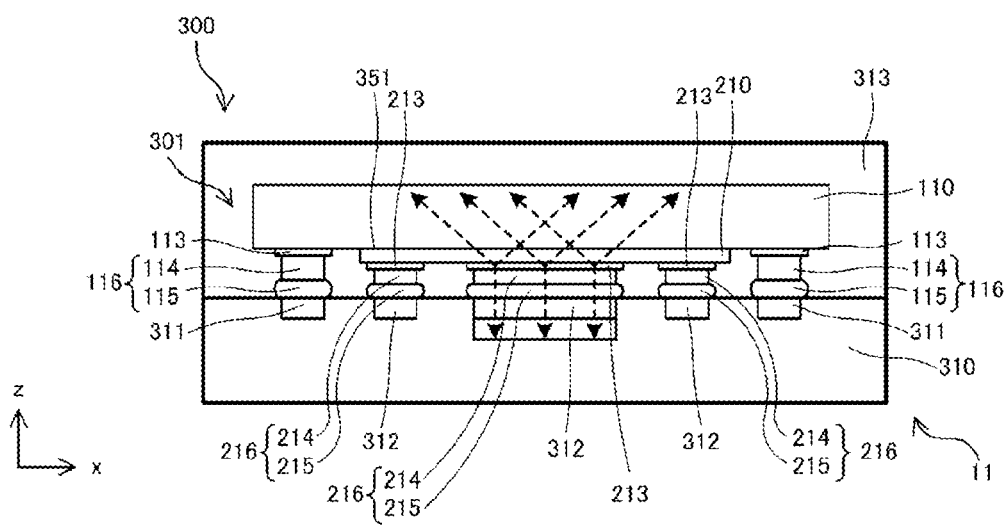
FIG. 3 is a view illustrating two heat conduction paths in the RF circuit module 300, which are heat radiation paths from circuit elements formed on a second member 210.

FIG. 3 is a view illustrating two heat conduction paths in the RF circuit module 300, which are heat radiation paths from circuit elements formed on the second member 210. In FIG. 3, the dashed arrows represent the two heat conduction paths. A first heat conduction path is made up of the second-member-side electrode 213 and the second conductor protrusion 216. Heat generated by the circuit elements is radiated and exhausted to the substrate-side electrode 312 and the module substrate 310 through first heat conduction path. A second heat conduction path is a heat conduction path in a direction from the second member 210 to the first member 110. Heat generated by the circuit elements is radiated and exhausted through the second heat conduction path.

Figure 4:
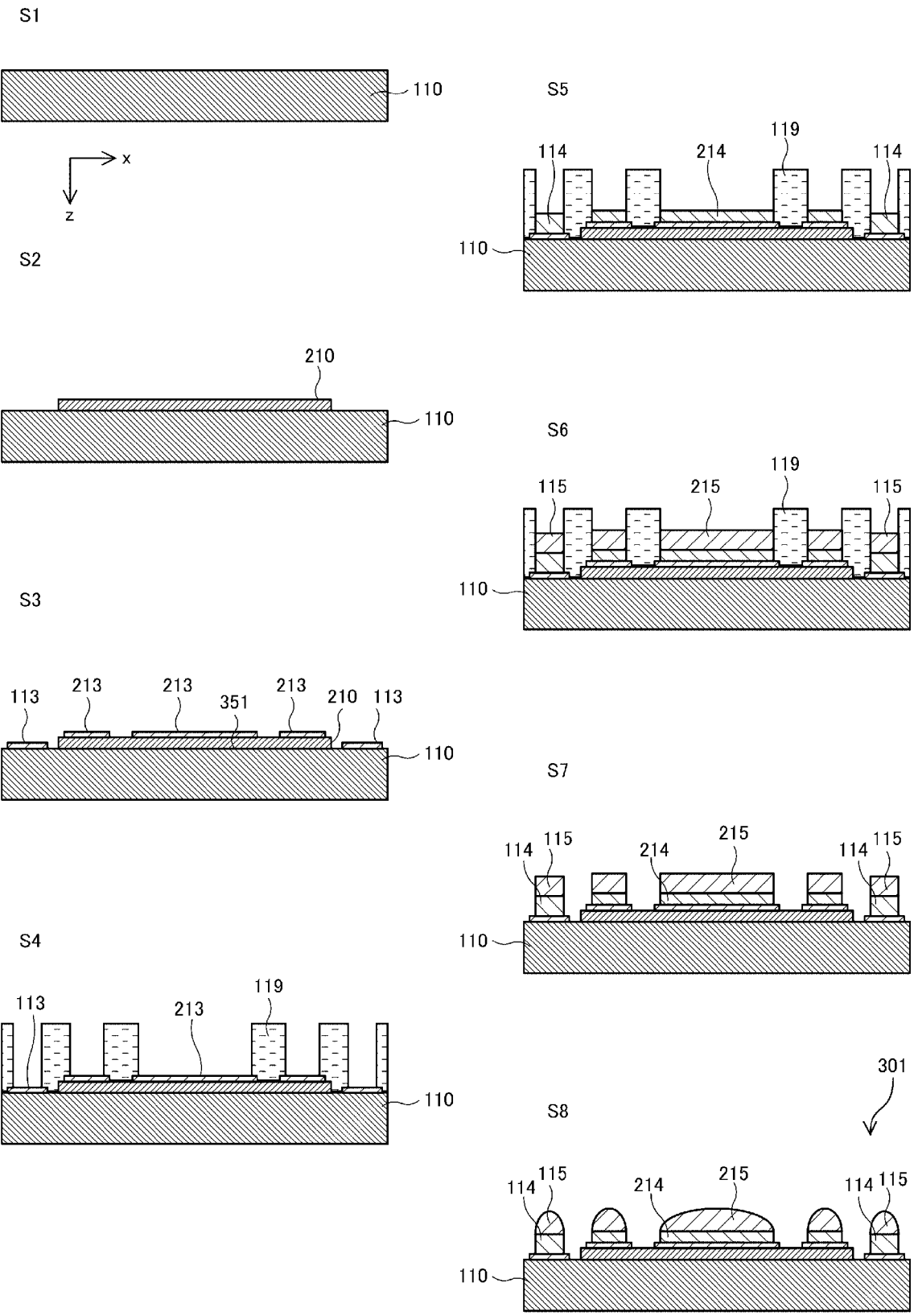
FIG. 4 illustrates views of a method for manufacturing a PA circuit element 301.

FIG. 4 illustrates views of a method for manufacturing the PA circuit element 301. In FIG. 4, the views of steps S1 to S7 are sectional views of the PA circuit element 301 during manufacturing, and the view of step S8 is a sectional view of the PA circuit element 301 after completion. Manufacturing is actually performed wafer by wafer. FIG. 4 illustrates a single semiconductor device.

As illustrated in FIG. 4, first, the first member 110 is placed. The first member 110 has circuit elements, electrodes, the like, which have been formed in separate steps. The first member 110 may have on a surface thereof a bonding layer, which is formed by using a typical semiconductor process, as necessary. The bonding layer is a metal film such as a Au film, an organic material film such as a polyimide (PI) film, a polybenzoxazole (PBO) film, or a benzocyclobutene (BCB) film, or an insulator made of AlN, SiC, diamond, or the like (step S1).

Then, the second member 210 is joined onto the first member 110. The second member 210 has circuit elements and electrodes, which have been formed in separate steps described below (step S2).

Then, the second-member-side electrodes 213 are formed on the second member 210, and the first-member-side electrodes 113 are formed on the first member 110 by a typical semiconductor process. Further, the member-to-member connection conductor 351 is formed to electrically connect the first member 110 and the second member 210 to each other. The second-member-side electrodes 213, the first-member-side electrodes 113, and the member-to-member connection conductor 351 may be simultaneously formed if there is no problem in the manufacturing process (step S3).

Then, a resist film 119 is formed so as to have openings in regions where the first conductor protrusions 116 and the second conductor protrusions 216 (see FIG. 2A and FIG. 2B) are to be formed. The first-member-side electrodes 113 or the second-member-side electrodes 213 are exposed from the openings in the resist film 119 (step S4).

Then, the conductor pillars 114 and 214 are deposited by plating on the first-member-side electrodes 113 and the second-member-side electrodes 213 exposed within the openings in the resist film 119, respectively. The conductor pillars 114 and 214 are made of Cu, for example. Each of the conductor pillars 114 and 214 has a thickness of, for example, 40 μm (step S5).

Then, the solder layers 115 and 215 are deposited by plating on the conductor pillars 114 and 214 deposited within the openings in the resist film 119, respectively. The solder layers 115 and 215 are made of a Sn—Ag alloy, for example. Each of the solder layers 115 and 215 has a thickness of, for example, 30 μm. As a result, the first conductor protrusions 116 and the second conductor protrusions 216 are formed (step S6).

Then, the resist film 119 is removed. Finally, the solder layers 115 and 215 are melted by a reflow process and are then solidified (step S7). As a result, the PA circuit element 301 is completed (step S8).

A structure, such as the first conductor protrusions 116, in which the conductor pillar 114 is made of Cu in step S5 and the solder layer 115 is placed on the conductor pillar 114 in step S6 is referred to as a "Cu pillar bump (CPB: copper pillar bump)". Each of the first conductor protrusions 116 may have a structure in which no solder is placed on the upper surface, such as a Au bump. A protrusion having such a structure is also referred to as a "pillar". Alternatively, each of the first conductor protrusions 116 may have a structure in which a conductor post stands upright on a pad. A conductor protrusion having such a structure is also referred to as a "post". Alternatively, each of the first conductor protrusions 116 may be a ball bump produced by reflowing the solder into a ball. A conductor protrusion having any other structure including a conductor projecting from the substrate may be used. The second conductor protrusions 216 may have a configuration similar to that of the first conductor protrusions 116.

Figure 5:
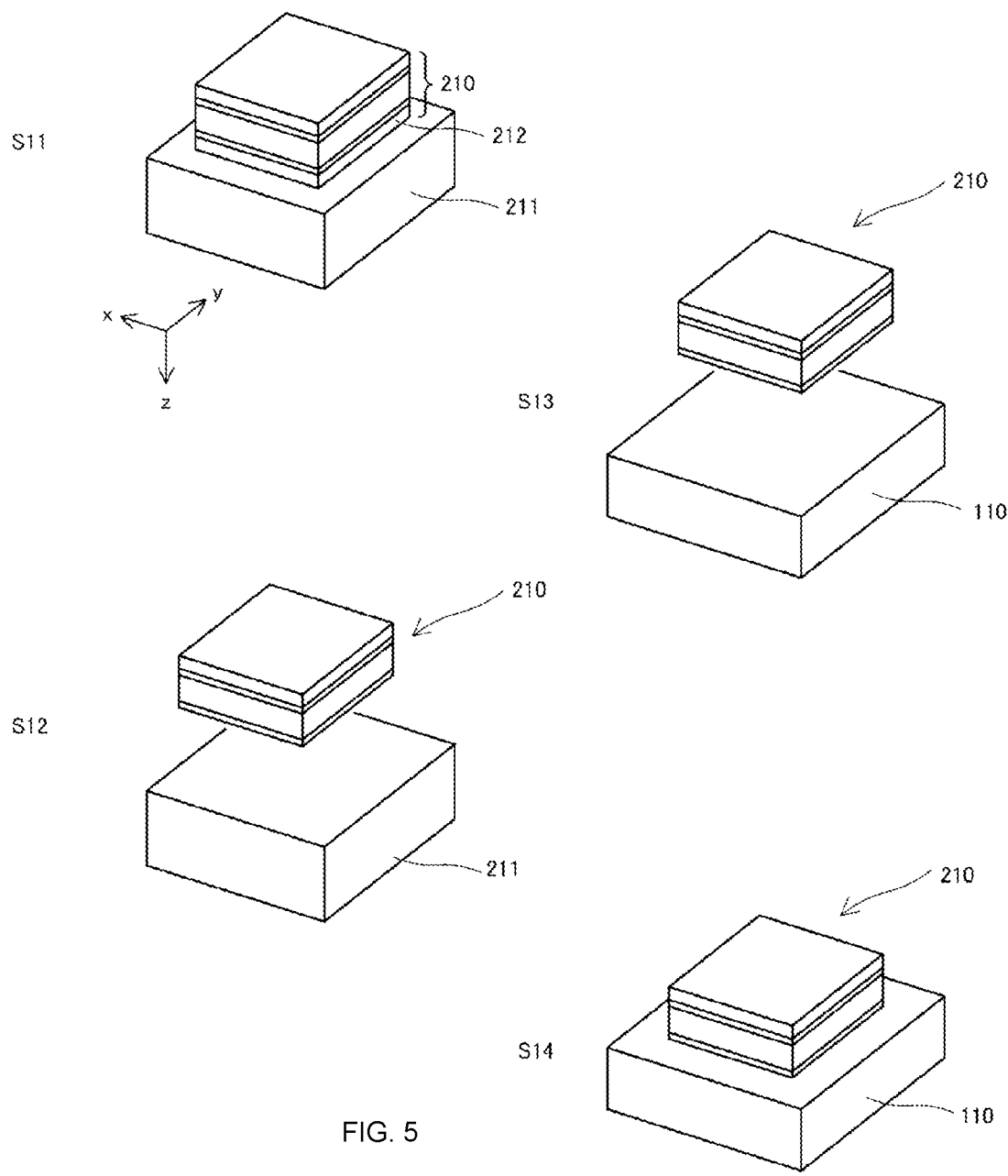
FIG. 5 illustrates views for describing a method for manufacturing the second member 210 and a method for joining the second member 210 to a first member 110.

FIG. 5 illustrates views for describing a method for manufacturing the second member 210 and a method for joining the second member 210 to the first member 110. FIG. 5 illustrates perspective views in the respective steps. Manufacturing is actually performed wafer by wafer. FIG. 5 illustrates a single semiconductor device.

As illustrated in FIG. 5, first, a release layer 212 is formed on a base substrate 211, which is a compound semiconductor member, and a semiconductor thin film is formed on the surface of the release layer 212 in the negative direction of the z axis by an epitaxial growth method. Then, a plurality of circuit elements and electrodes to be connected to the circuit elements are formed on the semiconductor thin film. This portion corresponds to the second member 210 (step S11).

Then, a process of selectively etching only the release layer 212 is performed to release the second member 210 (semiconductor thin film piece) from the base substrate 211 (step S12).

Then, the second member 210 is joined to the first member 110 (by bonding). That is, the semiconductor thin film piece is transferred, or moved to and fixed, to the first member 110 from the base substrate 211. In this embodiment, the first member 110 and the second member 210 are coupled via Van der Waals bonding or hydrogen bonding (step S13).

The first member 110 and the second member 210 may be joined together by electrostatic force, covalent bonding, eutectic alloy bonding, or the like. Alternatively, the first member 110 and the second member 210 may be joined together by eutectic bonding using a Au film. Specifically, a Au film serving as a bonding layer is formed on the first member 110 in a separate step. The second member 210 is brought into close contact with the surface of the bonding layer under pressure to diffuse Au of the bonding layer in a GaAs layer of the second member 210 to achieve eutectic bonding of Au and GaAs. As a result, the first member 110 and the second member 210 are joined together.

The circuit elements and the electrodes may be formed on the second member 210 not in the stage indicated by step S11 but in, as indicated by step S14, a process applied to the second member 210 (photolithography etching step) after the second member 210 is joined to the first member 110.

Wiring formed after the second member 210 and the first member 110 are joined together may be hereinafter referred to as rewiring. Some rewiring includes wiring for electrically connecting the first circuit in the first member 110 and the second circuit in the second member 210 to each other without the intervention of the module substrate 310. In one example, the member-to-member connection conductor 351 is such rewiring.

The semiconductor thin film piece described above may be released and transferred by using the following method, for example. That is, in step S11 in FIG. 5, a support is bonded to the side of the second member 210 in the negative direction of the z axis. Then, as indicated by step S12 in FIG. 5, the second member 210 (semiconductor thin film piece) is released from the base substrate 211 with the second member 210 being supported by the support while the second member 210 is released from the base substrate 211. Further, as indicated by step S13 in FIG. 5, the second member 210 is joined to the first member 110 with the second member 210 being supported by the support. After the second member 210 is joined to the first member 110, the support is released from the second member 210. In steps S11 to S13 in FIG. 5, for the sake of illustration of the second member 210, the support is not illustrated.

The RF circuit module 300 according to this embodiment having the configuration described above achieves the following advantages.

(a) Since the first member 110 is flip-chip bonded (mounted face down) to the module substrate 310, there is no need for a space for pads and wires for wire bonding. Thus, the entire size of the RF circuit module 300 can be reduced.

(b) Since the first member 110 has the first conductor protrusions 116 to be connected to the substrate-side electrodes 311 in the module substrate 310, and the second member 210 has the second conductor protrusions 216 to be connected to the substrate-side electrodes 312 in the module substrate 310, the first circuit formed in the first member 110 and the second circuit formed in the second member 210 are electrically connected to the module substrate 310. In addition, since the first circuit and the second circuit are electrically connected to each other through the member-to-member connection conductor 351 without the intervention of the module substrate 310, there is no need to form wiring in the module substrate 310 to connect the first circuit and the second circuit to each other. Accordingly, the entire size of the RF circuit module 300 can be reduced.

(c) Since heat generated by an amplifier and the like included in the second circuit formed in the second member 210 can be radiated and exhausted with high efficiency, the RF circuit module 300 reduced in size without constraints to heat radiation properties or the RF circuit module 300 having heat radiation properties with a small size can be realized.

Power Amplifier Circuit

A power amplifier circuit according to the first embodiment will be described.

Figure 6:
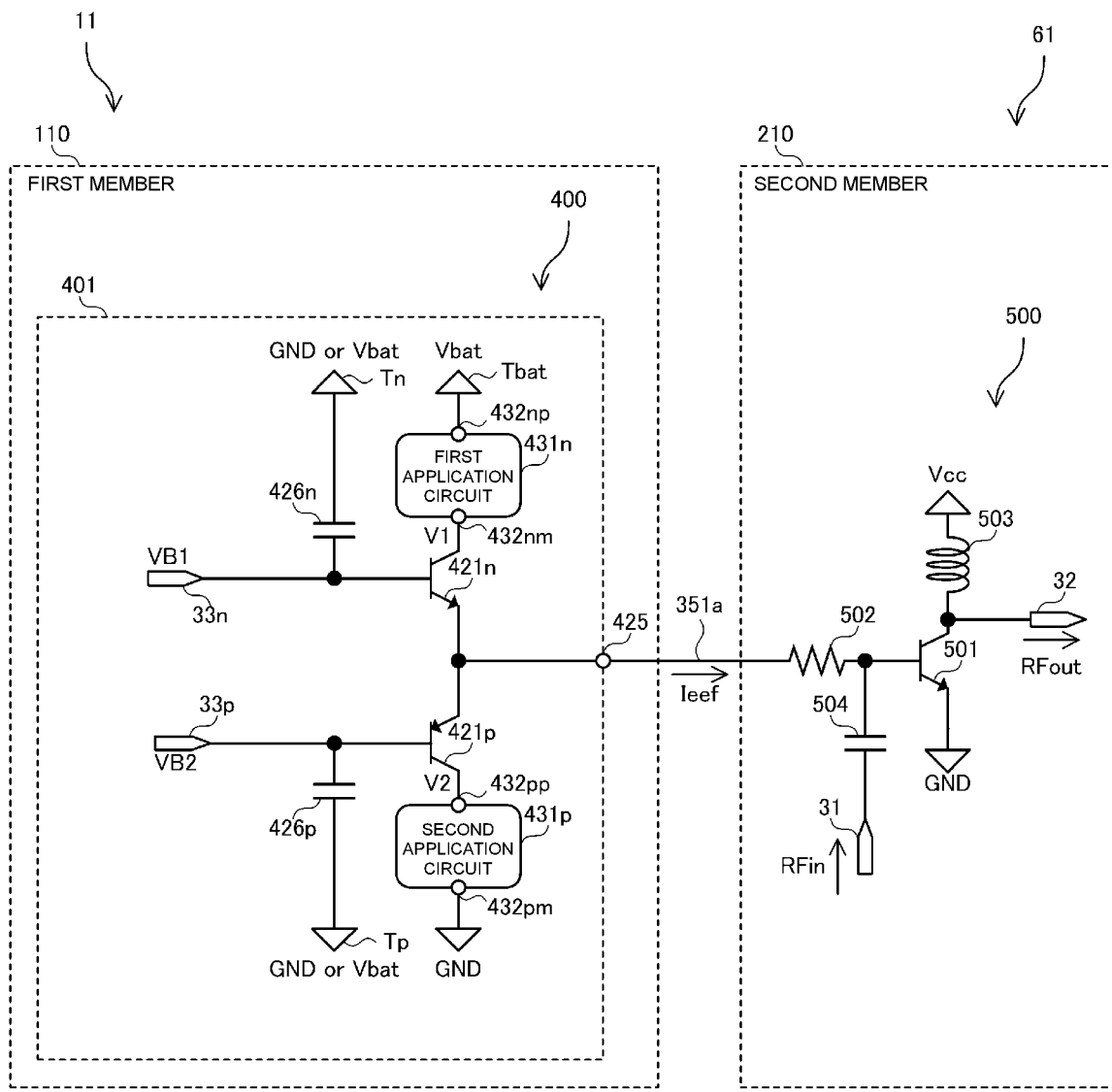
FIG. 6 is a circuit diagram of a power amplifier circuit 61.

FIG. 6 is a circuit diagram of a power amplifier circuit 61. As illustrated in FIG. 6, the power amplifier circuit 61 includes a first circuit 400, a second circuit 500, and a member-to-member connection conductor 351a. The first circuit 400 includes a base bias circuit 401. The base bias circuit 401 includes a first bias transistor 421n, a second bias transistor 421p, capacitors 426n and 426p, a first application circuit 431n, and a second application circuit 431p. The second circuit 500 includes an amplifier transistor 501, a resistance element 502, an inductor 503, and a capacitor 504.

The power amplifier circuit 61 is a circuit that amplifies an input signal RFin (RF signal) input from an input terminal 31 and outputs an output signal RFout from an output terminal 32.

In this embodiment, the transistors such as the first bias transistor 421n, the second bias transistor 421p, and the amplifier transistor 501 are implemented by, for example, bipolar transistors such as HBTs. The transistors described above may be each implemented by any other transistor such as a field-effect transistor (metal-oxide-semiconductor field-effect transistor (MOSFET)). In this case, the base, the collector, and the emitter may be read as the gate, the drain, and the source, respectively.

The amplifier transistor 501 has a base to which the input signal RFin is to be supplied, and is configured to amplify the input signal RFin and output the amplified signal. Specifically, the base of the amplifier transistor 501 is supplied with a bias from the base bias circuit 401 through the member-to-member connection conductor 351a and the resistance element 502, and also supplied with the input signal RFin from the input terminal 31 through the capacitor 504.

More specifically, the resistance element 502 has a first end electrically connected to a Bout terminal 425 of the base bias circuit 401 via the member-to-member connection conductor 351a, and a second end. The capacitor 504 has a first end connected to the input terminal 31, and a second end. The amplifier transistor 501 has a base electrically connected to the second end of the resistance element 502 and the second end of the capacitor 504, a collector connected to a terminal for supplying the power supply voltage Vcc through the inductor 503 and connected to the output terminal 32, and an emitter that is grounded. The amplifier transistor 501 amplifies the input signal RFin supplied from the input terminal 31 through the capacitor 504, and outputs the output signal RFout as a result of the amplification to the output terminal 32.

While the power amplifier circuit 61 includes a single unit cell including the amplifier transistor 501, the resistance element 502, and the capacitor 504, it is not limited to this configuration. The power amplifier circuit 61 may include a plurality of unit cells, and the plurality of unit cells may be connected in parallel.

While the inductor 503 is included in the second circuit 500, it is not limited to this configuration. For example, the inductor 503 may be formed by a wiring pattern in the module substrate 310. For example, the inductor 503 may be mounted on the power amplifier circuit 61 by surface mounted device (SMD).

The base bias circuit 401 generates a bias to be supplied to the base of the amplifier transistor 501, and outputs the generated bias to the Bout terminal 425. Specifically, a bias input terminal 33n of the base bias circuit 401 is supplied with a first bias voltage VB1 to be applied to the first bias transistor 421n. A bias input terminal 33p is supplied with a second bias voltage VB2 to be applied to the second bias transistor 421p.

The capacitor 426n has a first end connected to the bias input terminal 33n, and a second end connected to a terminal Tn. The capacitor 426p has a first end connected to the bias input terminal 33p, and a second end connected to a terminal Tp. Each of the terminals Tn and Tp is connected to ground or is supplied with the battery voltage Vbat.

The first application circuit 431n has a positive terminal 432np connected to a terminal Tbat (power supply) to which the battery voltage Vbat is to be supplied, and a negative terminal 432nm connected to the collector of the first bias transistor 421n.

The second application circuit 431p has a positive terminal 432pp connected to the collector of the second bias transistor 421p, and a negative terminal 432pm that is grounded.

For example, when the second circuit 500 is made of a semiconductor containing GaAs as a main component, a threshold voltage at which the amplifier transistor 501 is turned on (which may be hereinafter referred to as a turn-on voltage) is approximately 1.4 volts. For example, when the first circuit 400 is made of a semiconductor containing Si as a main component, the first bias transistor 421n and the second bias transistor 421p have each a turn-on voltage of approximately 0.7 volts.

Thus, the voltage across the negative terminal 432nm of the first application circuit 431n relative to the ground is preferably larger than 2.1 volts obtained by adding the turn-on voltage of the first bias transistor 421n to the turn-on voltage of the amplifier transistor 501.

The voltage across the positive terminal 432pp of the second application circuit 431p relative to the ground is preferably larger than 0.7 volts obtained by subtracting the turn-on voltage of the second bias transistor 421p from the turn-on voltage of the amplifier transistor 501.

The first application circuit 431n applies a first voltage V1 to the collector of the first bias transistor 421n. The first voltage V1 is lower than the battery voltage Vbat and higher than a voltage obtained by adding the turn-on voltage of the first bias transistor 421n to the turn-on voltage of the amplifier transistor 501. The details of the first application circuit 431n will be described below.

The second application circuit 431p applies a second voltage V2 to the collector of the second bias transistor 421p. The second voltage V2 is higher than the ground and higher than a voltage obtained by subtracting the turn-on voltage of the second bias transistor 421p from the turn-on voltage of the amplifier transistor 501. The details of the second application circuit 431p will be described below.

The first bias transistor 421n is an npn-type transistor and has a collector, a base electrically connected to the bias input terminal 33n, and an emitter electrically connected to the Bout terminal 425 and configured to supply a bias current to the base of the amplifier transistor 501 through the Bout terminal 425 and the resistance element 502. The first voltage V1 is applied to the collector of the first bias transistor 421n by the first application circuit 431n. The first bias voltage VB1 is applied to the base of the first bias transistor 421n to control a current flowing from the collector to the emitter.

The second bias transistor 421p is a pnp-type transistor and has an emitter electrically connected to the emitter of the first bias transistor 421n and the Bout terminal 425, a base electrically connected to the bias input terminal 33p, and a collector. The second voltage V2, which is lower than the first voltage V1, is applied to the collector of the second bias transistor 421p by the second application circuit 431p. The second bias voltage VB2 is applied to the base of the second bias transistor 421p to control a current flowing from the emitter to the collector.

While the power amplifier circuit 61 includes a single amplifier transistor 501, it is not limited to this configuration. The power amplifier circuit 61 may include a plurality of amplifier transistors 501. Specifically, for example, a first-stage amplifier may be disposed between the input terminal 31 and the amplifier transistors 501.

A first example of the first application circuit 431n and the second application circuit 431p will be described.

Figure 7:
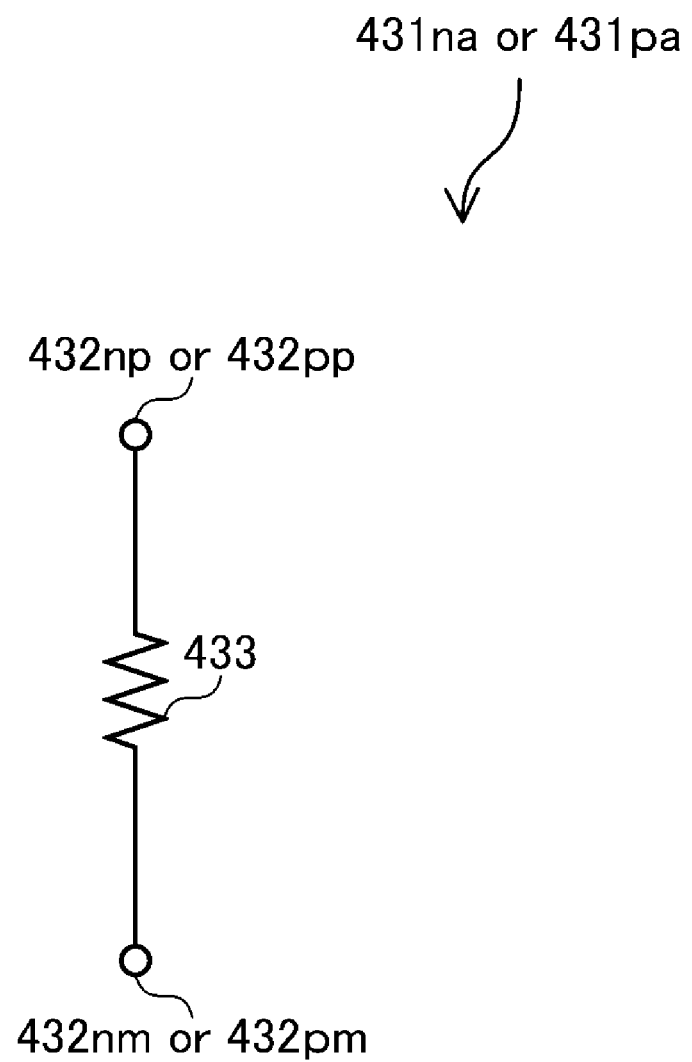
FIG. 7 is a circuit diagram of a first example of a first application circuit 431*n* and a second application circuit 431*p*.

FIG. 7 is a circuit diagram of the first example of the first application circuit 431n and the second application circuit 431p. As illustrated in FIG. 7, the first example of the first application circuit 431n and the second application circuit 431p (which may be hereinafter referred to as a first application circuit 431na and a second application circuit 431pa, respectively) includes a resistance element 433.

The resistance element 433 has a first end and a second end. The first end and the second end of the resistance element 433 included in the first application circuit 431na are electrically connected to the positive terminal 432np and the negative terminal 432nm, respectively. The first end and the second end of the resistance element 433 included in the second application circuit 431pa are electrically connected to the positive terminal 432pp and the negative terminal 432pm, respectively.

For example, when a current flows from the terminal Tbat to the ground through the resistance element 433 in the first application circuit 431na, the first bias transistor 421n, the second bias transistor 421p, and the resistance element 433 in the second application circuit 431pa, the difference between the potential of the positive terminal 432np and the potential of the negative terminal 432nm in the first application circuit 431na (which may be hereinafter referred to as a first drop voltage) is a voltage having a value obtained by multiplying the current and the resistance value of the resistance element 433. That is, the potential of the negative terminal 432nm relative to the ground, or the first voltage V1, is a voltage having a value obtained by subtracting the first drop voltage from the battery voltage Vbat.

The difference between the potential of the positive terminal 432pp and the potential of the negative terminal 432pm in the second application circuit 431pa (which may be hereinafter referred to as a second drop voltage) is a voltage having a value obtained by multiplying the current and the resistance value of the resistance element 433. That is, the potential of the positive terminal 432pp relative to the ground, or the second voltage V2, is a voltage having a value obtained by adding the second drop voltage to zero volts at the ground.

A second example of the first application circuit 431n and the second application circuit 431p will be described.

Figure 8:
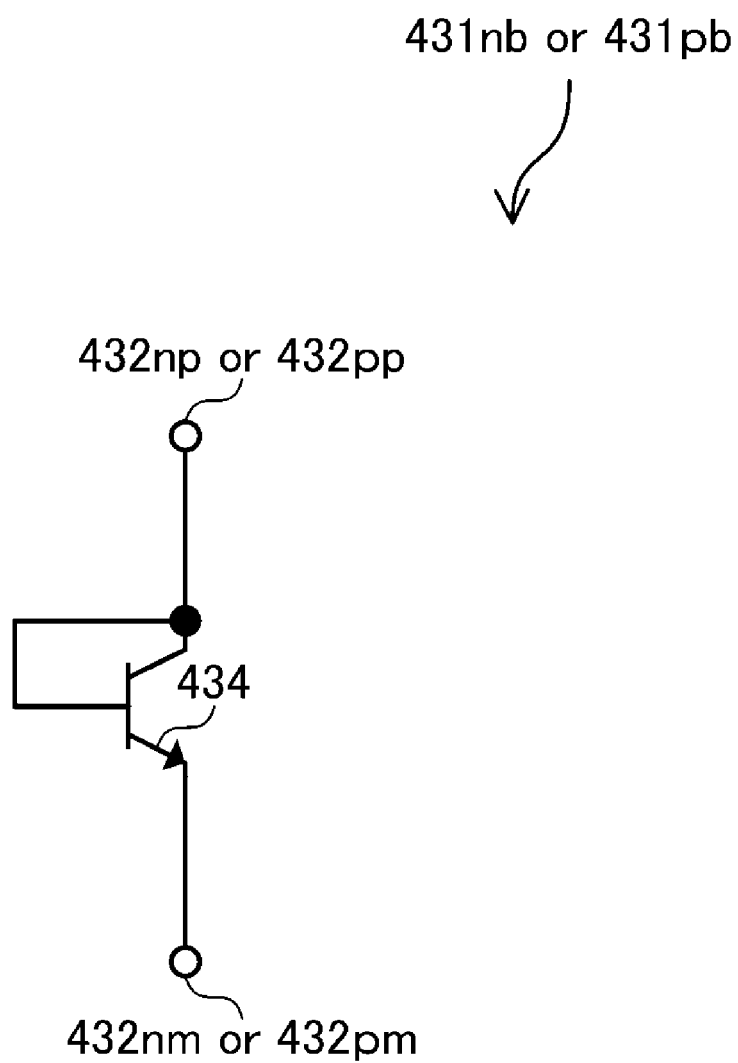
FIG. 8 is a circuit diagram of a second example of the first application circuit 431*n* and the second application circuit 431*p*.

FIG. 8 is a circuit diagram of the second example of the first application circuit 431n and the second application circuit 431p. As illustrated in FIG. 8, the second example of the first application circuit 431n and the second application circuit 431p (which may be hereinafter referred to as a first application circuit 431nb and a second application circuit 431pb, respectively) includes an npn-type transistor 434.

The transistor 434 has a collector, a base connected to the collector thereof, and an emitter. The connection between the collector and the base of a transistor may be hereinafter referred to as diode connection. The collector and the emitter of the transistor 434 included in the first application circuit 431nb are electrically connected to the positive terminal 432np and the negative terminal 432nm, respectively. The collector and the emitter of the transistor 434 included in the second application circuit 431pb are electrically connected to the positive terminal 432pp and the negative terminal 432pm, respectively.

When a current flows from the collector to the emitter of the transistor 434, which is diode connected, the transistor 434 operates as a diode, and thus the first drop voltage is the difference between the potential of the base of the transistor 434 and the potential of the emitter of the transistor 434, that is, a base-emitter voltage Vbe. That is, the potential of the negative terminal 432nm relative to the ground, or the first voltage V1, is a voltage having a value obtained by subtracting the base-emitter voltage Vbe from the battery voltage Vbat.

Since the second drop voltage in the second application circuit 431pb is also the base-emitter voltage Vbe, the potential of the positive terminal 432pp relative to the ground, or the second voltage V2, is a voltage having a value obtained by adding the base-emitter voltage Vbe to zero volts at the ground.

A third example of the first application circuit 431n and the second application circuit 431p will be described.

Figure 9:
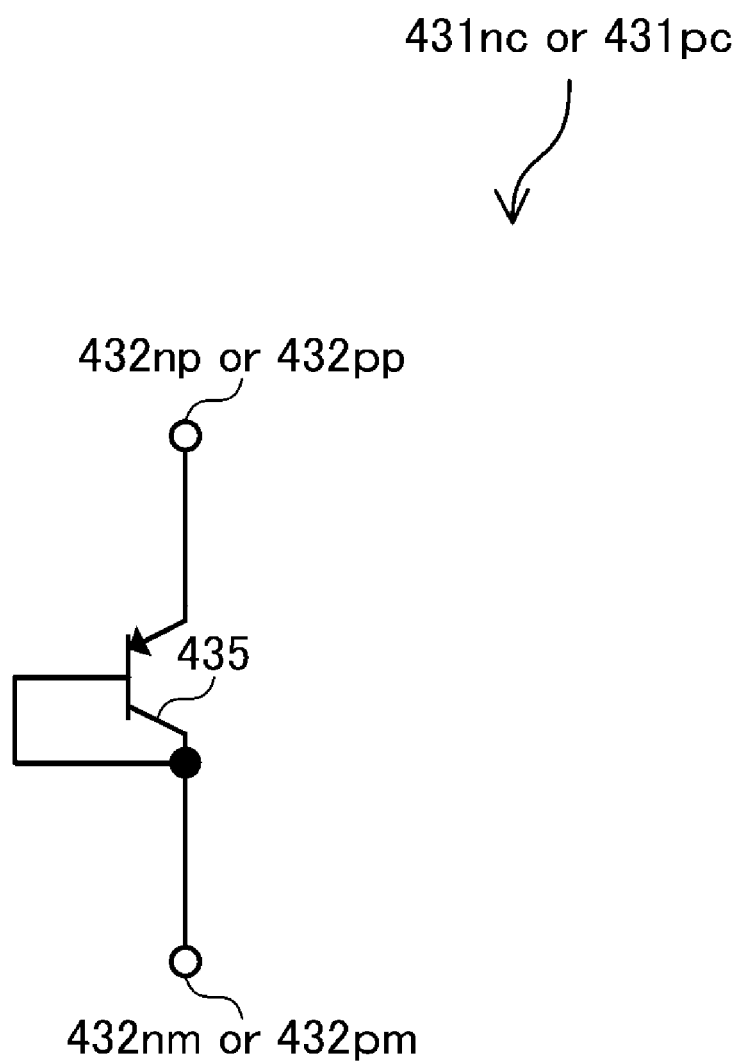
FIG. 9 is a circuit diagram of a third example of the first application circuit 431*n* and the second application circuit 431*p*.

FIG. 9 is a circuit diagram of the third example of the first application circuit 431n and the second application circuit 431p. As illustrated in FIG. 9, the third example of the first application circuit 431n and the second application circuit 431p (which may be hereinafter referred to as a first application circuit 431nc and a second application circuit 431pc, respectively) includes a pnp-type transistor 435.

The transistor 435 is diode connected. The emitter and the collector of the transistor 435 included in the first application circuit 431nc are electrically connected to the positive terminal 432np and the negative terminal 432nm, respectively. The emitter and the collector of the transistor 435 included in the second application circuit 431pc are electrically connected to the positive terminal 432pp and the negative terminal 432pm, respectively.

When a current flows from the emitter to the collector of the transistor 435, which is diode connected, the transistor 435 operates as a diode, and thus the first drop voltage is the difference between the potential of the emitter of the transistor 435 and the potential of the base of the transistor 435, that is, the base-emitter voltage Vbe. That is, the potential of the negative terminal 432nm relative to the ground, or the first voltage V1, is a voltage having a value obtained by subtracting the base-emitter voltage Vbe from the battery voltage Vbat.

Since the second drop voltage in the second application circuit 431pc is also the base-emitter voltage Vbe, the potential of the positive terminal 432pp relative to the ground, or the second voltage V2, is a voltage having a value obtained by adding the base-emitter voltage Vbe to zero volts at the ground.

Operations and Advantages

As illustrated in FIG. 6, the base of the first bias transistor 421n is connected to the terminal Tn through the capacitor 426n. Accordingly, when the first bias transistor 421n is in the on state, the impedance in the frequency band of the RF signal in the path from the Bout terminal 425 to the terminal Tn is low. That is, in terms of the RF signal, the Bout terminal 425 can be regarded as being grounded through the first bias transistor 421n and the capacitor 426n.

Likewise, the base of the second bias transistor 421p is connected to the terminal Tp through the capacitor 426p. Accordingly, when the second bias transistor 421p is in the on state, the impedance in the frequency band of the RF signal in the path from the Bout terminal 425 to the terminal Tp is low. That is, in terms of the RF signal, the Bout terminal 425 can be regarded as being grounded through the second bias transistor 421p and the capacitor 426p.

Figure 10:
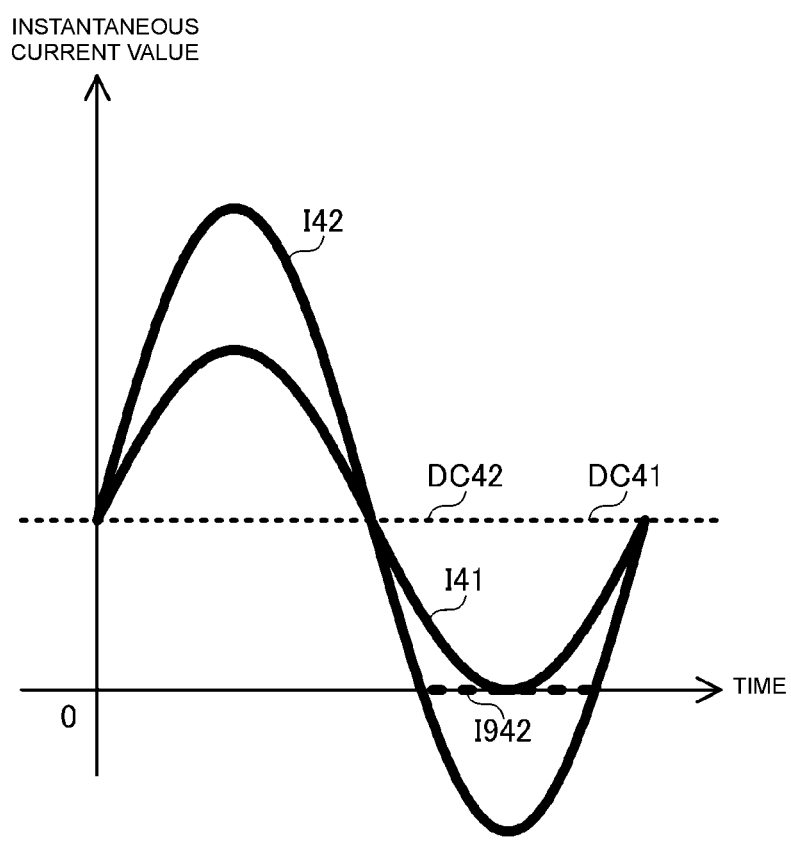
FIG. 10 is a diagram illustrating an example change of a base bias current Ieef in the power amplifier circuit 61 with time.

FIG. 10 is a diagram illustrating an example change of the base bias current Ieef in the power amplifier circuit 61 with time. In FIG. 10, the vertical axis represents the instantaneous value of the base bias current Ieef, and the horizontal axis represents time. As illustrated in FIG. 6 and FIG. 10, in response to the first bias voltage VB1 and the second bias voltage VB2 being supplied to the base of the first bias transistor 421n and the base of the second bias transistor 421p, respectively, the first bias transistor 421n, the second bias transistor 421p, and the amplifier transistor 501 are turned on.

In this case, the base bias current Ieef flowing from the Bout terminal 425 toward the resistance element 502 is, for example, a current in which an AC RF current is superimposed on a DC current. Specifically, for example, when the RF current changes with time along a sine curve having a small amplitude, the base bias current Ieef is a base bias current 141 (see FIG. 10) having a waveform where the sine curve is shifted in the positive direction.

A current having an instantaneous value greater than or equal to zero, such as the base bias current 141, is not susceptible to the rectification effect between the base and the emitter of the first bias transistor 421n. Thus, the base bias circuit 401 is not brought into the cut-off state.

In the base bias circuit 401, since the direction from the emitter to the base of the second bias transistor 421p corresponds to the forward direction, the base bias current Ieef having an instantaneous current value less than zero can be caused to flow from the Bout terminal 425 to the terminal Tp. Accordingly, for example, when the RF current changes with time along a sine curve having a large amplitude, the base bias current Ieef is a base bias current 142 having an instantaneous current value less than zero.

Figure 56:
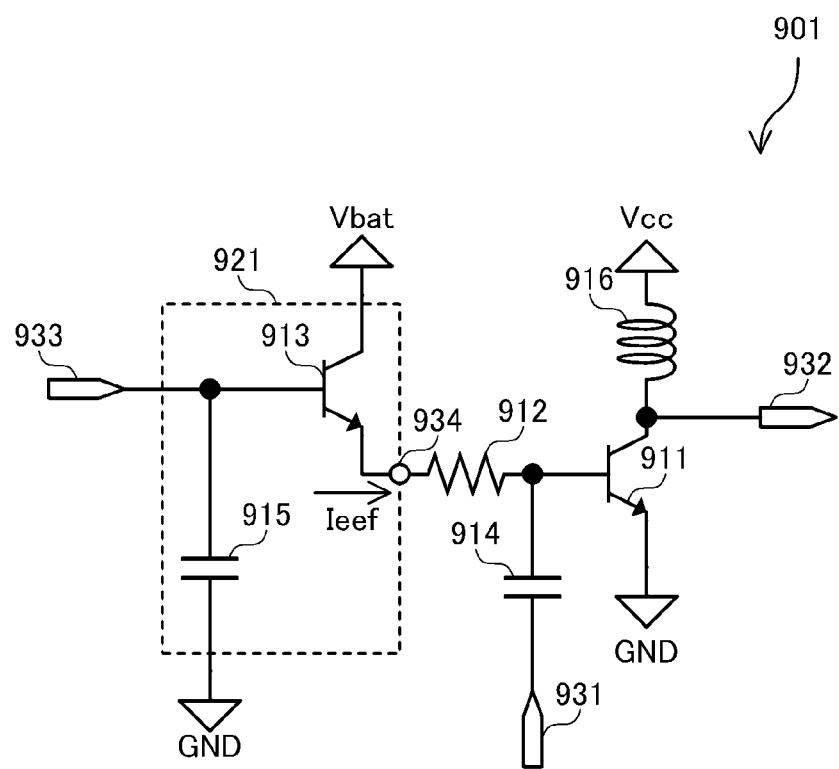
FIG. 56 is a diagram illustrating a radio-frequency amplifier circuit 901 in a reference example.
Figure 57:
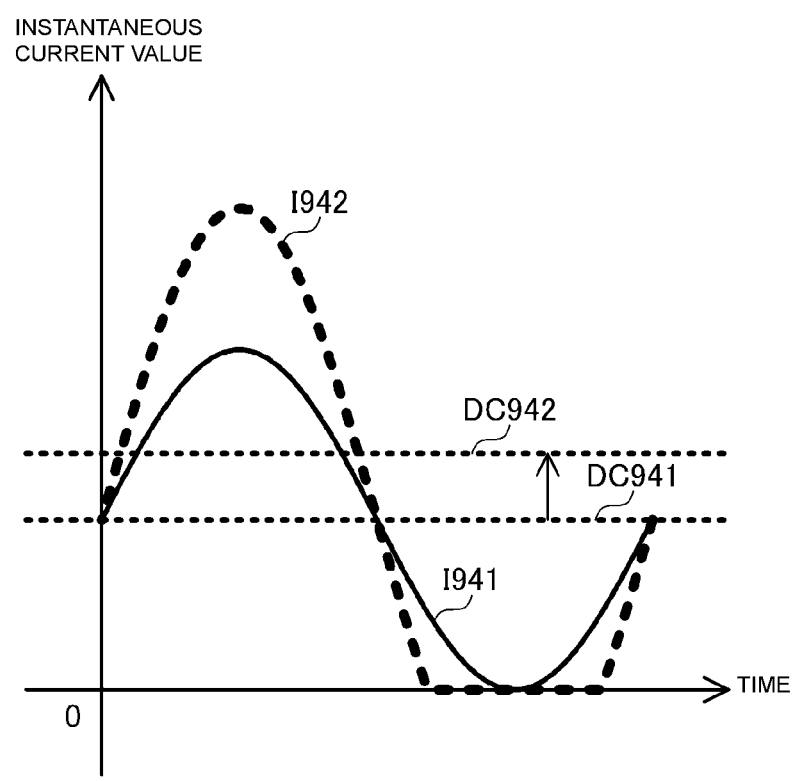
FIG. 57 is a diagram for describing a cut-off state.

That is, in the conventional radio-frequency amplifier circuit 901 (see FIG. 56), as in the base bias current I942, a current has zero amperes in a case where a negative current is to flow. Accordingly, the radio-frequency amplifier circuit 901 is brought into the cut-off state. In contrast, the base bias circuit 401 is not brought into the cut-off state.

In the power amplifier circuit 61, since a negative current flows in a case where a negative current is to flow, a DC current DC42 obtained by time averaging the base bias current 142 is substantially the same as a DC current DC41 obtained by time averaging the base bias current 141.

That is, even if the amplitude of the RF current increases, a change in the time average of the base bias current Ieef can be suppressed. Thus, a change in the operating point of the amplifier transistor 501 can be suppressed. Accordingly, a change in the amplification factor of the amplifier transistor 501 can be suppressed regardless of the magnitude of the amplitude of the RF current. Thus, a satisfactory linearity of a relationship between the input and output of the power amplifier circuit 61 can be realized.

Layout

Figure 11:
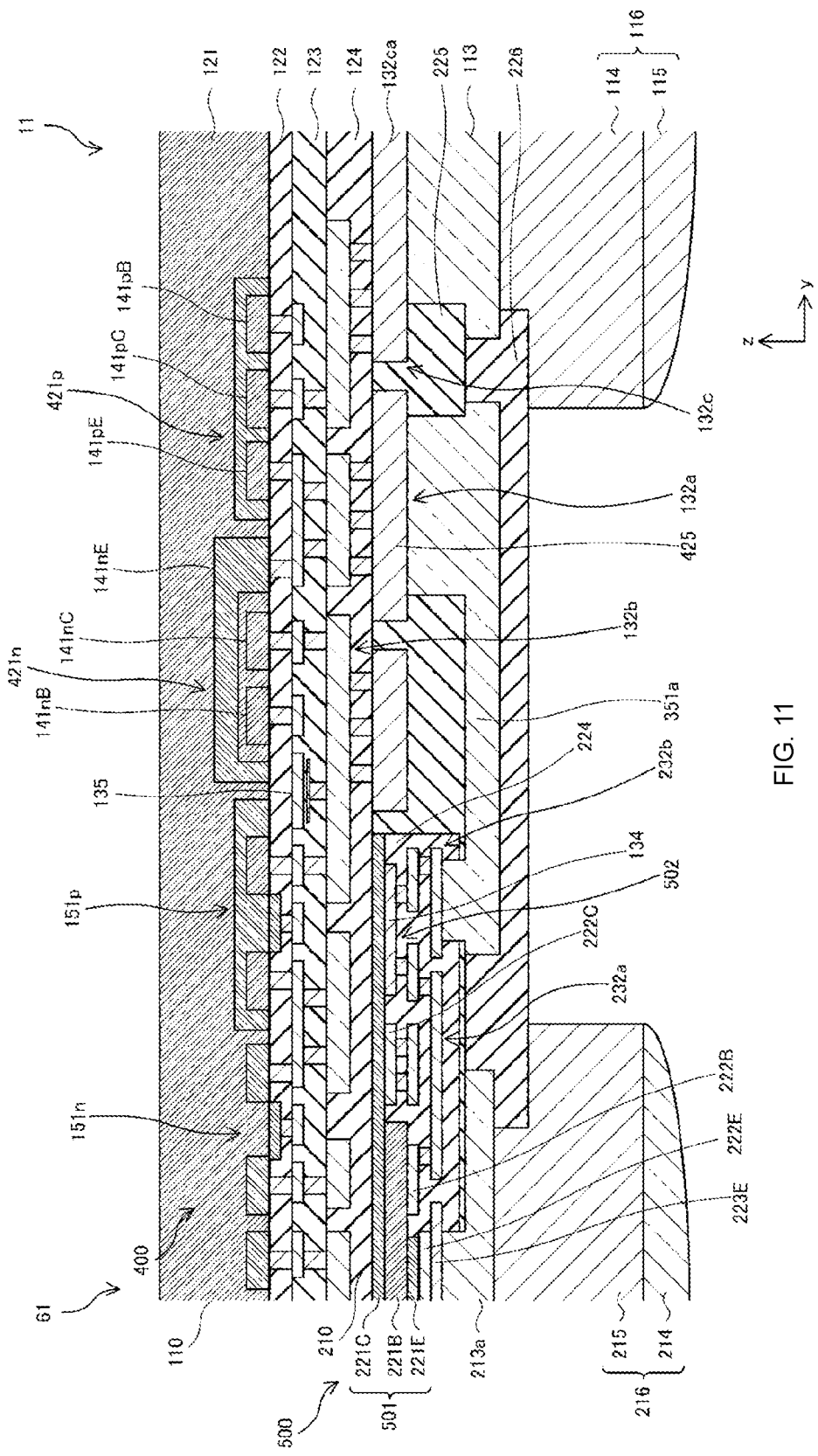
FIG. 11 is a view illustrating an example cross section of a power amplifier device 11.

FIG. 11 is a view illustrating an example cross section of the power amplifier device 11. As illustrated in FIG. 11, the first member 110 includes a substrate 121 made of Si, a first insulating film 122, a second insulating film 123, and a third insulating film 124, which are stacked on top of one another in sequence in the negative direction of the z axis.

The second member 210 has the amplifier transistor 501. The amplifier transistor 501 has an interlayer insulating film 224 on the side thereof in the negative direction of the z axis. Specifically, the amplifier transistor 501 includes a collector layer 221C, a base layer 221B, and an emitter layer 221E, which are stacked on top of one another in sequence from the substrate 121.

More specifically, the collector layer 221C is joined to the surface of the first member 110 in the negative direction of the z axis. The collector layer 221C has, on the side thereof in the negative direction of the z axis, the base layer 221B, a collector electrode 222C connected to the collector layer 221C, and a thin film resistor (TFR) 134 serving as the resistance element 502. The base layer 221B has, on the side thereof in the negative direction of the z axis, the emitter layer 221E and a base electrode 222B connected to the base layer 221B. The emitter layer 221E has, on the side thereof in the negative direction of the z axis, an emitter electrode 222E connected to the emitter layer 221E. The emitter electrode 222E has emitter wiring 223E on the side thereof in the negative direction of the z axis. For example, when the amplifier transistor 501 includes a plurality of transistor elements arranged in the y-axis direction, the emitter wiring 223E electrically connects the emitter electrodes 222E of the plurality of transistor elements to each other.

The collector layer 221C, the base layer 221B, and the emitter layer 221E are made of, for example, n-type GaAs, p-type GaAs, and n-type InGaP, respectively. These semiconductor layers may be made of other compound semiconductors such as InP, GaN, SiGe, and SiC.

The third insulating film 124 has a first insulating film 225 on the surface thereof in the negative direction of the z axis such that the first insulating film 225 covers the interlayer insulating film 224. The interlayer insulating film 224 and the first insulating film 225 have openings communicating with the emitter wiring 223E from the side thereof in the negative direction of the z axis. The emitter wiring 223E is electrically connected to an emitter pad 213a through the openings. The emitter pad 213a projects from the first insulating film 225 in the negative direction of the z axis. The emitter pad 213a is an example of the second-member-side electrode 213 and is also an example of rewiring.

The first insulating film 225 has a second insulating film 226 on the surface thereof in the negative direction of the z axis. The second insulating film 226 has an opening communicating with the emitter pad 213a on the side thereof in the negative direction of the z axis. The emitter pad 213a is connected to the second conductor protrusion 216 through the opening. The second conductor protrusion 216 projects from the second insulating film 226 in the negative direction of the z axis.

Heat generated by the amplification operation of the amplifier transistor 501 is radiated to the module substrate 310 (not illustrated) through the emitter pad 213a and the second conductor protrusion 216 and is also radiated to the first member 110.

The base electrode 222B is electrically connected to the end portion of the TFR 134 in the negative direction of the y axis, that is, the second end of the resistance element 502, by a second-member inner conductor 232a formed in the interlayer insulating film 224. The second-member inner conductor 232a is constituted by, for example, an electrode and a via.

In the first member 110, the substrate 121 has the first bias transistor 421n and the second bias transistor 421p. Specifically, the first bias transistor 421n includes an emitter layer 141nE, a collector layer 141nC, and a base layer 141nB. The second bias transistor 421p includes an emitter layer 141pE, a collector layer 141pC, and a base layer 141pB.

The substrate 121 further has an NMOS 151n and a PMOS 151p. The NMOS 151n and the PMOS 151p are not included in the power amplifier circuit 61 illustrated in FIG. 6, but are used as a switch, for example. Alternatively, the NMOS 151n or the PMOS 151p may be used as the first bias transistor 421n or the second bias transistor 421p.

The emitter layer 141nE of the first bias transistor 421n and the emitter layer 141pE of the second bias transistor 421p are electrically connected to each other by a first-member inner conductor 132a. The first-member inner conductor 132a is constituted by, for example, electrodes and vias disposed on or in the first insulating film 122, the second insulating film 123, the third insulating film 124, and the first insulating film 225. The electrode on the side of the first-member inner conductor 132a in the negative direction of the z axis is, for example, the Bout terminal 425 on the surface of the third insulating film 124 in the negative direction of the z axis.

The member-to-member connection conductor 351a connects the Bout terminal 425 of the first-member inner conductor 132a to a second-member inner conductor 232b connected to the end portion of the TFR 134 in the positive direction of the y axis, that is, the first end of the resistance element 502. The member-to-member connection conductor 351a is formed on the first insulating film 225 and the second insulating film 226.

The collector layer 141nC of the first bias transistor 421n is connected to a metal-insulator-metal (MIM) 135 functioning as a capacitor through a first-member inner conductor 132b.

The collector layer 141pC of the second bias transistor 421p is connected to, for example, a first-member inner conductor 132c disposed on the surface of the third insulating film 124 in the negative direction of the z axis and having an electrode 132ca.

The first conductor protrusion 116 is disposed on the side of the second conductor protrusion 216 in the positive direction of the y axis, for example. The first conductor protrusion 116 is connected to the electrode 132ca of the first-member inner conductor 132c through the first-member-side electrode 113. The first-member-side electrode 113 is an example of rewiring.

Specifically, the first-member-side electrode 113 is connected to the electrode 132ca through an opening in the first insulating film 225. The first conductor protrusion 116 is connected to the first-member-side electrode 113 through an opening in the second insulating film 226.

Second Embodiment

A power amplifier device and a power amplifier circuit according to a second embodiment will be described. In the second and subsequent embodiments, the description of matters common to those of the first embodiment will be omitted, and only the differences will be described. In particular, similar operations and advantages achieved with similar configurations will not be described again in the individual embodiments.

Figure 12:
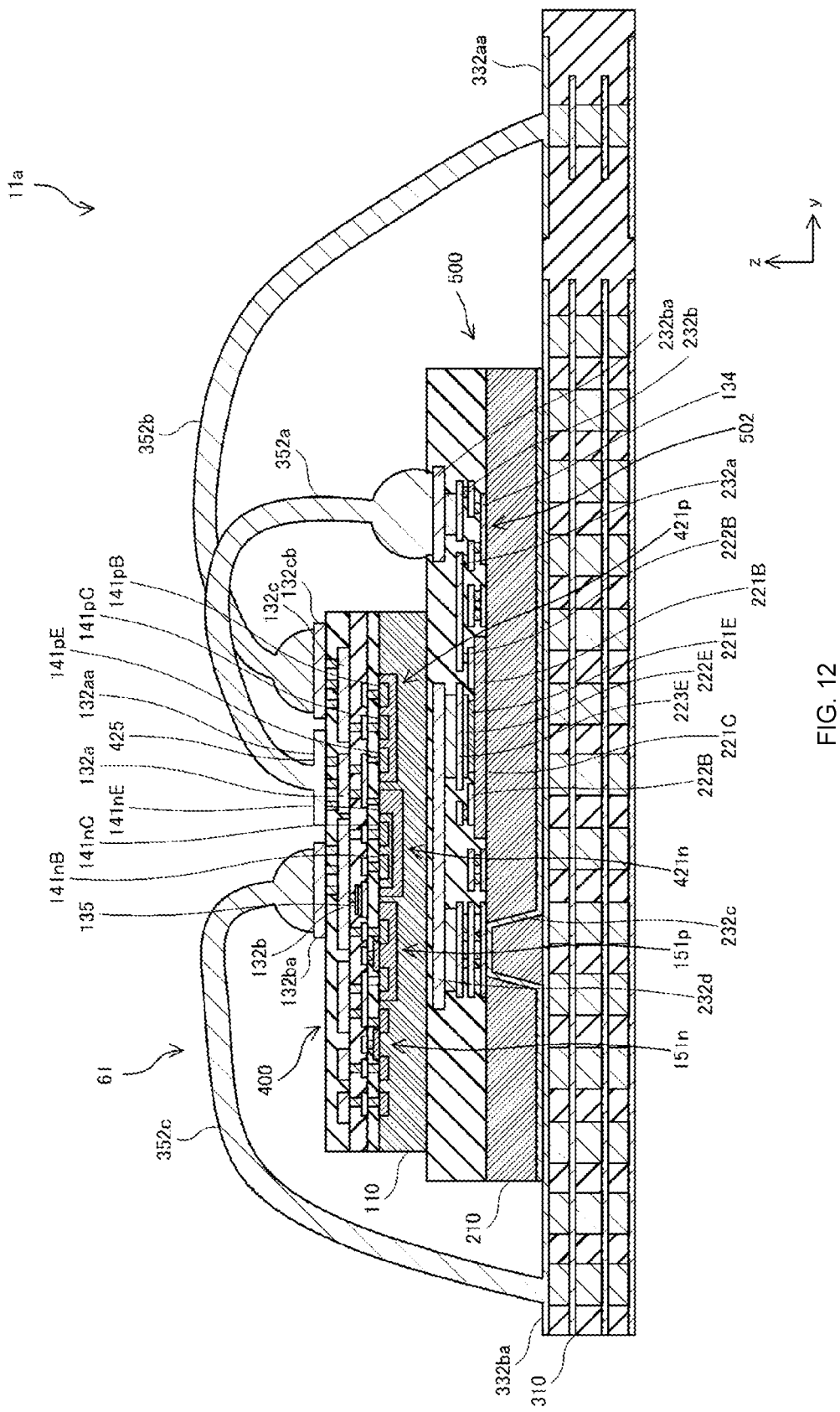
FIG. 12 is a view illustrating an example cross section of a power amplifier device 11*a*.

FIG. 12 is a view illustrating an example cross section of a power amplifier device 11a. As illustrated in FIG. 12, in the power amplifier device 11a according to the second embodiment, unlike the power amplifier device 11 according to the first embodiment, the first circuit 400 is electrically connected to the second circuit 500 and the module substrate 310 via wire bonding, and the second circuit 500 is electrically connected to the module substrate 310 via a via.

Specifically, a bonding wire 352a electrically connects the emitter of the first bias transistor 421n and the emitter of the second bias transistor 421p in the first circuit 400 to the first end of the resistance element 502 in the second circuit 500. The bonding wire 352a is an example of a member-to-member connection conductor.

More specifically, the bonding wire 352a electrically connects a second member pad 232ba disposed on or in the second member 210 to a first member pad 132aa disposed on or in the first member 110. The second member pad 232ba is connected to the end portion of the TFR 134 in the positive direction of the y axis, that is, the first end of the resistance element 502, through the second-member inner conductor 232b. The first member pad 132aa is connected to the emitter layer 141nE of the first bias transistor 421n and the emitter layer 141pE of the second bias transistor 421p through the first-member inner conductor 132a.

Bonding wires 352b and 352c electrically connect the first circuit 400 and the module substrate 310 to each other. Specifically, the bonding wire 352b electrically connects a first member pad 132cb disposed on or in the first member 110 to a substrate terminal 332aa disposed on or in the module substrate 310. The first member pad 132cb is connected to the collector layer 141pC of the second bias transistor 421p through the first-member inner conductor 132c.

The bonding wire 352c electrically connects a first member pad 132ba disposed on or in the first member 110 to a substrate terminal 332ba disposed on or in the module substrate 310. The first member pad 132ba is connected to the collector layer 141nC of the second bias transistor 421p, the MIM 135, and the like through the first-member inner conductor 132b.

The second member 210 has a through via 232c through which the second circuit 500 and the module substrate 310 are electrically connected to each other. Specifically, the side of the through via 232c in the positive direction of the z axis is connected to the emitter wiring 223E through a second-member inner conductor 232d. The side of the through via 232c in the negative direction of the z axis is connected to the module substrate 310.

In the power amplifier device 11a, the first circuit 400 in the first member 110 and the second circuit 500 in the second member 210 are electrically connected to each other via wire bonding. However, it is not limited to this configuration. The first circuit 400 and the second circuit 500 may be electrically connected to each other by any other connection conductor such as a bump.

While in the schematic diagram illustrated in FIG. 12, the thickness of the second member 210 is larger than the thickness of the first member 110, the thickness of the second member 210 is smaller than the thickness of the first member 110.

Third Embodiment

A power amplifier device and a power amplifier circuit according to a third embodiment will be described.

Figure 13:
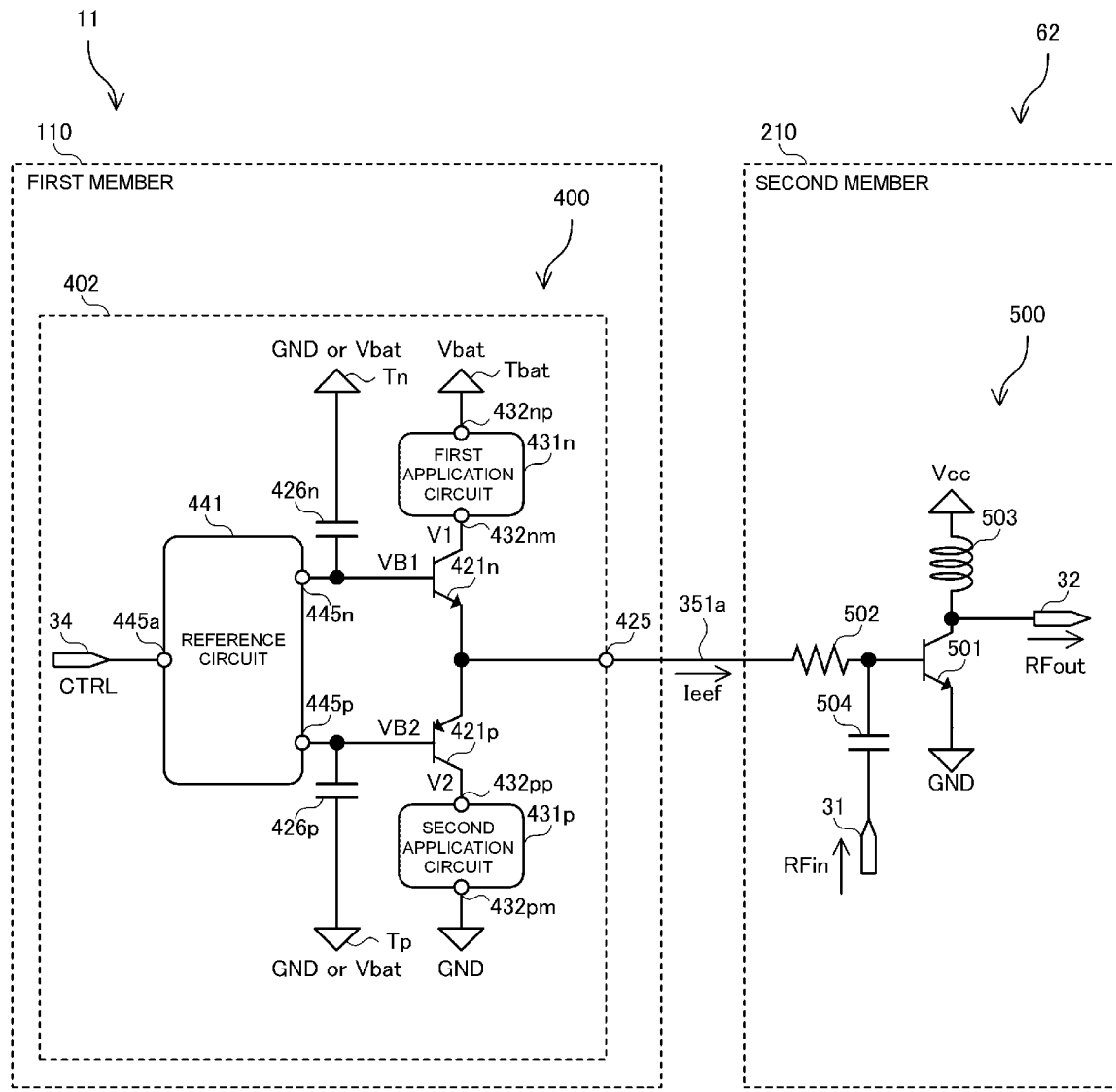
FIG. 13 is a circuit diagram of a power amplifier circuit 62.

FIG. 13 is a circuit diagram of a power amplifier circuit 62. As illustrated in FIG. 13, the power amplifier circuit 62 according to the third embodiment is different from the power amplifier circuit 61 according to the first embodiment in that the first bias voltage VB1 and the second bias voltage VB2 are adjusted in accordance with temperature.

As compared with the power amplifier circuit 61 illustrated in FIG. 6, the power amplifier circuit 62 includes a base bias circuit 402 in place of the base bias circuit 401. As compared with the base bias circuit 401 illustrated in FIG. 6, the base bias circuit 402 further includes a reference circuit 441.

The reference circuit 441 has a control terminal 445a connected to a control signal input terminal 34, a bias supply terminal 445n connected to the base of the first bias transistor 421n, and a bias supply terminal 445p connected to the base of the second bias transistor 421p.

A first example of the reference circuit 441 according to the third embodiment will be described.

Figure 14:
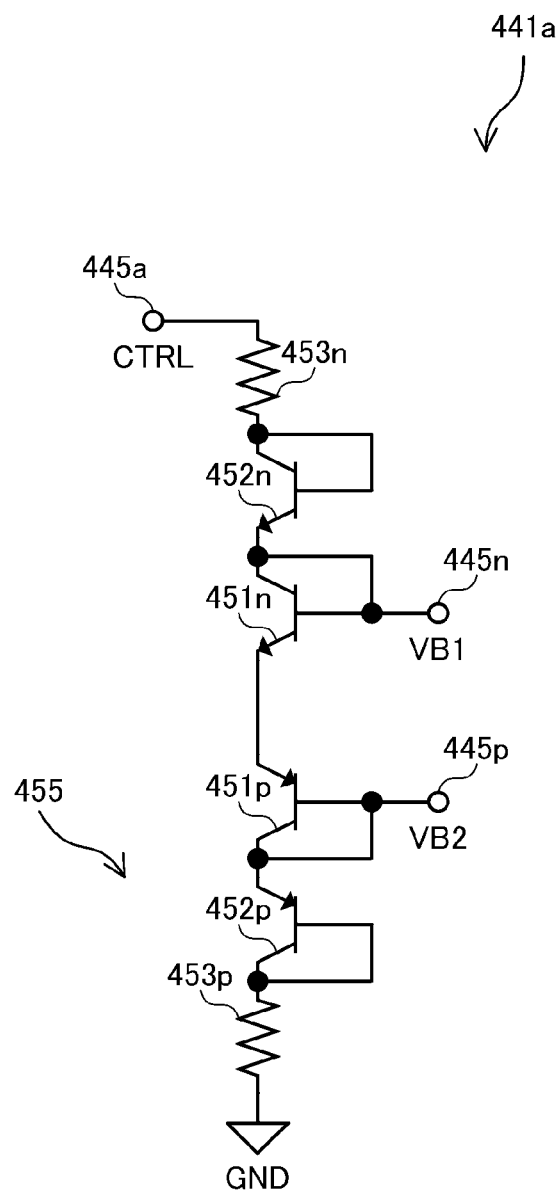
FIG. 14 is a circuit diagram of a first example of a reference circuit 441.

FIG. 14 is a circuit diagram of the first example of the reference circuit 441. As illustrated in FIG. 14, the first example of the reference circuit 441 (which may be hereinafter referred to as a reference circuit 441a) includes npn-type transistors 451n (first diode) and 452n, pnp-type transistors 451p (second diode) and 452p, and resistance elements 453n and 453p. The transistor 452p and the resistance element 453p constitute a third application circuit 455.

The resistance element 453n has a first end connected to the control terminal 445a, and a second end. The resistance element 453p has a first end and a second end that is grounded.

The transistors 451n, 451p, 452n, and 452p are each diode connected. That is, each of the transistors 451n, 451p, 452n, and 452p functions as a diode. In the transistors 451n and 452n, the collector and the base correspond to the anode, and the emitter corresponds to the cathode. In the transistors 451p and 452p, the emitter corresponds to the anode, and the collector and the base correspond to the cathode.

The transistors 451n and 451p have substantially the same characteristics as the first bias transistor 421n and the second bias transistor 421p, respectively. The characteristics include, for example, the temperature change of the turn-on voltage.

The transistor 452n has a collector and a base connected to the second end of the resistance element 453n, and an emitter. The transistor 451n has a collector and a base connected to the emitter of the transistor 452n and the bias supply terminal 445n, and an emitter.

The transistor 451p has an emitter connected to the emitter of the transistor 451n, and a collector and a base connected to the bias supply terminal 445p. The transistor 452p has an emitter connected to the collector and base of the transistor 451p, and a collector and a base connected to the first end of the resistance element 453p.

The control terminal 445a is supplied with a control signal CTRL to control a current flowing from the emitter of the transistor 451n to the emitter of the transistor 451p. The third application circuit 455 is disposed between the ground and the collector and base of the transistor 451p and is configured to apply the second bias voltage VB2, which is higher than the ground, to the collector and base of the transistor 451p.

Specifically, in the reference circuit 441a, a current is supplied to the control terminal 445a as the control signal CTRL. Accordingly, the potential of the base of the transistor 451p relative to the ground, that is, the second bias voltage VB2, is the sum of the voltage between the first end and the second end of the resistance element 453p and the base-emitter voltage Vbe of the transistor 452p. The potential of the base of the transistor 451n relative to the ground, that is, the first bias voltage VB1, is a value obtained by adding the base-emitter voltage Vbe of the transistor 451p and the base-emitter voltage Vbe of the transistor 451n to the second bias voltage VB2.

The voltage between the first end and the second end of the resistance element 453p and the base-emitter voltages Vbe of the transistors 452p, 451p, and 451n can be adjusted in accordance with the magnitude of the current of the control signal CTRL. That is, the first bias voltage VB1 and the second bias voltage VB2 can be adjusted in accordance with the magnitude of the current of the control signal CTRL.

A voltage may be applied to the control terminal 445a as the control signal CTRL. Even in this configuration, the first bias voltage VB1 and the second bias voltage VB2 can be adjusted by using the voltage applied to the control terminal 445a.

Typically, as the temperature of a transistor increases, the turn-on voltage of the transistor becomes low. For example, it is assumed that the base bias circuit 401 supplies a constant bias to the amplifier transistor 501 regardless of the temperature. In this situation, in response to an increase in the temperature of the power amplifier device 11, the turn-on voltage of the amplifier transistor 501 becomes low, and the amount of current flowing between the collector and the emitter of the amplifier transistor 501 increases. The increase in the amount of current increases the temperature of the amplifier transistor 501, and the turn-on voltage of the amplifier transistor 501 further becomes low. As a result, the amount of current flowing between the collector and the emitter of the amplifier transistor 501 further increases. That is, thermal runaway may occur in the amplifier transistor 501.

In contrast, in the reference circuit 441a, in response to an increase in the temperature of the transistors included in the reference circuit 441a due to an increase in the temperature of the power amplifier device 11, the turn-on voltages of the transistors 452p, 451p, and 451n become low. As a result, the base-emitter voltages Vbe become low. That is, in response to an increase in the temperature of the power amplifier device 11, the first bias voltage VB1 and the second bias voltage VB2 can be made low. Accordingly, the bias voltage to be supplied from the first bias transistor 421n and the second bias transistor 421p to the amplifier transistor 501 can be made low, and thus the increase in the current flowing between the collector and the emitter of the amplifier transistor 501 can be suppressed. That is, the thermal runaway of the amplifier transistor 501 can be suppressed.

A second example of the reference circuit 441 according to the third embodiment will be described.

Figure 15:
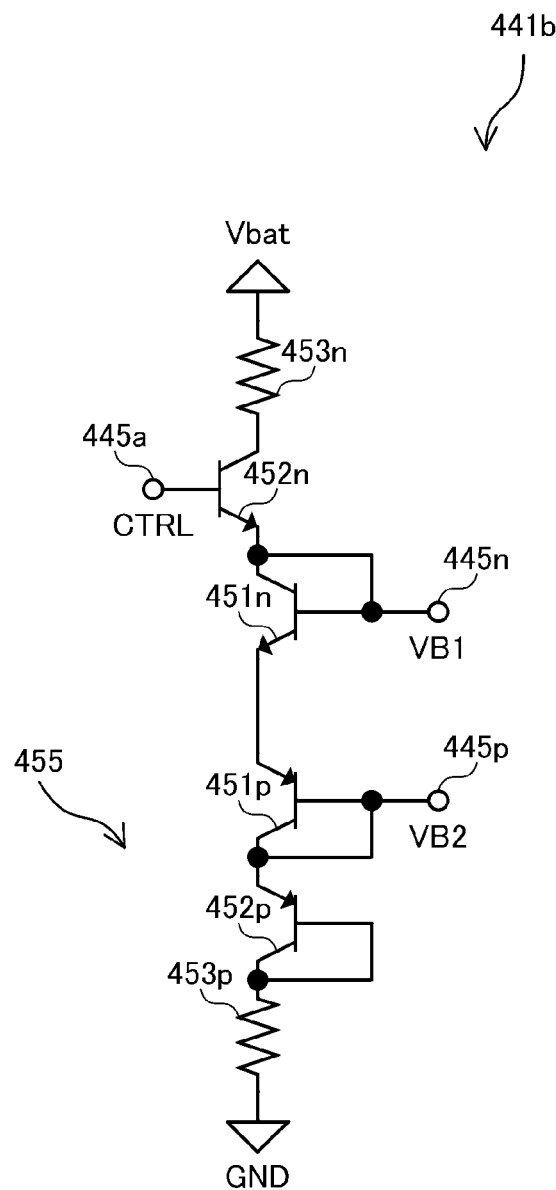
FIG. 15 is a circuit diagram of a second example of the reference circuit 441.

FIG. 15 is a circuit diagram of the second example of the reference circuit 441. As illustrated in FIG. 15, the second example of the reference circuit 441 (which may be hereinafter referred to as a reference circuit 441b) is different from the reference circuit 441a illustrated in FIG. 14 in the connection destination of the control terminal 445a.

The difference from the reference circuit 441a will be described hereinafter. The first end of the resistance element 453n is connected to a terminal to which the battery voltage Vbat is to be supplied. The transistor 452n is not diode connected, and has a collector connected to the second end of the resistance element 453n, a base connected to the control terminal 445a, and an emitter connected to the collector and base of the transistor 451n.

In the reference circuit 441b, a current or voltage is adjusted as the control signal CTRL to adjust a current flowing through the resistance element 453n, the transistors 452n, 451n, 451p, and 452p, and the resistance element 453p. That is, the first bias voltage VB1 and the second bias voltage VB2 can be adjusted by using the current or voltage of the control signal CTRL.

A third example of the reference circuit 441 according to the third embodiment will be described.

Figure 16:
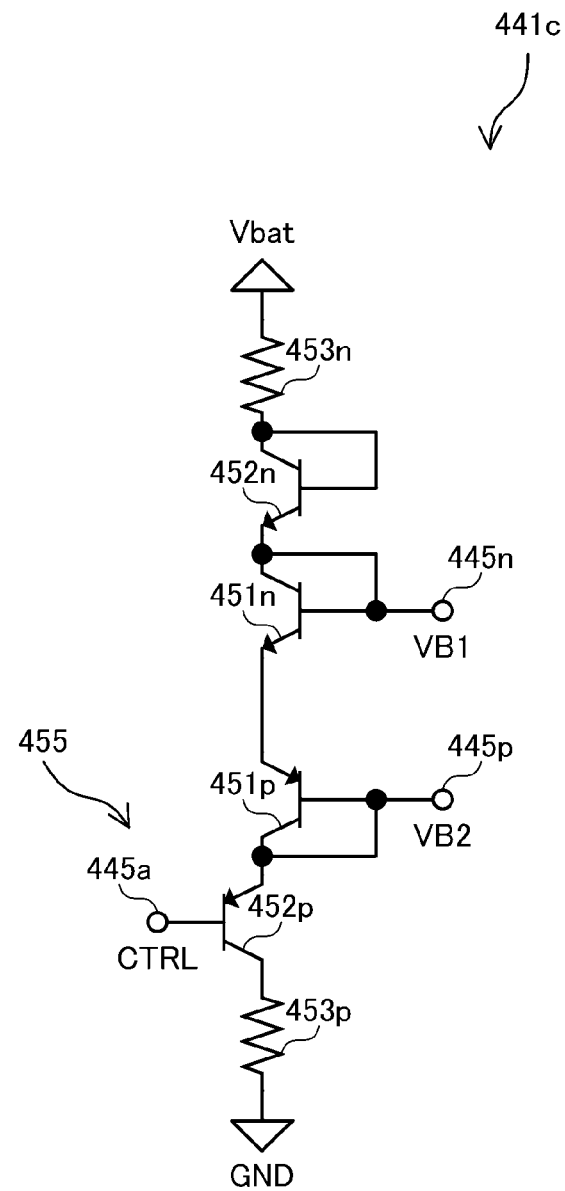
FIG. 16 is a circuit diagram of a third example of the reference circuit 441.

FIG. 16 is a circuit diagram of the third example of the reference circuit 441. As illustrated in FIG. 16, the third example of the reference circuit 441 (which may be hereinafter referred to as a reference circuit 441c) is different from the reference circuit 441a illustrated in FIG. 14 in the connection destination of the control terminal 445a.

The difference from the reference circuit 441a will be described hereinafter. The first end of the resistance element 453n is connected to a terminal to which the battery voltage Vbat is to be supplied. The transistor 452p is not diode connected, and has an emitter connected to the collector and base of the transistor 451p, a base connected to the control terminal 445a, and a collector connected to the first end of the resistance element 453p.

In the reference circuit 441c, a current or voltage is adjusted as the control signal CTRL to adjust a current flowing through the resistance element 453n, the transistors 452n, 451n, 451p, and 452p, and the resistance element 453p. That is, the first bias voltage VB1 and the second bias voltage VB2 can be adjusted by using the current or voltage of the control signal CTRL.

A fourth example of the reference circuit 441 according to the third embodiment will be described.

Figure 17:
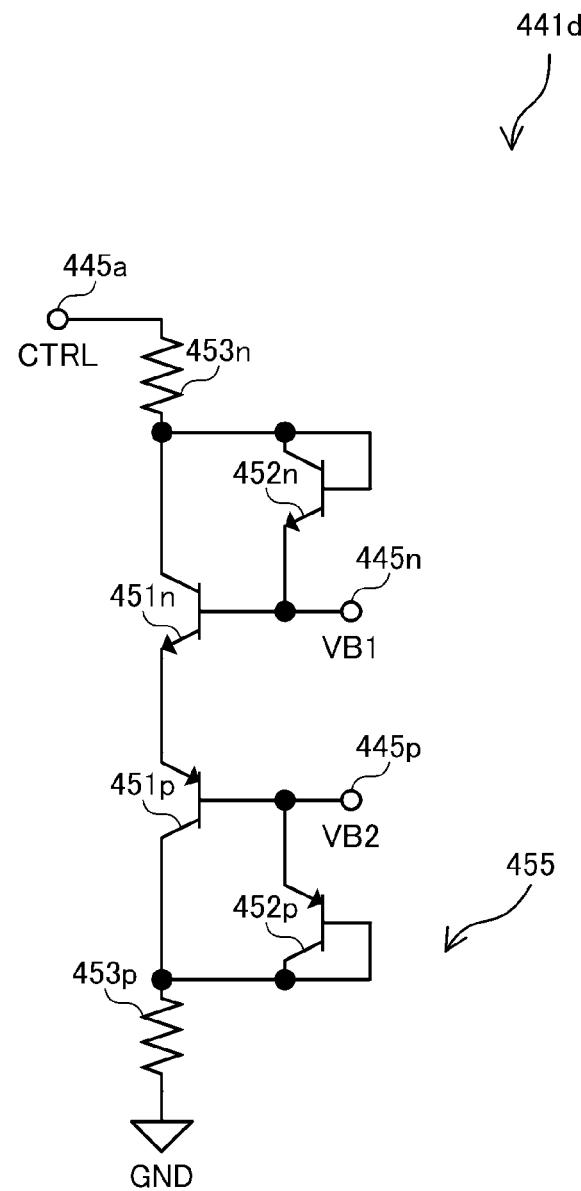
FIG. 17 is a circuit diagram of a fourth example of the reference circuit 441.

FIG. 17 is a circuit diagram of the fourth example of the reference circuit 441. As illustrated in FIG. 17, in the fourth example of the reference circuit 441 (which may be hereinafter referred to as a reference circuit 441d), as compared with the reference circuit 441a illustrated in FIG. 14, the transistors 451n and 452n are Darlington connected to each other, and the transistors 451p and 452p are Darlington connected to each other.

The difference from the reference circuit 441a will be described hereinafter. The transistors 451n and 451p are not diode connected. The transistor 452n has a collector and a base connected to the second end of the resistance element 453n, and an emitter connected to the bias supply terminal 445n. The transistor 451n has a collector connected to the second end of the resistance element 453n, a base connected to the bias supply terminal 445n, and an emitter.

The transistor 451p has an emitter connected to the emitter of the transistor 451n, a base connected to the bias supply terminal 445p, and a collector connected to the first end of the resistance element 453p. The transistor 452p has an emitter connected to the bias supply terminal 445p, and a collector and a base connected to the first end of the resistance element 453p.

The base and the emitter of the transistor 451n form a first diode. In this case, the base and the emitter of the transistor 451n correspond to the anode and the cathode of the first diode, respectively. The emitter and the base of the transistor 451p form a second diode. In this case, the emitter and the base of the transistor 451p correspond to the anode and the cathode of the second diode, respectively.

In the reference circuit 441d, a current is supplied to the control terminal 445a as the control signal CTRL. Accordingly, the potential of the base of the transistor 451p relative to the ground, that is, the second bias voltage VB2, is the sum of the voltage between the first end and the second end of the resistance element 453p and the base-emitter voltage Vbe of the transistor 452p. The potential of the base of the transistor 451n relative to the ground, that is, the first bias voltage VB1, is a voltage obtained by adding the base-emitter voltage Vbe of the transistor 451p and the base-emitter voltage Vbe of the transistor 451n to the second bias voltage VB2.

The voltage between the first end and the second end of the resistance element 453p and the base-emitter voltages Vbe of the transistors 452p, 451p, and 451n can be adjusted in accordance with the magnitude of the current of the control signal CTRL. That is, the first bias voltage VB1 and the second bias voltage VB2 can be adjusted in accordance with the magnitude of the current of the control signal CTRL.

A voltage may be applied to the control terminal 445a as the control signal CTRL. Even in this configuration, the first bias voltage VB1 and the second bias voltage VB2 can be adjusted by using the voltage applied to the control terminal 445a.

A fifth example of the reference circuit 441 according to the third embodiment will be described.

Figure 18:
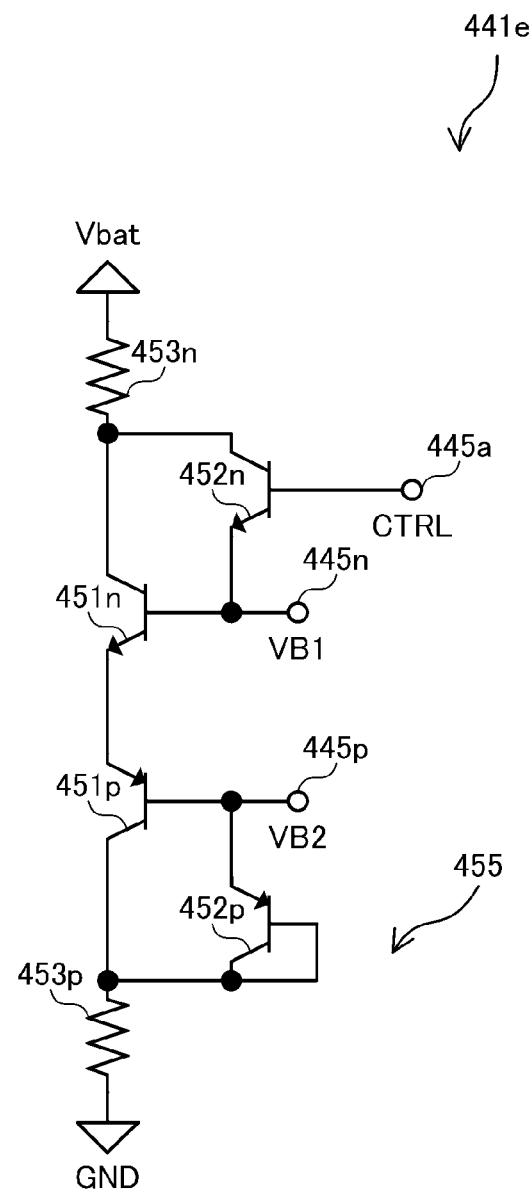
FIG. 18 is a circuit diagram of a fifth example of the reference circuit 441.

FIG. 18 is a circuit diagram of the fifth example of the reference circuit 441. As illustrated in FIG. 18, the fifth example of the reference circuit 441 (which may be hereinafter referred to as a reference circuit 441e) is different from the reference circuit 441d illustrated in FIG. 17 in the connection destination of the control terminal 445a.

The difference from the reference circuit 441d will be described hereinafter. The first end of the resistance element 453n is connected to a terminal to which the battery voltage Vbat is to be supplied. The transistor 452n is not diode connected, and has a collector connected to the second end of the resistance element 453n, a base connected to the control terminal 445a, and an emitter connected to the bias supply terminal 445n.

In the reference circuit 441e, a current or voltage is adjusted as the control signal CTRL to adjust a current flowing through the resistance element 453n, the transistors 452n, 451n, 451p, and 452p, and the resistance element 453p. That is, the first bias voltage VB1 and the second bias voltage VB2 can be adjusted by using the current or voltage of the control signal CTRL.

A sixth example of the reference circuit 441 according to the third embodiment will be described.

Figure 19:
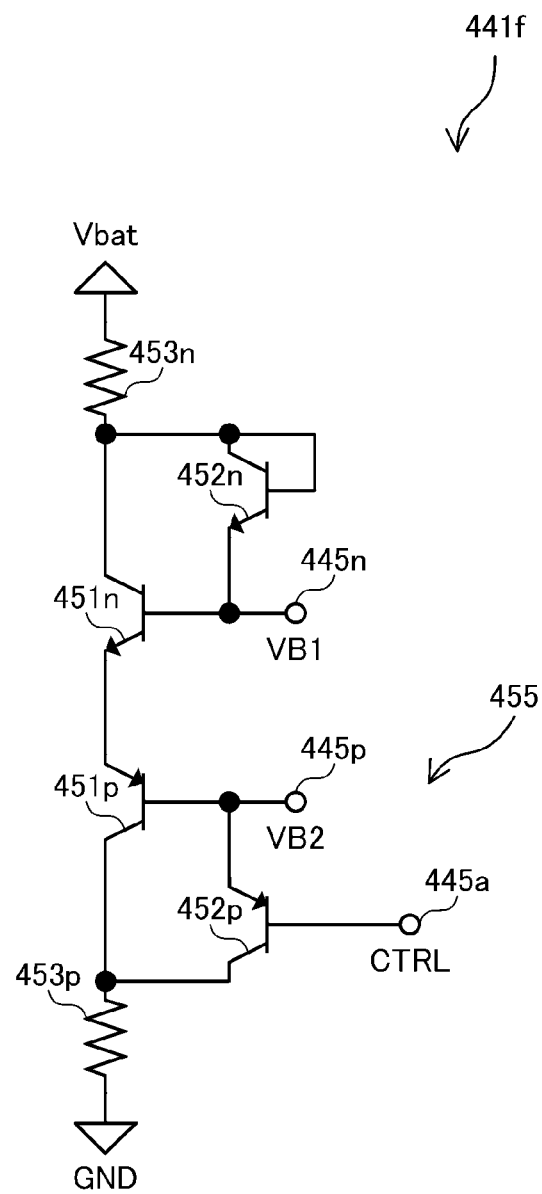
FIG. 19 is a circuit diagram of a sixth example of the reference circuit 441.

FIG. 19 is a circuit diagram of the sixth example of the reference circuit 441. As illustrated in FIG. 19, the sixth example of the reference circuit 441 (which may be hereinafter referred to as a reference circuit 441f) is different from the reference circuit 441d illustrated in FIG. 17 in the connection destination of the control terminal 445a.

The difference from the reference circuit 441d will be described hereinafter. The first end of the resistance element 453n is connected to a terminal to which the battery voltage Vbat is to be supplied. The transistor 452p is not diode connected, and has an emitter connected to the bias supply terminal 445p, a base connected to the control terminal 445a, and a collector connected to the first end of the resistance element 453p.

In the reference circuit 441f, a current or voltage is adjusted as the control signal CTRL to adjust a current flowing through the resistance element 453n, the transistors 452n, 451n, 451p, and 452p, and the resistance element 453p. That is, the first bias voltage VB1 and the second bias voltage VB2 can be adjusted by using the current or voltage of the control signal CTRL.

Fourth Embodiment

A power amplifier device and a power amplifier circuit according to a fourth embodiment will be described.

Figure 20:
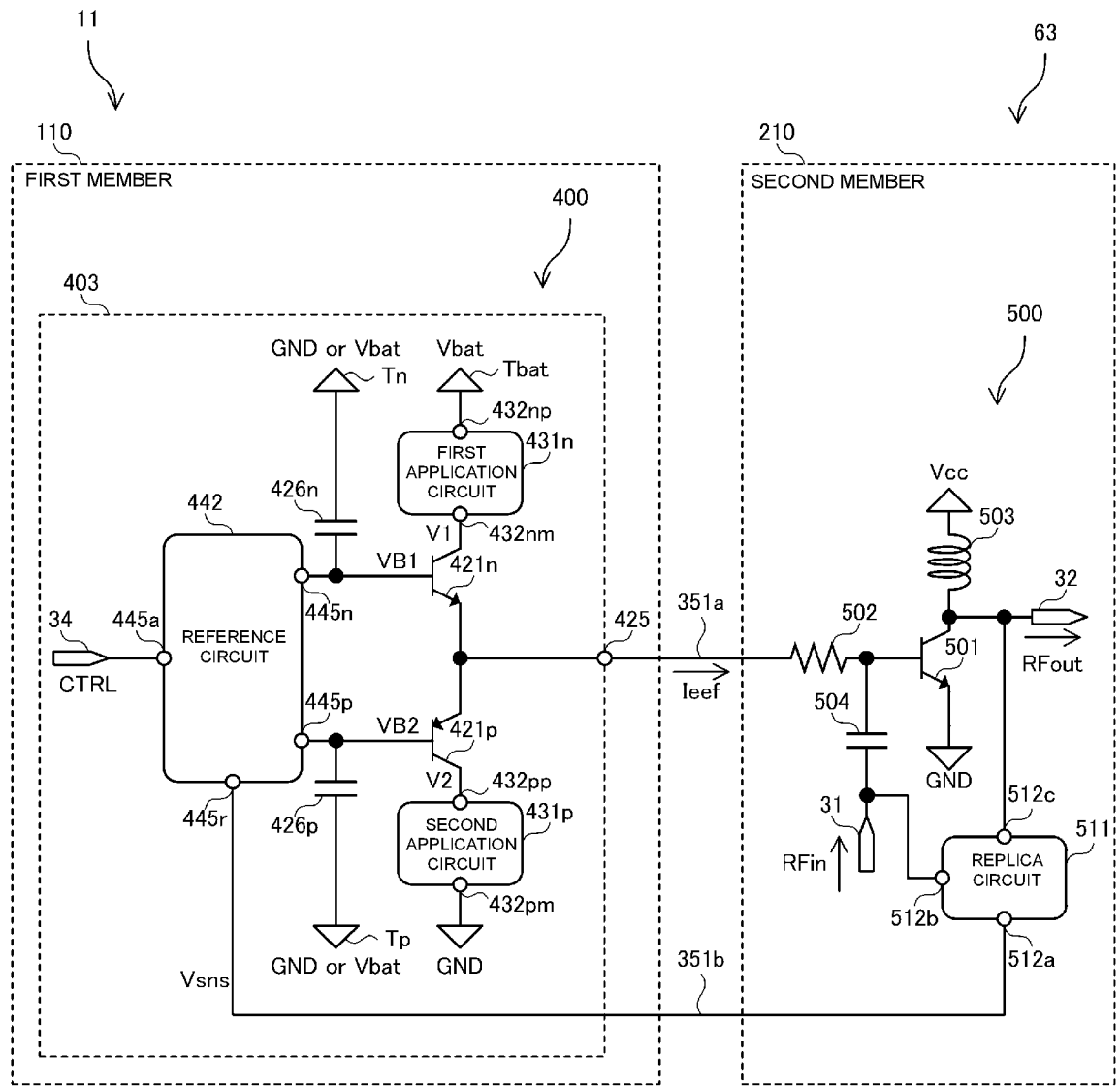
FIG. 20 is a circuit diagram of a power amplifier circuit 63.

FIG. 20 is a circuit diagram of a power amplifier circuit 63. As illustrated in FIG. 20, the power amplifier circuit 63 according to the fourth embodiment is different from the power amplifier circuit 62 according to the third embodiment in that the first bias voltage VB1 and the second bias voltage VB2 are adjusted further in accordance with the temperature of the amplifier transistor 501.

As compared with the power amplifier circuit 62 illustrated in FIG. 13, the power amplifier circuit 63 includes a base bias circuit 403 in place of the base bias circuit 402, and further includes a member-to-member connection conductor 351b and a replica circuit 511 (external circuit). As compared with the base bias circuit 402 illustrated in FIG. 13, the base bias circuit 403 includes a reference circuit 442 in place of the reference circuit 441.

The reference circuit 442 has a control terminal 445a connected to the control signal input terminal 34, a bias supply terminal 445n connected to the base of the first bias transistor 421n, a bias supply terminal 445p connected to the base of the second bias transistor 421p, and a branched terminal 445r.

The replica circuit 511 is included in the second circuit 500. The replica circuit 511 has an amplified signal terminal 512c connected to the output terminal 32, an RF signal terminal 512b connected to the input terminal 31, and a reference bias terminal 512a connected to the shunt terminal 445r of the reference circuit 442 through the member-to-member connection conductor 351b.

A first example of the reference circuit 442 according to the fourth embodiment will be described.

Figure 21:
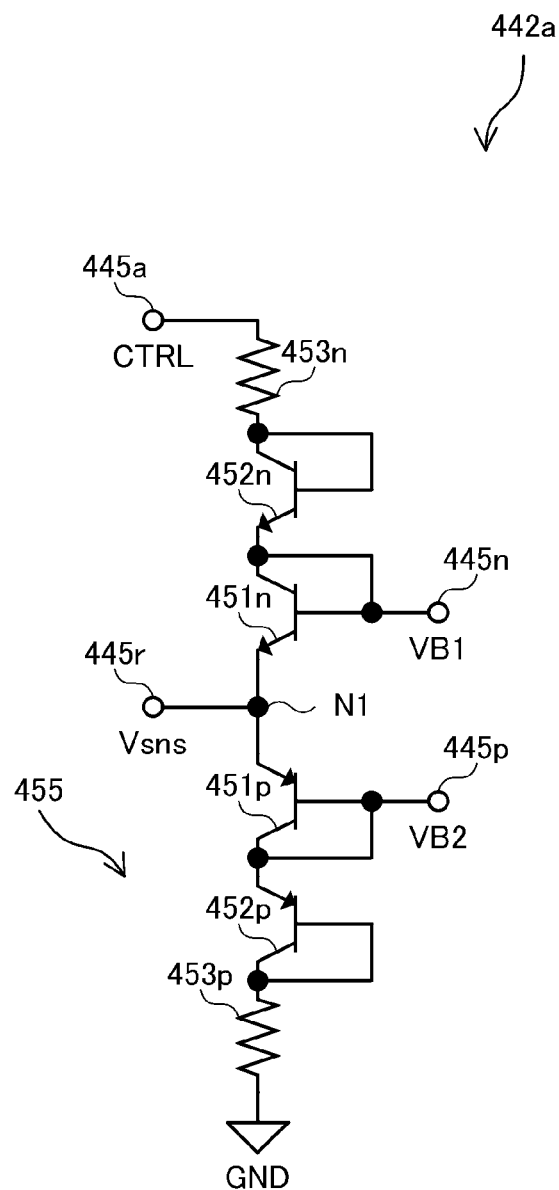
FIG. 21 is a circuit diagram of a first example of a reference circuit 442.

FIG. 21 is a circuit diagram of the first example of the reference circuit 442. As illustrated in FIG. 21, in the first example of the reference circuit 442 (which may be hereinafter referred to as a reference circuit 442a), as compared with the reference circuit 441a illustrated in FIG. 14, the shunt terminal 445r is further connected.

The difference from the reference circuit 441a will be described hereinafter. The reference circuit 442a includes an intermediate node N1 between the emitter of the transistor 451n and the emitter of the transistor 451p. For example, a current is supplied to the control terminal 445a as the control signal CTRL. The shunt terminal 445r is connected to the intermediate node N1.

In the reference circuit 442a, a current is adjusted as the control signal CTRL to adjust a current flowing from the resistance element 453n to the ground through the intermediate node N1. That is, the first bias voltage VB1 and the second bias voltage VB2 can be adjusted by using the current of the control signal CTRL.

The potential of the shunt terminal 445r relative to the ground (which may be hereinafter referred to as a reference voltage Vsns) is substantially the same as the potential of the Bout terminal 425 relative to the ground because the transistors 451n and 451p have substantially the same characteristics as the first bias transistor 421n and the second bias transistor 421p, respectively.

A first example of the replica circuit 511 according to the fourth embodiment will be described.

Figure 22:
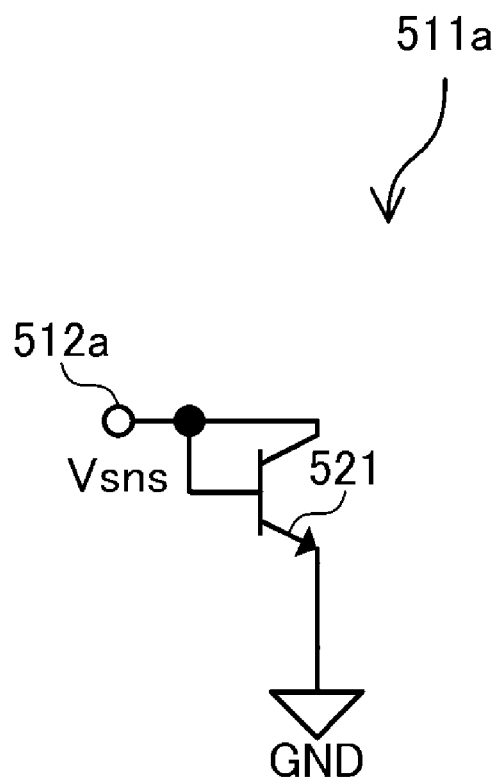
FIG. 22 is a circuit diagram of a first example of a replica circuit 511.

FIG. 22 is a circuit diagram of the first example of the replica circuit 511. As illustrated in FIG. 22, the first example of the replica circuit 511 (which may be hereinafter referred to as a replica circuit 511a) includes an npn-type seventh transistor 521.

The seventh transistor 521 is diode connected. That is, the seventh transistor 521 functions as a seventh diode. The collector and the base of the seventh transistor 521 correspond to the anode of the seventh diode, and the emitter of the seventh transistor 521 corresponds to the cathode of the seventh diode.

The seventh transistor 521 has substantially the same characteristics as the amplifier transistor 501. In this embodiment, the characteristics include, for example, the temperature change of the turn-on voltage. Further, the seventh transistor 521 is thermally coupled to the amplifier transistor 501. Specifically, the seventh transistor 521 and the amplifier transistor 501 are connected to each other by a good heat conduction member. Accordingly, the temperature of the seventh transistor 521 follows the temperature of the amplifier transistor 501. In other words, the seventh transistor 521 has substantially the same temperature as the amplifier transistor 501.

The seventh transistor 521 has a collector and a base connected to the reference bias terminal 512a, and an emitter that is grounded.

Since the reference voltage Vsns is applied to the base of the seventh transistor 521 from the reference circuit 442a, a current flows between the base and the emitter of the seventh transistor 521. For example, as the temperature of the amplifier transistor 501 increases, the temperature of the seventh transistor 521 thermally coupled to the amplifier transistor 501 also increases. In this case, a current flowing from the base to the emitter of the seventh transistor 521, that is, the base current, increases.

As illustrated in FIG. 21 and FIG. 22, as the amount of the base current of the seventh transistor 521 increases, a current shunted from the intermediate node N1 to the shunt terminal 445r (which may be hereinafter referred to as a shunt current) increases in the reference circuit 442a. As a result, the amount of current flowing from the intermediate node N1 to the ground through the transistor 451p, the transistor 452p, and the resistance element 453p decreases.

If the amount of current decreases, the base-emitter voltage Vbe of the transistor 452p and the voltage between the first end and the second end of the resistance element 453p become low. As a result, the second bias voltage VB2 becomes low. Further, in addition to the second bias voltage VB2 becoming low, the base-emitter voltage Vbe of the transistor 451p becomes low. As a result, the first bias voltage VB1 also becomes low.

As illustrated in FIG. 20, as the first bias voltage VB1 and the second bias voltage VB2 become low, the bias voltage to be supplied from the base bias circuit 403 to the amplifier transistor 501 becomes low. As a result, the amount of current flowing between the collector and the emitter of the amplifier transistor 501 can be decreased. Accordingly, the increase in the temperature of the amplifier transistor 501 can be suppressed. That is, the thermal runaway of the amplifier transistor 501 can be suppressed.

Conversely, as the temperature of the amplifier transistor 501 decreases and the amount of the base current of the seventh transistor 521 decreases, the bias voltage to be supplied from the base bias circuit 403 to the amplifier transistor 501 becomes high. As a result, the amount of current flowing between the collector and the emitter of the amplifier transistor 501 can be increased. Thus, the decrease in the temperature of the amplifier transistor 501 can be suppressed.

That is, with a configuration in which the temperature change of the seventh transistor 521 is substantially the same as the temperature change of the amplifier transistor 501 and the change in current based on the temperature change of the seventh transistor 521 is fed back to the reference circuit 442a, a bias for reducing the temperature change of the amplifier transistor 501 can be supplied to the amplifier transistor 501.

A second example of the replica circuit 511 according to the fourth embodiment will be described.

Figure 23:
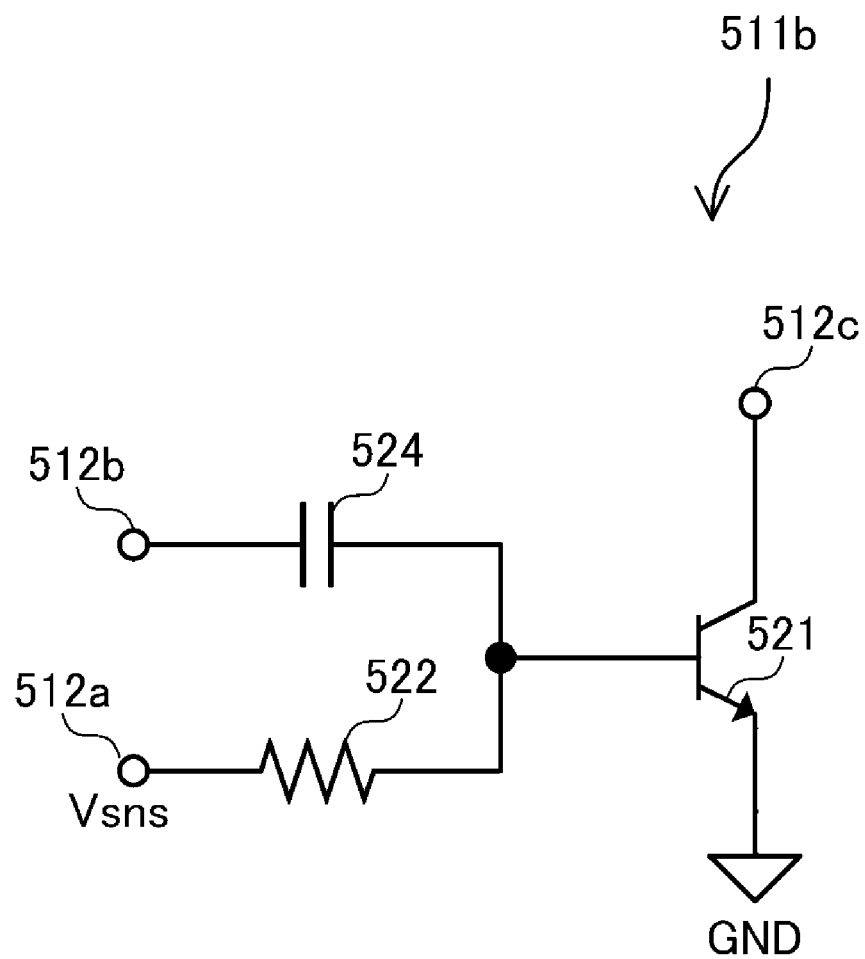
FIG. 23 is a circuit diagram of a second example of the replica circuit 511.

FIG. 23 is a circuit diagram of the second example of the replica circuit 511. As illustrated in FIG. 23, in the second example of the replica circuit 511 (which may be hereinafter referred to as a replica circuit 511b), as compared with the replica circuit 511a illustrated in FIG. 22, the seventh transistor 521 is configured to simulate the amplification operation of the amplifier transistor 501.

The replica circuit 511b includes the seventh transistor 521 (seventh diode), a resistance element 522, and a capacitor 524. For example, the resistance element 522 has substantially the same electrical characteristics as the resistance element 502. The resistance element 522 has a first end connected to the reference bias terminal 512a, and a second end.

For example, the capacitor 524 has substantially the same electrical characteristics as the capacitor 504. The capacitor 524 has a first end connected to the RF signal terminal 512b, and a second end.

The seventh transistor 521 has a collector connected to the amplified signal terminal 512c, a base connected to the second end of the resistance element 522 and the second end of the capacitor 524, and an emitter that is grounded. The base and the emitter of the seventh transistor 521 form a seventh diode. In this case, the base and the emitter of the seventh transistor 521 correspond to the anode and the cathode of the seventh diode, respectively.

The seventh transistor 521 performs substantially the same amplification operation as that of the amplifier transistor 501. Specifically, the collector of the seventh transistor 521 is connected to the collector of the amplifier transistor 501. The emitter of the seventh transistor 521 is grounded in a manner similar to that of the emitter of the amplifier transistor 501. The base of the seventh transistor 521 receives the input signal RFin and a bias similar to those of the base of the amplifier transistor 501. Specifically, an RF signal is supplied to the base of the seventh transistor 521 from the input terminal 31 through the capacitor 524 having substantially the same electrical characteristics as the capacitor 504. Further, the reference voltage Vsns, which is substantially the same as the voltage across the Bout terminal 425, is applied to the first end of the resistance element 522 having substantially the same electrical characteristics as the resistance element 502. Thus, substantially the same DC bias as the DC bias to be applied to the base of the amplifier transistor 501 is applied to the base of the seventh transistor 521.

Accordingly, the base current of the seventh transistor 521, that is, the shunt current in the reference circuit 442, can be substantially the same as the base current of the amplifier transistor 501. As a result, since the change in the base current of the amplifier transistor 501 can be appropriately reflected in the bias voltage to be supplied from the base bias circuit 403, a bias for effectively reducing the temperature change of the amplifier transistor 501 can be supplied to the amplifier transistor 501.

A second example of the reference circuit 442 according to the fourth embodiment will be described.

Figure 24:
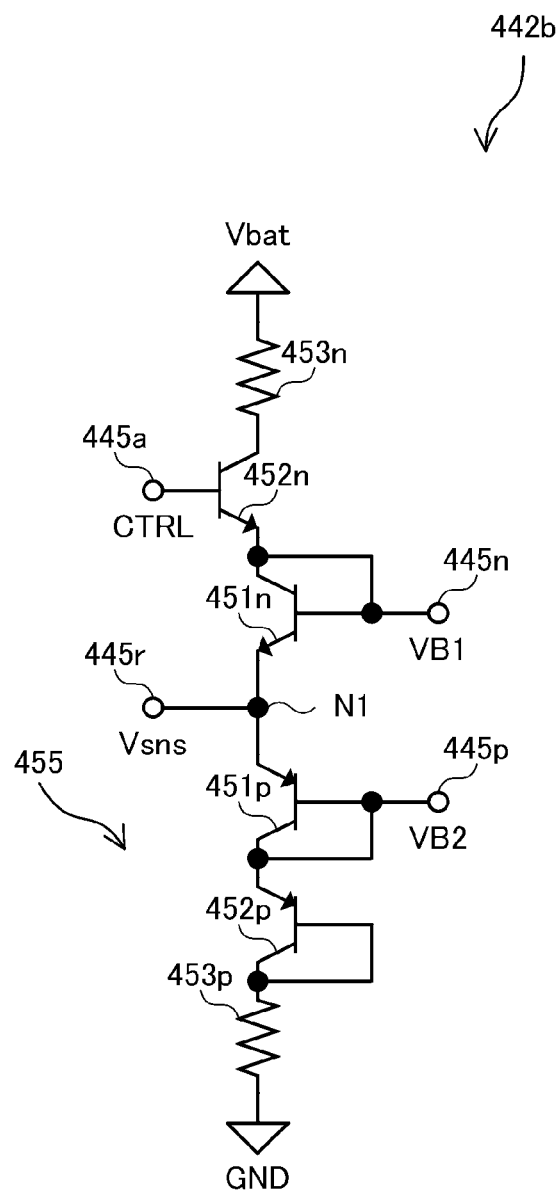
FIG. 24 is a circuit diagram of a second example of the reference circuit 442.

FIG. 24 is a circuit diagram of the second example of the reference circuit 442. As illustrated in FIG. 24, in the second example of the reference circuit 442 (which may be hereinafter referred to as a reference circuit 442b), as compared with the reference circuit 441b illustrated in FIG. 15, the shunt terminal 445r is further connected.

The difference from the reference circuit 441b will be described hereinafter. The reference circuit 442b includes an intermediate node N1 between the emitter of the transistor 451n and the emitter of the transistor 451p. For example, a current is supplied to the control terminal 445a as the control signal CTRL. The shunt terminal 445r is connected to the intermediate node N1.

In the reference circuit 442b, a current is adjusted as the control signal CTRL to adjust a current flowing from the resistance element 453n to the ground through the intermediate node N1. That is, the first bias voltage VB1 and the second bias voltage VB2 can be adjusted by using the current of the control signal CTRL.

Further, the changes in the first bias voltage VB1 and the second bias voltage VB2 in response to the shunt current are similar to the changes in the first bias voltage VB1 and the second bias voltage VB2 in response to the shunt current in the reference circuit 442a (see FIG. 21).

A third example of the reference circuit 442 according to the fourth embodiment will be described.

Figure 25:
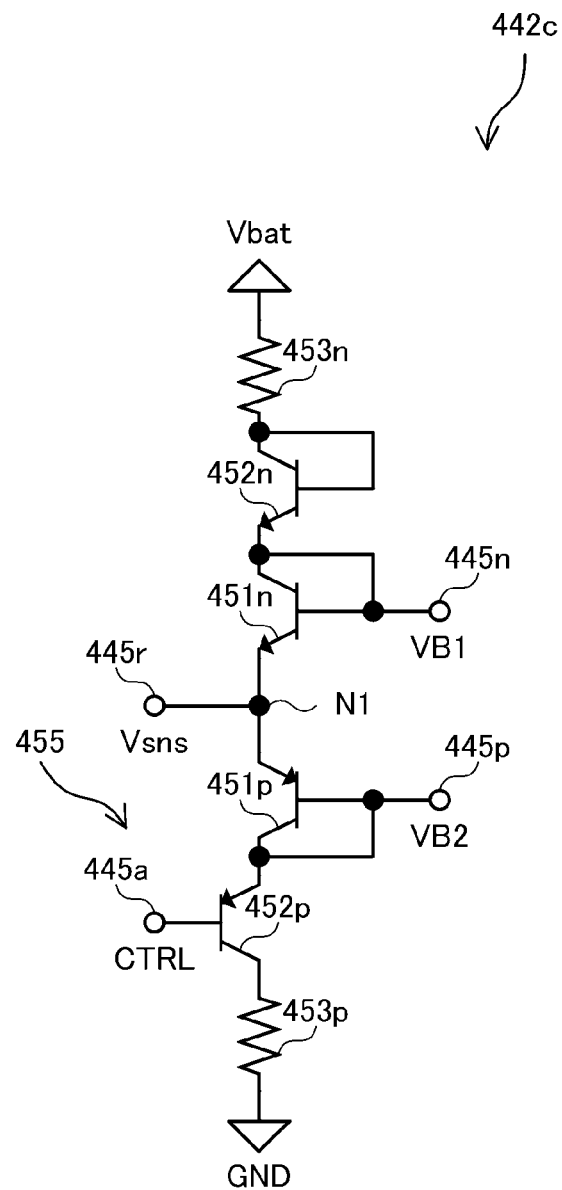
FIG. 25 is a circuit diagram of a third example of the reference circuit 442.

FIG. 25 is a circuit diagram of the third example of the reference circuit 442. As illustrated in FIG. 25, in the third example of the reference circuit 442 (which may be hereinafter referred to as a reference circuit 442c), as compared with the reference circuit 441c illustrated in FIG. 16, the shunt terminal 445r is further connected.

The difference from the reference circuit 441c will be described hereinafter. The reference circuit 442c includes an intermediate node N1 between the emitter of the transistor 451n and the emitter of the transistor 451p. For example, a current is supplied to the control terminal 445a as the control signal CTRL. The shunt terminal 445r is connected to the intermediate node N1.

In the reference circuit 442c, a current is adjusted as the control signal CTRL to adjust a current flowing from the resistance element 453n to the ground through the intermediate node N1. That is, the first bias voltage VB1 and the second bias voltage VB2 can be adjusted by using the current of the control signal CTRL.

Further, the changes in the first bias voltage VB1 and the second bias voltage VB2 in response to the shunt current are similar to the changes in the first bias voltage VB1 and the second bias voltage VB2 in response to the shunt current in the reference circuit 442a (see FIG. 21).

A fourth example of the reference circuit 442 according to the fourth embodiment will be described.

Figure 26:
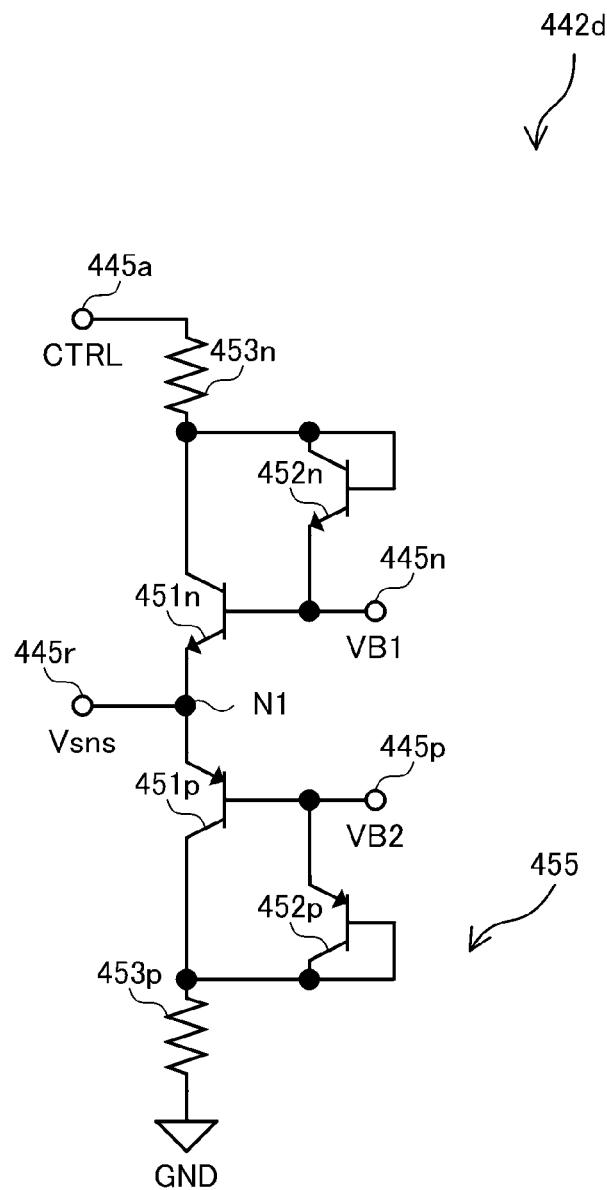
FIG. 26 is a circuit diagram of a fourth example of the reference circuit 442.

FIG. 26 is a circuit diagram of the fourth example of the reference circuit 442. As illustrated in FIG. 26, in the fourth example of the reference circuit 442 (which may be hereinafter referred to as a reference circuit 442d), as compared with the reference circuit 441d illustrated in FIG. 17, the shunt terminal 445r is further connected.

The difference from the reference circuit 441d will be described hereinafter. The reference circuit 442d includes an intermediate node N1 between the emitter of the transistor 451n and the emitter of the transistor 451p. For example, a current is supplied to the control terminal 445a as the control signal CTRL. The shunt terminal 445r is connected to the intermediate node N1.

In the reference circuit 442d, a current is adjusted as the control signal CTRL to adjust a current flowing from the resistance element 453n to the ground through the intermediate node N1. That is, the first bias voltage VB1 and the second bias voltage VB2 can be adjusted by using the current of the control signal CTRL.

As the amount of the shunt current increases, the amount of current flowing from the intermediate node N1 to the ground through the resistance element 453p decreases. Accordingly, the voltage between the first end and the second end of the resistance element 453p and the base-emitter voltage Vbe of the transistor 452p become low. As a result, the second bias voltage VB2 becomes low. Further, in addition to the second bias voltage VB2 becoming low, the base-emitter voltage Vbe of the transistor 451p becomes low. As a result, the first bias voltage VB1 also becomes low.

Conversely, as the amount of the shunt current decreases, the amount of current flowing from the intermediate node N1 to the ground through the resistance element 453p increases. Accordingly, the voltage between the first end and the second end of the resistance element 453p and the base-emitter voltage Vbe of the transistor 452p become high. As a result, the second bias voltage VB2 becomes high. Further, in addition to the second bias voltage VB2 becoming high, the base-emitter voltage Vbe of the transistor 451p becomes high. As a result, the first bias voltage VB1 also becomes high.

A fifth example of the reference circuit 442 according to the fourth embodiment will be described.

Figure 27:
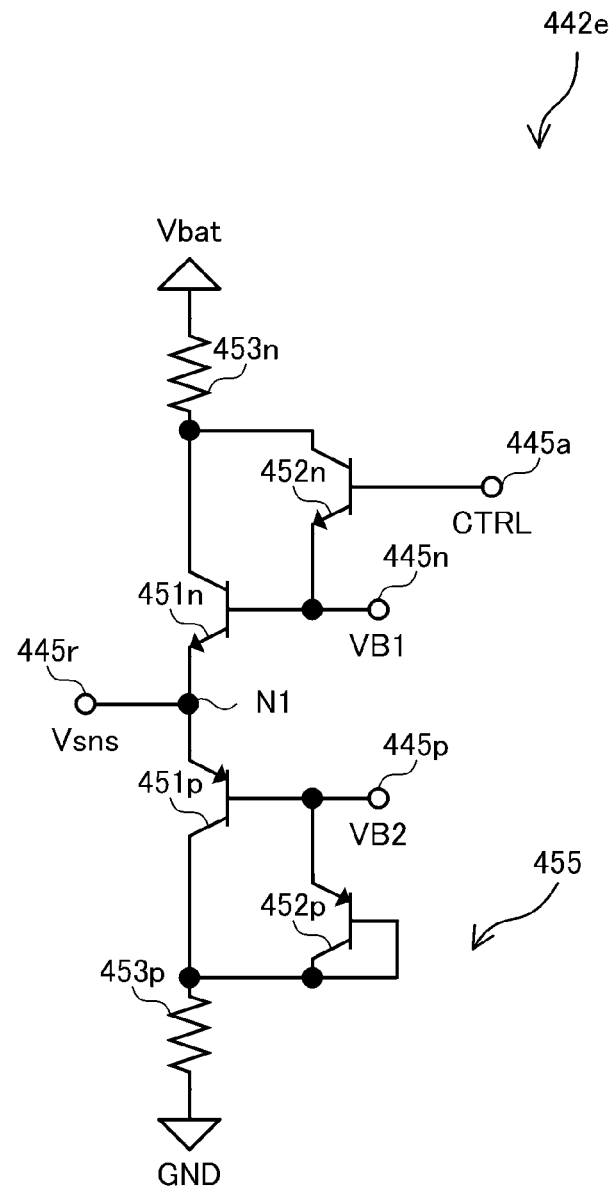
FIG. 27 is a circuit diagram of a fifth example of the reference circuit 442.

FIG. 27 is a circuit diagram of the fifth example of the reference circuit 442. As illustrated in FIG. 27, in the fifth example of the reference circuit 442 (which may be hereinafter referred to as a reference circuit 442e), as compared with the reference circuit 441e illustrated in FIG. 18, the shunt terminal 445r is further connected.

The difference from the reference circuit 441e will be described hereinafter. The reference circuit 442e includes an intermediate node N1 between the emitter of the transistor 451n and the emitter of the transistor 451p. For example, a current is supplied to the control terminal 445a as the control signal CTRL. The shunt terminal 445r is connected to the intermediate node N1.

In the reference circuit 442e, a current is adjusted as the control signal CTRL to adjust a current flowing from the resistance element 453n to the ground through the intermediate node N1. That is, the first bias voltage VB1 and the second bias voltage VB2 can be adjusted by using the current of the control signal CTRL.

Further, the changes in the first bias voltage VB1 and the second bias voltage VB2 in response to the shunt current are similar to the changes in the first bias voltage VB1 and the second bias voltage VB2 in response to the shunt current in the reference circuit 442d (see FIG. 26).

A sixth example of the reference circuit 442 according to the fourth embodiment will be described.

Figure 28:
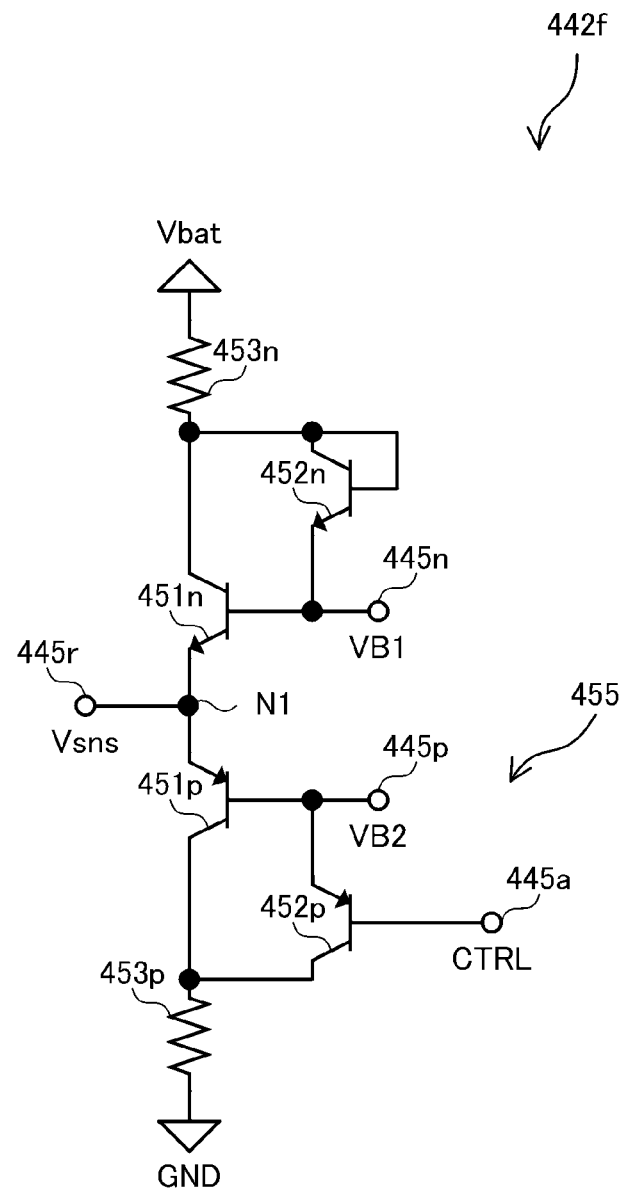
FIG. 28 is a circuit diagram of a sixth example of the reference circuit 442.

FIG. 28 is a circuit diagram of the sixth example of the reference circuit 442. As illustrated in FIG. 28, in the sixth example of the reference circuit 442 (which may be hereinafter referred to as a reference circuit 442f), as compared with the reference circuit 441f illustrated in FIG. 19, the shunt terminal 445r is further connected.

The difference from the reference circuit 441f will be described hereinafter. The reference circuit 442f includes an intermediate node N1 between the emitter of the transistor 451n and the emitter of the transistor 451p. For example, a current is supplied to the control terminal 445a as the control signal CTRL. The shunt terminal 445r is connected to the intermediate node N1.

In the reference circuit 442f, a current is adjusted as the control signal CTRL to adjust a current flowing from the resistance element 453n to the ground through the intermediate node N1. That is, the first bias voltage VB1 and the second bias voltage VB2 can be adjusted by using the current of the control signal CTRL.

Further, the changes in the first bias voltage VB1 and the second bias voltage VB2 in response to the shunt current are similar to the changes in the first bias voltage VB1 and the second bias voltage VB2 in response to the shunt current in the reference circuit 442d (see FIG. 26).

A seventh example of the reference circuit 442 according to the fourth embodiment will be described.

Figure 29:
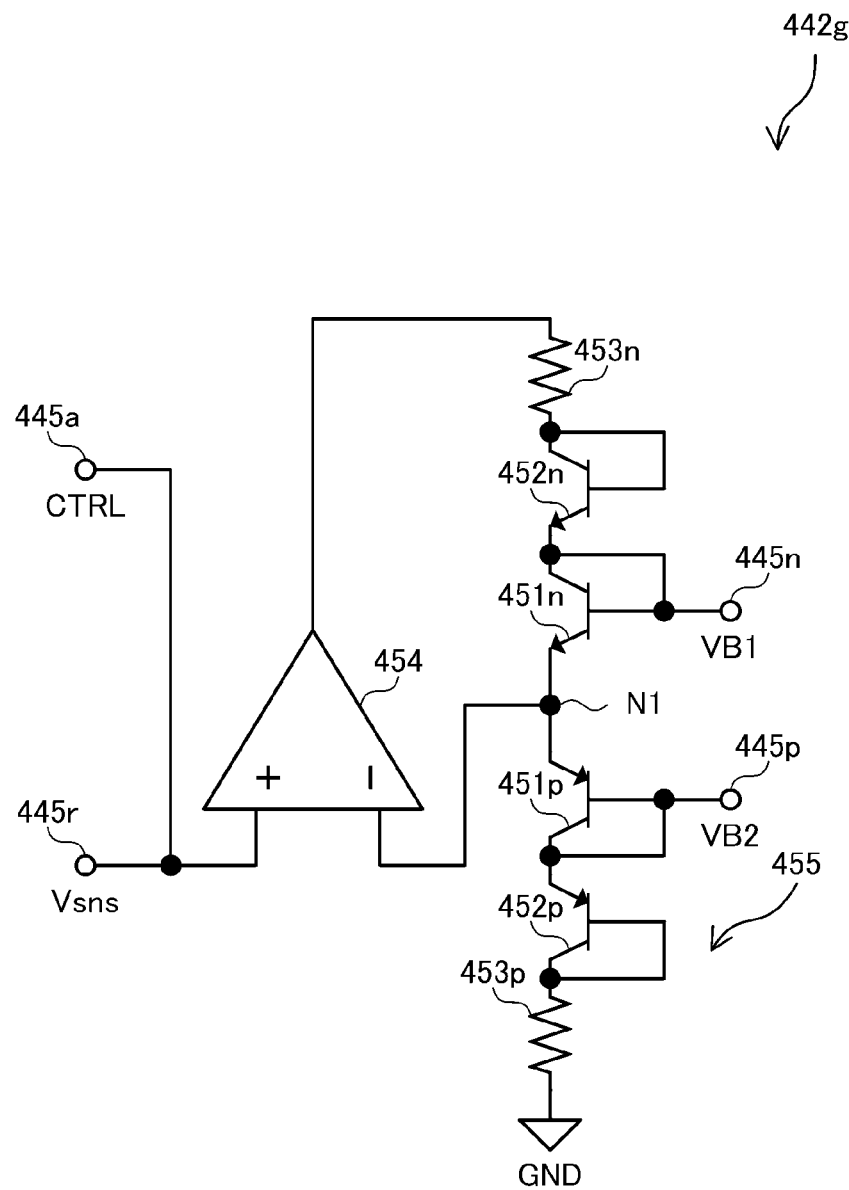
FIG. 29 is a circuit diagram of a seventh example of the reference circuit 442.

FIG. 29 is a circuit diagram of the seventh example of the reference circuit 442. As illustrated in FIG. 29, the seventh example of the reference circuit 442 (which may be hereinafter referred to as a reference circuit 442g) further includes an operational amplifier 454, as compared with the reference circuit 442a illustrated in FIG. 21.

The difference from the reference circuit 442a will be described hereinafter. The operational amplifier 454 has a non-inverting input terminal connected to the control terminal 445a and the shunt terminal 445r, an inverting input terminal connected to the intermediate node N1, and an output terminal connected to the first end of the resistance element 453n.

The voltage across the inverting input terminal of the operational amplifier 454 is the same voltage as the reference voltage Vsns of the shunt terminal 445r due to the negative feedback from the output terminal to the inverting input terminal. That is, the voltage across the intermediate node N1 is the same as the reference voltage Vsns. The first bias voltage VB1 is a voltage obtained by adding the base-emitter voltage Vbe of the transistor 451n to the voltage across the intermediate node N1. The second bias voltage VB2 is a voltage obtained by subtracting the base-emitter voltage Vbe of the transistor 451p from the voltage across the intermediate node N1. For example, a current is supplied to the control terminal 445a as the control signal CTRL.

Accordingly, for example, as the temperature of the amplifier transistor 501 increases and the base-emitter voltage Vbe of the seventh transistor 521 thermally coupled to the amplifier transistor 501 becomes low, the reference voltage Vsns becomes low because the control terminal 445a can be regarded as a constant current source. Therefore, the first bias voltage VB1 and the second bias voltage VB2 can be made low. Conversely, as the temperature of the amplifier transistor 501 decreases and the base-emitter voltage Vbe of the seventh transistor 521 thermally coupled to the amplifier transistor 501 becomes high, the reference voltage Vsns becomes high because the control terminal 445a can be regarded as a constant current source. Therefore, the first bias voltage VB1 and the second bias voltage VB2 can be made high.

An eighth example of the reference circuit 442 according to the fourth embodiment will be described.

Figure 30:
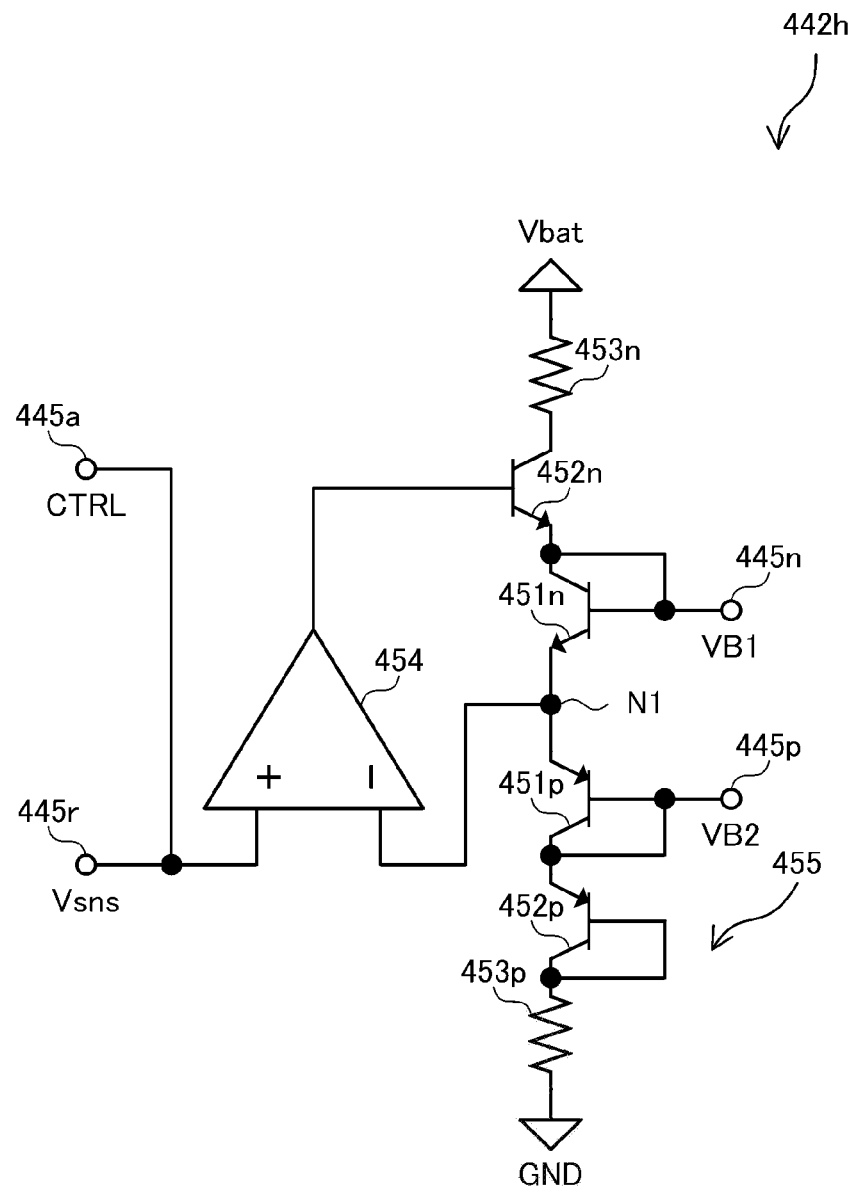
FIG. 30 is a circuit diagram of an eighth example of the reference circuit 442.

FIG. 30 is a circuit diagram of the eighth example of the reference circuit 442. As illustrated in FIG. 30, the eighth example of the reference circuit 442 (which may be hereinafter referred to as a reference circuit 442h) further includes an operational amplifier 454, as compared with the reference circuit 442b illustrated in FIG. 24.

The difference from the reference circuit 442b will be described hereinafter. The operational amplifier 454 has a non-inverting input terminal connected to the control terminal 445a and the shunt terminal 445r, an inverting input terminal connected to the intermediate node N1, and an output terminal connected to the base of the transistor 452n.

Due to the negative feedback of the operational amplifier 454, the voltage across the intermediate node N1 is the same voltage as the reference voltage Vsns of the shunt terminal 445r. The changes in the first bias voltage VB1 and the second bias voltage VB2 in response to a change in the reference voltage Vsns are similar to the changes in the first bias voltage VB1 and the second bias voltage VB2 in the reference circuit 442g (see FIG. 29) in response to a change in the reference voltage Vsns.

A ninth example of the reference circuit 442 according to the fourth embodiment will be described.

Figure 31:
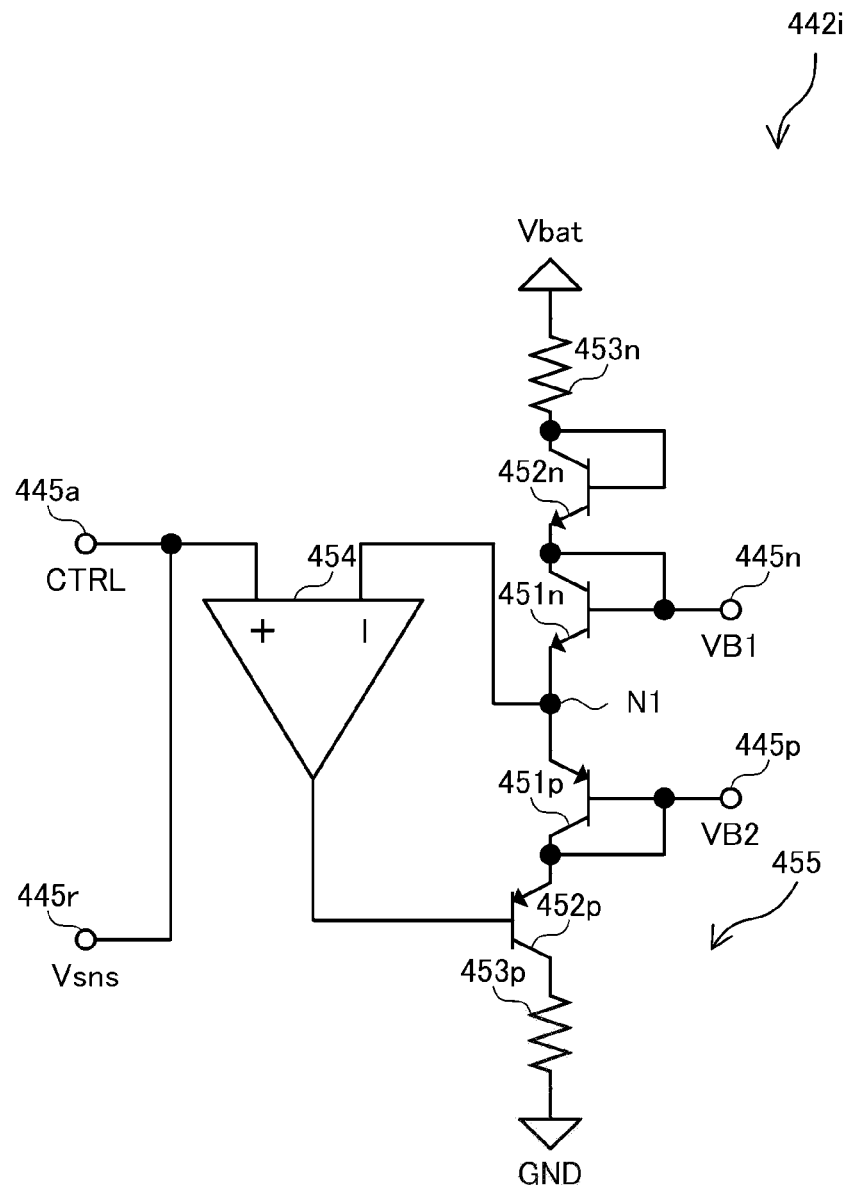
FIG. 31 is a circuit diagram of a ninth example of the reference circuit 442.

FIG. 31 is a circuit diagram of the ninth example of the reference circuit 442. As illustrated in FIG. 31, the ninth example of the reference circuit 442 (which may be hereinafter referred to as a reference circuit 442i) further includes an operational amplifier 454, as compared with the reference circuit 442c illustrated in FIG. 25.

The difference from the reference circuit 442c will be described hereinafter. The operational amplifier 454 has a non-inverting input terminal connected to the control terminal 445a and the shunt terminal 445r, an inverting input terminal connected to the intermediate node N1, and an output terminal connected to the base of the transistor 452p.

Due to the negative feedback of the operational amplifier 454, the voltage across the intermediate node N1 is the same voltage as the reference voltage Vsns of the shunt terminal 445r. The changes in the first bias voltage VB1 and the second bias voltage VB2 in response to a change in the reference voltage Vsns are similar to the changes in the first bias voltage VB1 and the second bias voltage VB2 in the reference circuit 442g (see FIG. 29) in response to a change in the reference voltage Vsns.

A tenth example of the reference circuit 442 according to the fourth embodiment will be described.

Figure 32:
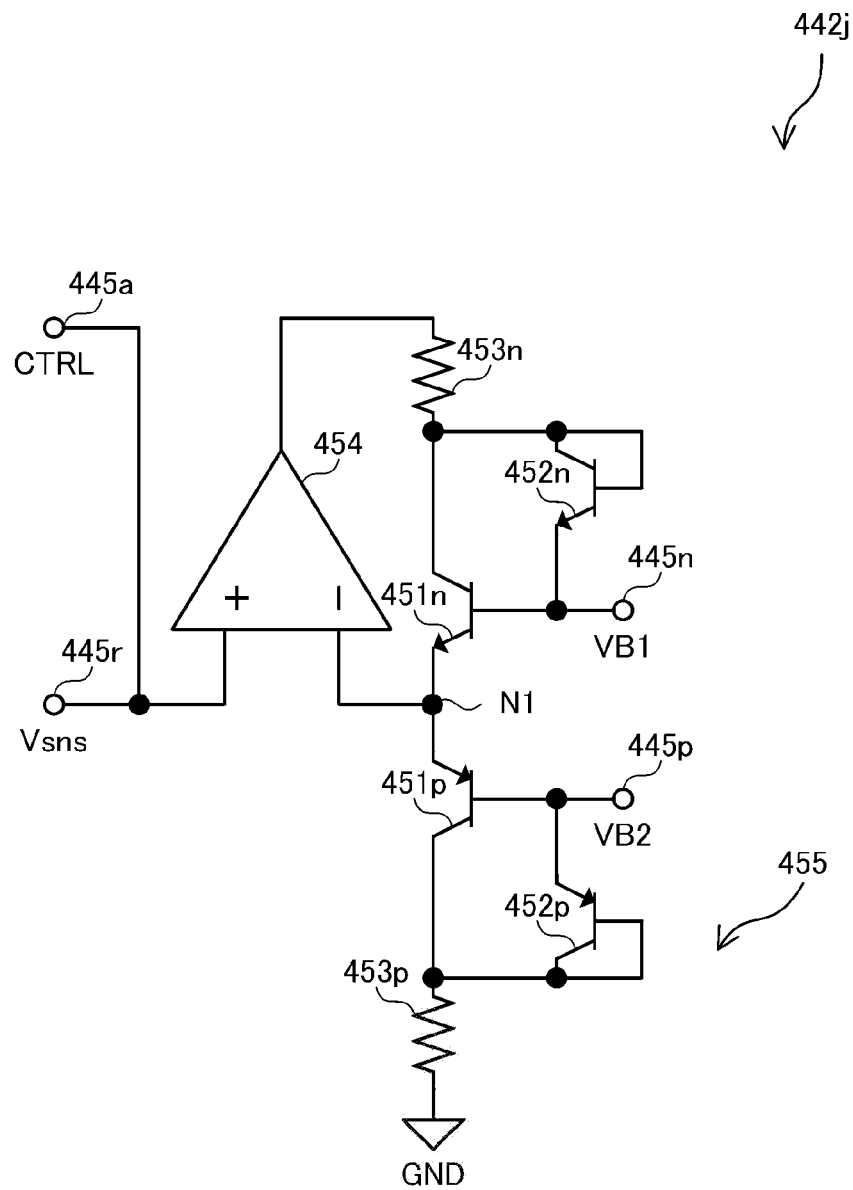
FIG. 32 is a circuit diagram of a tenth example of the reference circuit 442.

FIG. 32 is a circuit diagram of the tenth example of the reference circuit 442. As illustrated in FIG. 32, the tenth example of the reference circuit 442 (which may be hereinafter referred to as a reference circuit 442j) further includes an operational amplifier 454, as compared with the reference circuit 442d illustrated in FIG. 26.

The difference from the reference circuit 442d will be described hereinafter. The operational amplifier 454 has a non-inverting input terminal connected to the control terminal 445a and the shunt terminal 445r, an inverting input terminal connected to the intermediate node N1, and an output terminal connected to the first end of the resistance element 453n. Due to the negative feedback of the operational amplifier 454, the voltage across the intermediate node N1 is the same voltage as the reference voltage Vsns of the shunt terminal 445r.

Due to the negative feedback of the operational amplifier 454, the voltage across the intermediate node N1 is the same voltage as the reference voltage Vsns of the shunt terminal 445r. The changes in the first bias voltage VB1 and the second bias voltage VB2 in response to a change in the reference voltage Vsns are similar to the changes in the first bias voltage VB1 and the second bias voltage VB2 in the reference circuit 442g (see FIG. 29) in response to a change in the reference voltage Vsns.

An eleventh example of the reference circuit 442 according to the fourth embodiment will be described.

Figure 33:
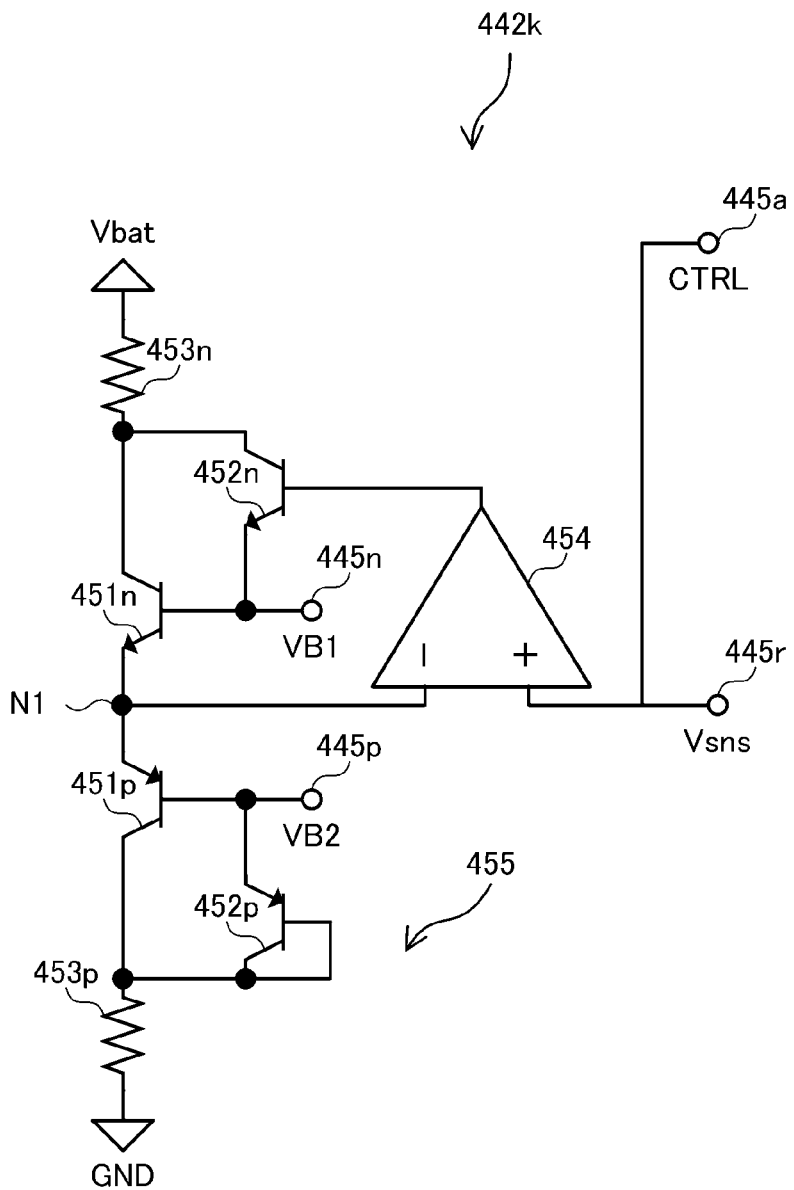
FIG. 33 is a circuit diagram of an eleventh example of the reference circuit 442.

FIG. 33 is a circuit diagram of the eleventh example of the reference circuit 442. As illustrated in FIG. 33, the eleventh example of the reference circuit 442 (which may be hereinafter referred to as a reference circuit 442k) further includes an operational amplifier 454, as compared with the reference circuit 442e illustrated in FIG. 27.

The difference from the reference circuit 442e will be described hereinafter. The operational amplifier 454 has a non-inverting input terminal connected to the control terminal 445a and the shunt terminal 445r, an inverting input terminal connected to the intermediate node N1, and an output terminal connected to the base of the transistor 452n.

Due to the negative feedback of the operational amplifier 454, the voltage across the intermediate node N1 is the same voltage as the reference voltage Vsns of the shunt terminal 445r. The changes in the first bias voltage VB1 and the second bias voltage VB2 in response to a change in the reference voltage Vsns are similar to the changes in the first bias voltage VB1 and the second bias voltage VB2 in the reference circuit 442g (see FIG. 29) in response to a change in the reference voltage Vsns.

A twelfth example of the reference circuit 442 according to the fourth embodiment will be described.

Figure 34:
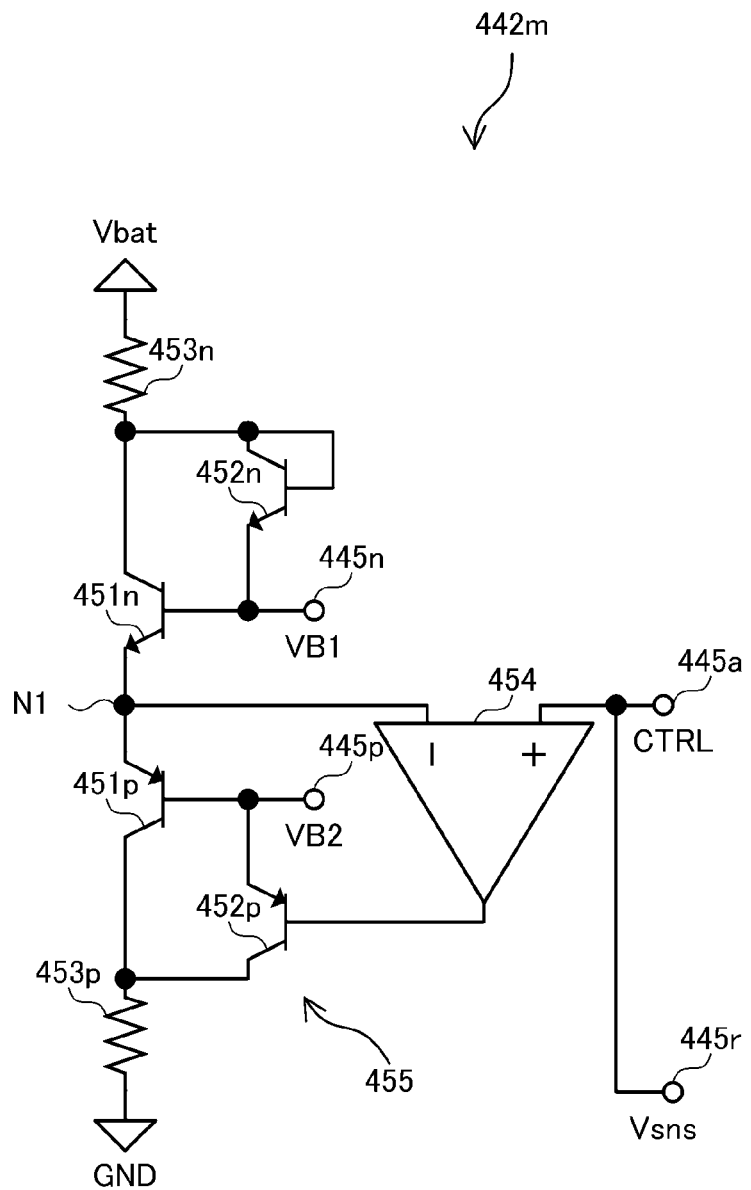
FIG. 34 is a circuit diagram of a twelfth example of the reference circuit 442.

FIG. 34 is a circuit diagram of the twelfth example of the reference circuit 442. As illustrated in FIG. 34, the twelfth example of the reference circuit 442 (which may be hereinafter referred to as a reference circuit 442m) further includes an operational amplifier 454, as compared with the reference circuit 442f illustrated in FIG. 28.

The difference from the reference circuit 442f will be described hereinafter. The operational amplifier 454 has a non-inverting input terminal connected to the control terminal 445a and the shunt terminal 445r, an inverting input terminal connected to the intermediate node N1, and an output terminal connected to the base of the transistor 452p.

Due to the negative feedback of the operational amplifier 454, the voltage across the intermediate node N1 is the same voltage as the reference voltage Vsns of the shunt terminal 445r. The changes in the first bias voltage VB1 and the second bias voltage VB2 in response to a change in the reference voltage Vsns are similar to the changes in the first bias voltage VB1 and the second bias voltage VB2 in the reference circuit 442g (see FIG. 29) in response to a change in the reference voltage Vsns.

Fifth Embodiment

A power amplifier device and a power amplifier circuit according to a fifth embodiment will be described.

Figure 35:
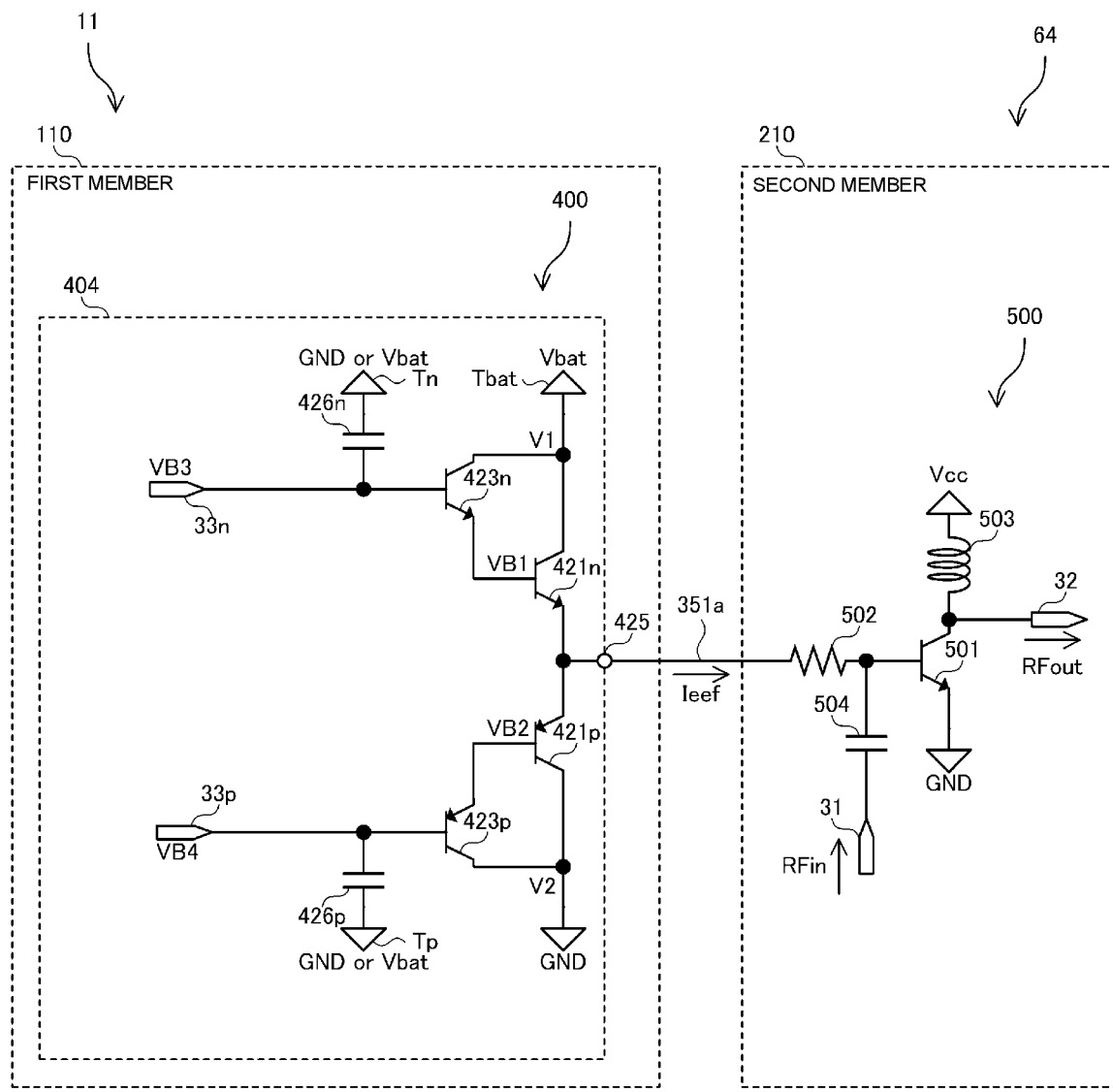
FIG. 35 is a circuit diagram of a power amplifier circuit 64.

FIG. 35 is a circuit diagram of a power amplifier circuit 64. As illustrated in FIG. 35, the power amplifier circuit 64 according to the fifth embodiment is different from the power amplifier circuit 61 according to the first embodiment in that the first bias transistor 421n and the second bias transistor 421p are each Darlington connected.

As compared with the power amplifier circuit 61 illustrated in FIG. 6, the power amplifier circuit 64 includes a base bias circuit 404 in place of the base bias circuit 401. As compared with the base bias circuit 401 illustrated in FIG. 6, the base bias circuit 404 includes a third bias transistor 423n and a fourth bias transistor 423p in place of the first application circuit 431n and the second application circuit 431p, respectively.

The difference from the power amplifier circuit 61 will be described hereinafter. The third bias transistor 423n has a collector to which the first voltage V1 is to be applied, an emitter electrically connected to the base of the first bias transistor 421n and configured to apply the first bias voltage VB1 to the base of the first bias transistor 421n, and a base to which a third bias voltage VB3 for controlling a current flowing from the collector to the emitter is to be applied.

In this embodiment, the third bias transistor 423n is an npn-type transistor. The characteristics of the third bias transistor 423n may be substantially the same as or different from the characteristics of the first bias transistor 421n. The collector and the base of the third bias transistor 423n are electrically connected to the terminal Tbat (power supply) for supplying the battery voltage Vbat and the bias input terminal 33n, respectively.

The first bias transistor 421n has a collector electrically connected to the collector of the third bias transistor 423n, a base electrically connected to the emitter of the third bias transistor 423n, and an emitter electrically connected to the Bout terminal 425.

The second bias transistor 421p has an emitter electrically connected to the emitter of the first bias transistor 421n and the Bout terminal 425, a base, and a collector that is grounded.

The fourth bias transistor 423p has a collector to which the second voltage V2 is to be applied, an emitter electrically connected to the base of the second bias transistor 421p and configured to apply the second bias voltage VB2 to the base of the second bias transistor 421p, and a base to which a fourth bias voltage VB4 for controlling a current flowing from the emitter to the collector is to be applied.

In this embodiment, the fourth bias transistor 423p is a pnp-type transistor. The characteristics of the fourth bias transistor 423p may be substantially the same as or different from the characteristics of the second bias transistor 421p. The emitter, the collector, and the base of the fourth bias transistor 423p are electrically connected to the base of the second bias transistor 421p, the ground, and the bias input terminal 33p, respectively.

The first bias voltage VB1 is lower than the third bias voltage VB3 by an amount corresponding to the base-emitter voltage Vbe of the third bias transistor 423n. The second bias voltage VB2 is higher than the fourth bias voltage VB4 by an amount corresponding to the base-emitter voltage Vbe of the fourth bias transistor 423p.

Since each of the second bias transistor 421p and the fourth bias transistor 423p has a turn-on voltage of, for example, approximately 0.7 volts, the voltage across the Bout terminal 425 relative to the ground is approximately 1.4 volts. Since the turn-on voltage of the amplifier transistor 501 is approximately 1.4 volts, the amplifier transistor 501 can be turned on by using the base bias circuit 404.

In the base bias circuit 404, since the first bias transistor 421n and the third bias transistor 423n are Darlington connected to each other, a higher current amplification factor than that of the configuration (see FIG. 6) that does not include the third bias transistor 423n can be attained. Also, since the second bias transistor 421p and the fourth bias transistor 423p are Darlington connected to each other, a higher current amplification factor than that of the configuration (see FIG. 6) that does not include the fourth bias transistor 423p can be attained.

As a result, the current flowing from the terminal Tbat to the ground through the first bias transistor 421n and the second bias transistor 421p can be large. Thus, the bias current to be supplied to the amplifier transistor 501 can be large.

In addition, the impedance of the terminal Tn seen from the Bout terminal 425 can be set to Zrn×(1/hfen), where Zrn is an impedance in the configuration (see FIG. 6) that does not include the third bias transistor 423n, and hfen is the current amplification factor of the third bias transistor 423n.

The impedance of the terminal Tp seen from the Bout terminal 425 can be set to Zrp×(1/hfep), where Zrp is an impedance in the configuration (see FIG. 6) that does not include the fourth bias transistor 423p, and hfep is the current amplification factor of the fourth bias transistor 423p.

Since the output impedance of the base bias circuit 404 can be reduced, the base bias circuit 404 can be brought close to an ideal bias supply source. In terms of the AC input signal RFin, the terminal Tn and the terminal Tp can be grounded with lower impedances.

Sixth Embodiment

A power amplifier device and a power amplifier circuit according to a sixth embodiment will be described.

Figure 36:
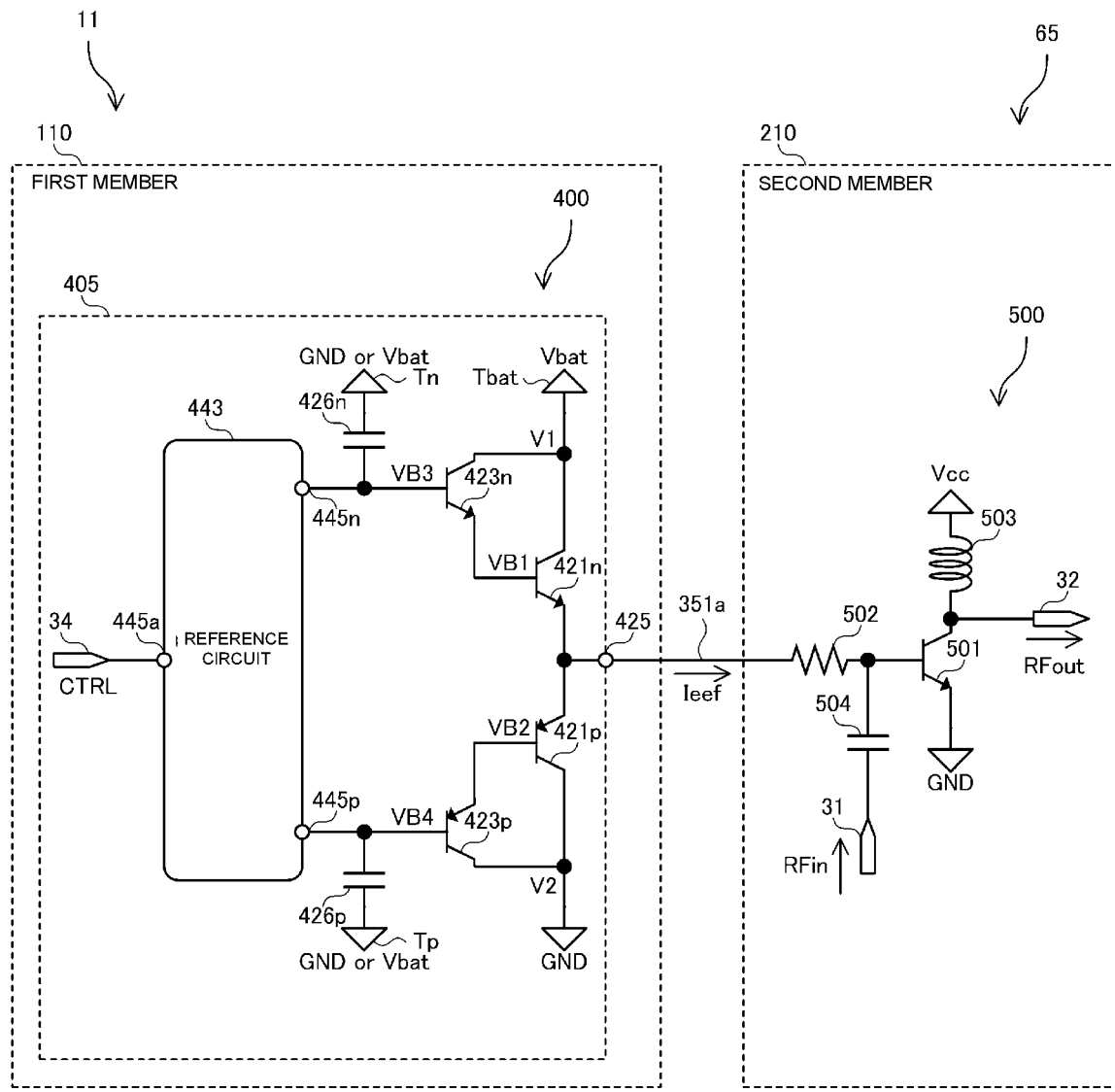
FIG. 36 is a circuit diagram of a power amplifier circuit 65.

FIG. 36 is a circuit diagram of a power amplifier circuit 65. As illustrated in FIG. 36, the power amplifier circuit 65 according to the sixth embodiment is different from the power amplifier circuit 64 according to the fifth embodiment in that the third bias voltage VB3 and the fourth bias voltage VB4 are adjusted in accordance with temperature.

As compared with the power amplifier circuit 64 illustrated in FIG. 35, the power amplifier circuit 65 includes a base bias circuit 405 in place of the base bias circuit 404. As compared with the base bias circuit 404 illustrated in FIG. 35, the base bias circuit 405 further includes a reference circuit 443.

The reference circuit 443 has a control terminal 445a connected to the control signal input terminal 34, a bias supply terminal 445n connected to the base of the third bias transistor 423n, and a bias supply terminal 445p connected to the base of the fourth bias transistor 423p.

A first example of the reference circuit 443 according to the sixth embodiment will be described.

Figure 37:
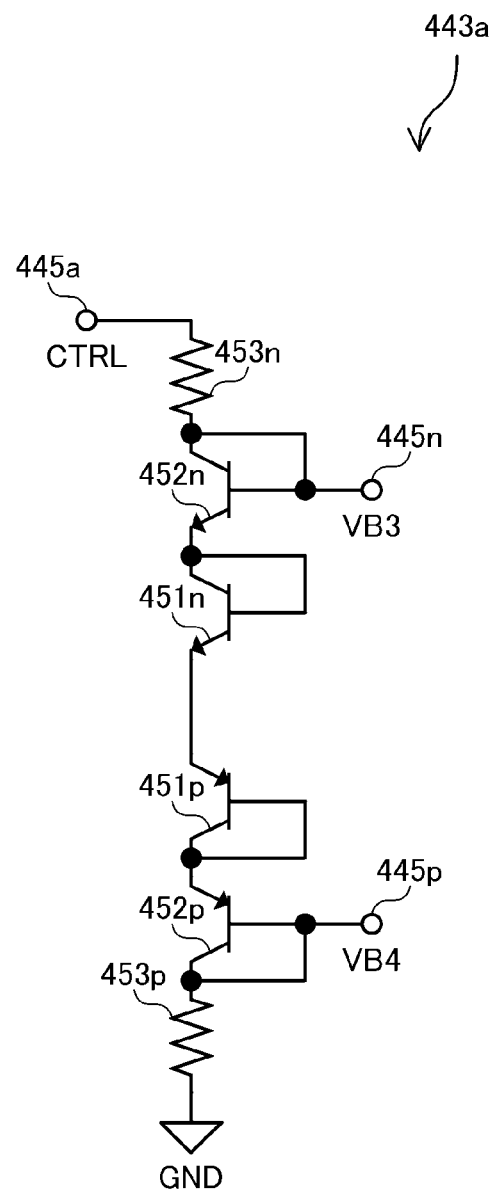
FIG. 37 is a circuit diagram of a first example of a reference circuit 443.

FIG. 37 is a circuit diagram of the first example of the reference circuit 443. As illustrated in FIG. 37, the first example of the reference circuit 443 (which may be hereinafter referred to as a reference circuit 443a) is different from the reference circuit 441a illustrated in FIG. 14 in the connection destinations of the bias supply terminals 445n and 445p.

The difference from the reference circuit 441a will be described hereinafter. The transistors 452n, 451n, 451p, and 452p function as a third diode, a fourth diode, a fifth diode, and a sixth diode, respectively.

The collector and the base of the transistor 452n correspond to the anode of the third diode, and the emitter of the transistor 452n corresponds to the cathode of the third diode.

The collector and the base of the transistor 451n correspond to the anode of the fourth diode, and the emitter of the transistor 451n corresponds to the cathode of the fourth diode.

The collector and the base of the transistor 451p correspond to the anode of the fifth diode, and the emitter of the transistor 451p corresponds to the cathode of the fifth diode. The collector and the base of the transistor 452p correspond to the anode of the sixth diode, and the emitter of the transistor 452p corresponds to the cathode of the sixth diode.

The bias supply terminal 445n is connected to the base and collector of the transistor 452n. The bias supply terminal 445p is connected to the base and collector of the transistor 452p.

The control terminal 445a is supplied with the control signal CTRL for controlling a current flowing from the emitter of the transistor 452n to the emitter of the transistor 452p. Specifically, in the reference circuit 443a, a current or voltage is supplied to the control terminal 445a as the control signal CTRL.

Accordingly, the potential of the base of the transistor 452p relative to the ground, or the fourth bias voltage VB4, is the voltage between the first end and the second end of the resistance element 453p. The potential of the base of the transistor 452n relative to the ground, or the third bias voltage VB3, is a voltage obtained by adding the base-emitter voltage Vbe of the transistor 452p, the base-emitter voltage Vbe of the transistor 451p, the base-emitter voltage Vbe of the transistor 451n, and the base-emitter voltage Vbe of the transistor 452n to the fourth bias voltage VB4.

The voltage between the first end and the second end of the resistance element 453p and the base-emitter voltages Vbe of the transistors 452p, 451p, 451n, and 452n can be adjusted in accordance with the magnitude of the current or voltage of the control signal CTRL. In the reference circuit 443a, therefore, the third bias voltage VB3 and the fourth bias voltage VB4 can be adjusted by using the current or voltage of the control signal CTRL.

A second example of the reference circuit 441 according to the sixth embodiment will be described.

Figure 38:
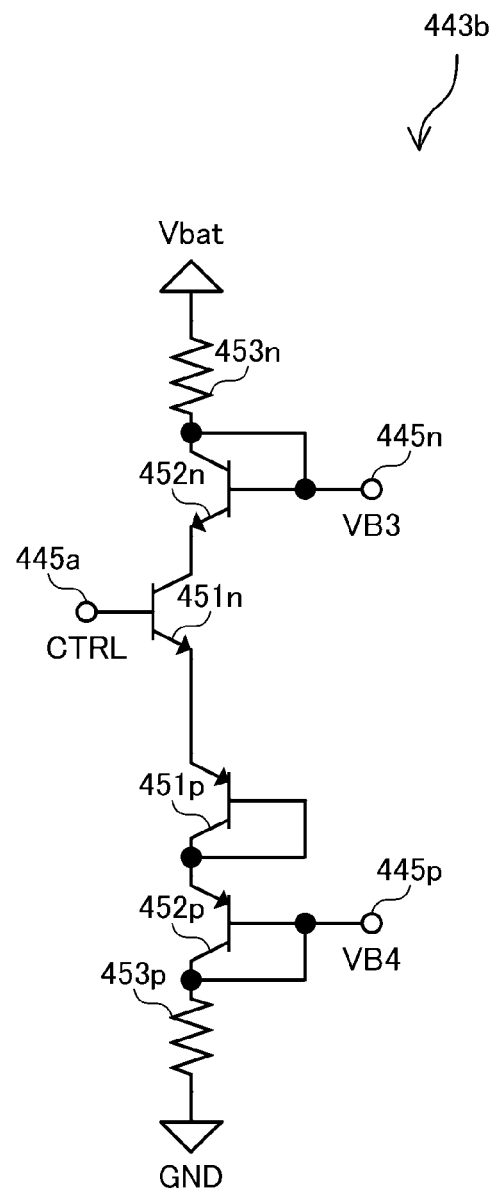
FIG. 38 is a circuit diagram of a second example of the reference circuit 443.

FIG. 38 is a circuit diagram of the second example of the reference circuit 443. As illustrated in FIG. 38, the second example of the reference circuit 443 (which may be hereinafter referred to as a reference circuit 443b) is different from the reference circuit 443a illustrated in FIG. 37 in the connection destination of the control terminal 445a.

The difference from the reference circuit 443a will be described hereinafter. The base and the emitter of the transistor 451n form a fourth diode. In this case, the base and the emitter of the transistor 451n correspond to the anode and the cathode of the fourth diode, respectively.

The first end of the resistance element 453n is connected to a terminal to which the battery voltage Vbat is to be supplied. The transistor 451n is not diode connected, and has a collector connected to the emitter of the transistor 452n, a base connected to the control terminal 445a, and an emitter connected to the emitter of the transistor 451p.

In the reference circuit 443b, a current or voltage is adjusted as the control signal CTRL to adjust a current flowing through the resistance element 453n, the transistors 452n, 451n, 451p, and 452p, and the resistance element 453p. That is, the third bias voltage VB3 and the fourth bias voltage VB4 can be adjusted by using the current or voltage of the control signal CTRL.

A third example of the reference circuit 443 according to the sixth embodiment will be described.

Figure 39:
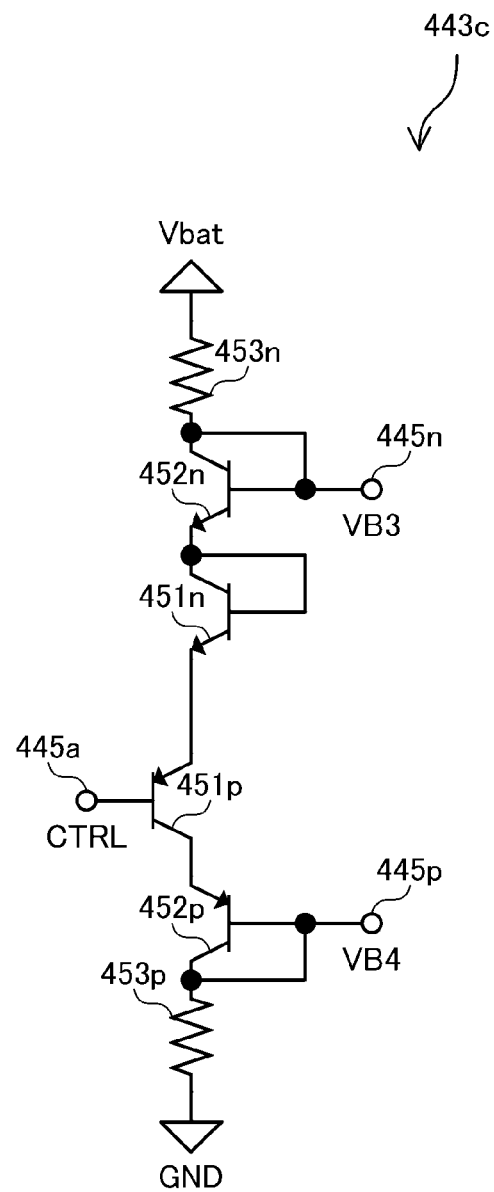
FIG. 39 is a circuit diagram of a third example of the reference circuit 443.

FIG. 39 is a circuit diagram of the third example of the reference circuit 443. As illustrated in FIG. 39, the third example of the reference circuit 443 (which may be hereinafter referred to as a reference circuit 443c) is different from the reference circuit 443a illustrated in FIG. 37 in the connection destination of the control terminal 445a.

The difference from the reference circuit 443a will be described hereinafter. The emitter and the base of the transistor 451p form a fifth diode. In this case, the emitter and the base of the transistor 451p correspond to the anode and the cathode of the fifth diode, respectively.

The first end of the resistance element 453n is connected to a terminal to which the battery voltage Vbat is to be supplied. The transistor 451p is not diode connected, and has an emitter connected to the emitter of the transistor 451n, a base connected to the control terminal 445a, and a collector connected to the emitter of the transistor 452p.

In the reference circuit 443c, a current or voltage is adjusted as the control signal CTRL to adjust a current flowing through the resistance element 453n, the transistors 452n, 451n, 451p, and 452p, and the resistance element 453p. That is, the third bias voltage VB3 and the fourth bias voltage VB4 can be adjusted by using the current or voltage of the control signal CTRL.

A fourth example of the reference circuit 443 according to the sixth embodiment will be described.

Figure 40:
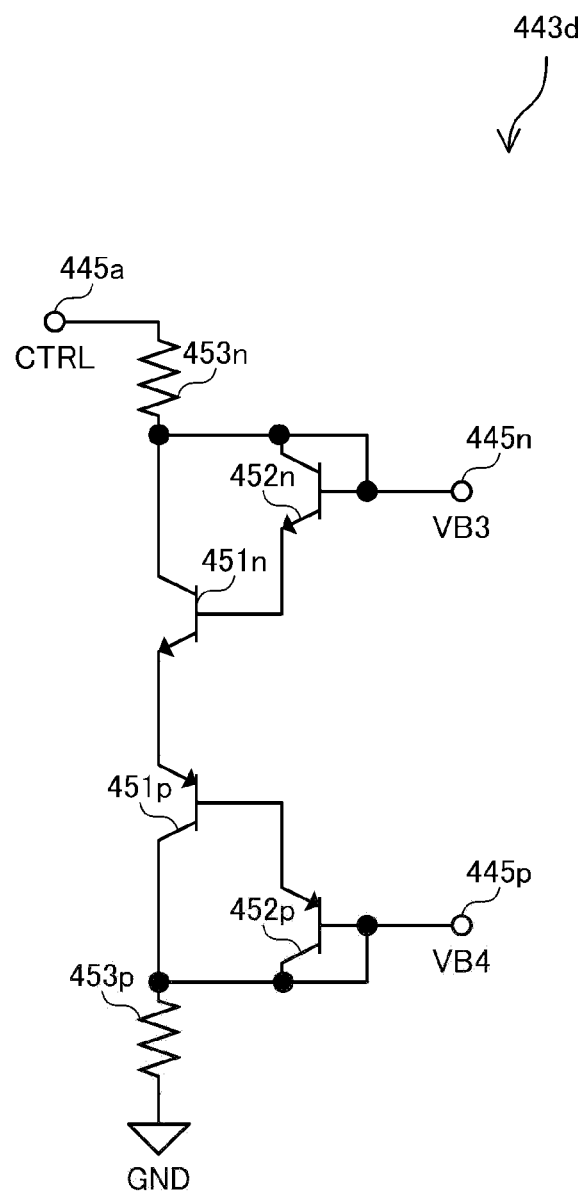
FIG. 40 is a circuit diagram of a fourth example of the reference circuit 443.

FIG. 40 is a circuit diagram of the fourth example of the reference circuit 443. As illustrated in FIG. 40, the fourth example of the reference circuit 443 (which may be hereinafter referred to as a reference circuit 443d) is different from the reference circuit 441d illustrated in FIG. 17 in the connection destinations of the bias supply terminals 445n and 445p. In the reference circuit 443d, the transistors 451n and 452n are Darlington connected to each other, and the transistors 451p and 452p are Darlington connected to each other.

The difference from the reference circuit 441d will be described hereinafter. The base and the emitter of the transistor 452n form a third diode. In this case, the base and the emitter of the transistor 452n correspond to the anode and the cathode of the third diode, respectively. The base and the emitter of the transistor 451n form a fourth diode. In this case, the base and the emitter of the transistor 451n correspond to the anode and the cathode of the fourth diode, respectively.

The emitter and the base of the transistor 451p form a fifth diode. In this case, the emitter and the base of the transistor 451p correspond to the anode and the cathode of the fifth diode, respectively. The emitter and the base of the transistor 452p form a sixth diode. In this case, the emitter and the base of the transistor 452p correspond to the anode and the cathode of the sixth diode, respectively.

The bias supply terminal 445n is connected to the base and collector of the transistor 452n. The bias supply terminal 445p is connected to the base and collector of the transistor 452p.

In the reference circuit 443d, a current or voltage is supplied to the control terminal 445a as the control signal CTRL. Accordingly, the potential of the base of the transistor 452p relative to the ground, or the fourth bias voltage VB4, is the voltage between the first end and the second end of the resistance element 453p. The potential of the base of the transistor 452n relative to the ground, or the third bias voltage VB3, is the sum obtained by adding the base-emitter voltage Vbe of the transistor 452p, the base-emitter voltage Vbe of the transistor 451p, the base-emitter voltage Vbe of the transistor 451n, and the base-emitter voltage Vbe of the transistor 452n to the fourth bias voltage VB4.

The voltage between the first end and the second end of the resistance element 453p and the base-emitter voltages Vbe of the transistors 452p, 451p, 451n, and 452n can be adjusted in accordance with the magnitude of the current or voltage of the control signal CTRL. In the reference circuit 443d, therefore, the third bias voltage VB3 and the fourth bias voltage VB4 can be adjusted by using the current or voltage of the control signal CTRL.

A fifth example of the reference circuit 443 according to the sixth embodiment will be described.

Figure 41:
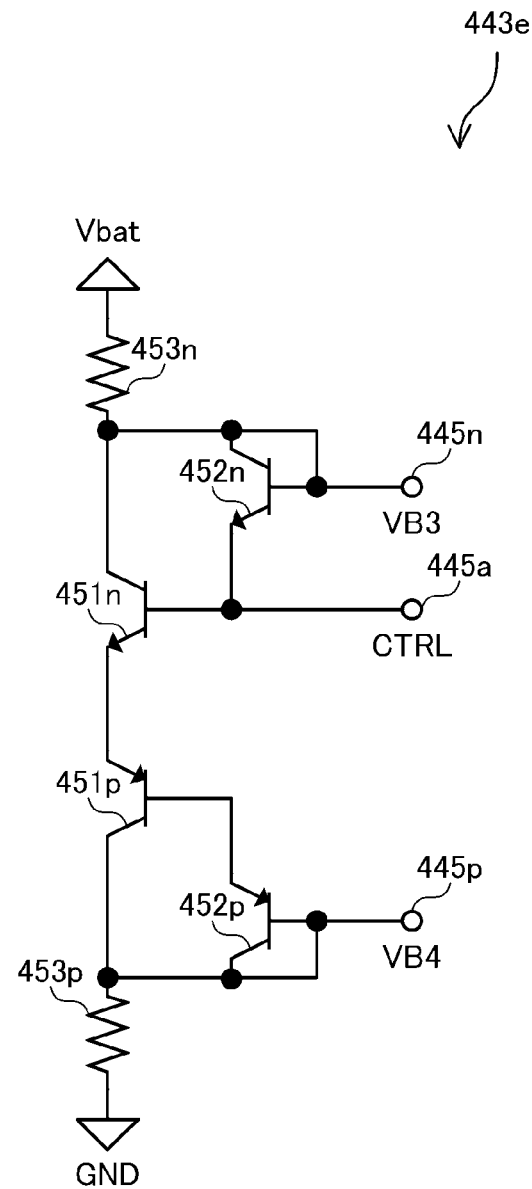
FIG. 41 is a circuit diagram of a fifth example of the reference circuit 443.

FIG. 41 is a circuit diagram of the fifth example of the reference circuit 443. As illustrated in FIG. 41, the fifth example of the reference circuit 443 (which may be hereinafter referred to as a reference circuit 443e) is different from the reference circuit 443d illustrated in FIG. 40 in the connection destination of the control terminal 445a.

The difference from the reference circuit 443d will be described hereinafter. The first end of the resistance element 453n is connected to a terminal to which the battery voltage Vbat is to be supplied. The control terminal 445a is connected to the base of the transistor 451n.

In the reference circuit 443e, a current or voltage is adjusted as the control signal CTRL to adjust a current flowing through the resistance element 453n, the transistors 452n, 451n, 451p, and 452p, and the resistance element 453p. That is, the third bias voltage VB3 and the fourth bias voltage VB4 can be adjusted by using the current or voltage of the control signal CTRL.

A sixth example of the reference circuit 443 according to the sixth embodiment will be described.

Figure 42:
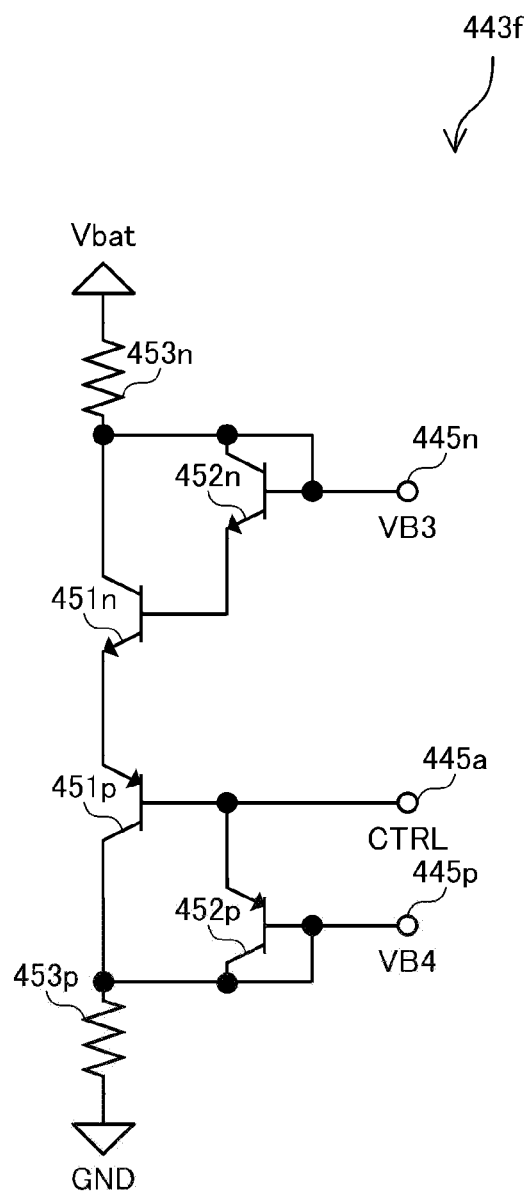
FIG. 42 is a circuit diagram of a sixth example of the reference circuit 443.

FIG. 42 is a circuit diagram of the sixth example of the reference circuit 443. As illustrated in FIG. 42, the sixth example of the reference circuit 443 (which may be hereinafter referred to as a reference circuit 443f) is different from the reference circuit 443d illustrated in FIG. 40 in the connection destination of the control terminal 445a.

The difference from the reference circuit 443d will be described hereinafter. The first end of the resistance element 453n is connected to a terminal to which the battery voltage Vbat is to be supplied. The control terminal 445a is connected to the base of the transistor 451p.

In the reference circuit 443f, a current or voltage is adjusted as the control signal CTRL to adjust a current flowing through the resistance element 453n, the transistors 452n, 451n, 451p, and 452p, and the resistance element 453p. That is, the third bias voltage VB3 and the fourth bias voltage VB4 can be adjusted by using the current or voltage of the control signal CTRL.

Seventh Embodiment

A power amplifier device and a power amplifier circuit according to a seventh embodiment will be described.

Figure 43:
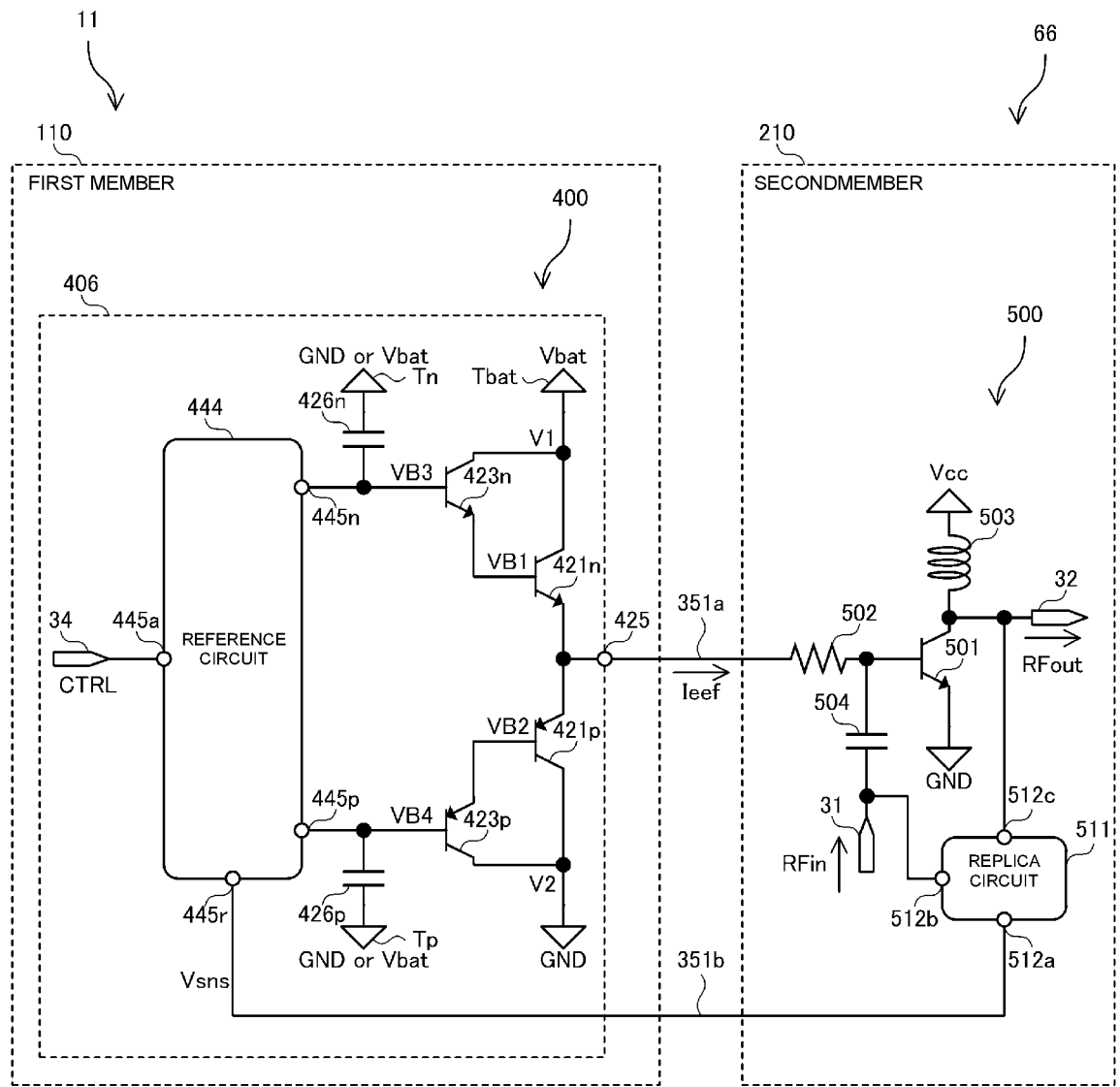
FIG. 43 is a circuit diagram of a power amplifier circuit 66.

FIG. 43 is a circuit diagram of a power amplifier circuit 66. As illustrated in FIG. 43, the power amplifier circuit 66 according to the seventh embodiment is different from the power amplifier circuit 65 according to the sixth embodiment in that the third bias voltage VB3 and the fourth bias voltage VB4 are adjusted further in accordance with the temperature of the amplifier transistor 501.

As compared with the power amplifier circuit 65 illustrated in FIG. 36, the power amplifier circuit 66 includes a base bias circuit 406 in place of the base bias circuit 405, and further includes the member-to-member connection conductor 351b and the replica circuit 511. As compared with the base bias circuit 405 illustrated in FIG. 36, the base bias circuit 406 includes a reference circuit 444 in place of the reference circuit 443.

The reference circuit 444 has a control terminal 445a connected to the control signal input terminal 34, a bias supply terminal 445n connected to the base of the third bias transistor 423n, a bias supply terminal 445p connected to the base of the fourth bias transistor 423p, and a shunt terminal 445r connected to the reference bias terminal 512a of the replica circuit 511 through the member-to-member connection conductor 351b.

A first example of the reference circuit 444 according to the seventh embodiment will be described.

Figure 44:
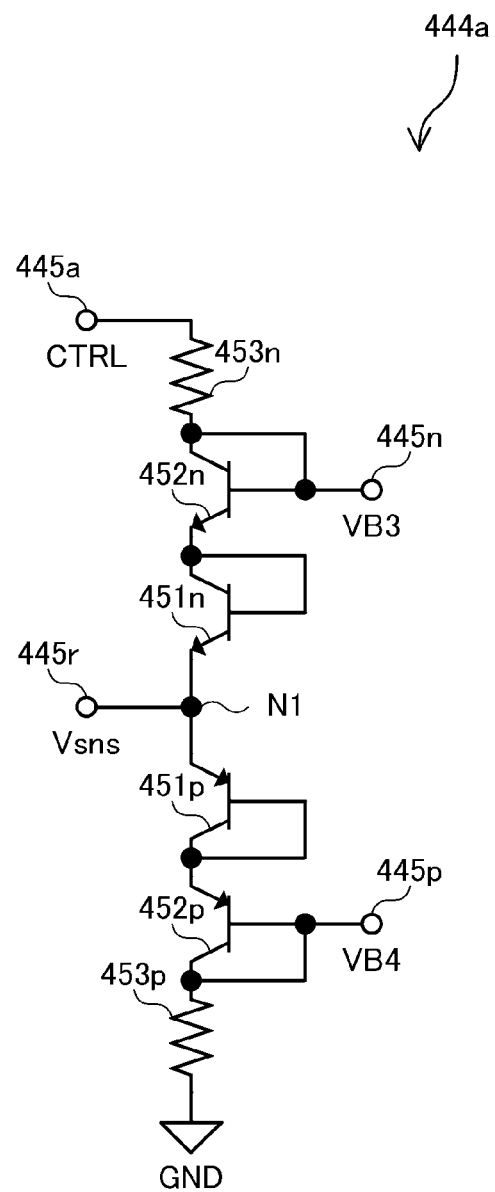
FIG. 44 is a circuit diagram of a first example of a reference circuit 444.

FIG. 44 is a circuit diagram of the first example of the reference circuit 444. As illustrated in FIG. 44, in the first example of the reference circuit 444 (which may be hereinafter referred to as a reference circuit 444a), as compared with the reference circuit 443a illustrated in FIG. 37, the shunt terminal 445r is further connected.

The difference from the reference circuit 443a will be described hereinafter. The reference circuit 444a includes an intermediate node N1 between the emitter of the transistor 451n and the emitter of the transistor 451p. For example, a current is supplied to the control terminal 445a as the control signal CTRL. The shunt terminal 445r is connected to the intermediate node N1.

In the reference circuit 444a, a current is adjusted as the control signal CTRL to adjust a current flowing from the resistance element 453n to the ground through the intermediate node N1. That is, the third bias voltage VB3 and the fourth bias voltage VB4 can be adjusted by using the current of the control signal CTRL.

The potential of the shunt terminal 445r relative to the ground, or the reference voltage Vsns, is substantially the same as the potential of the Bout terminal 425 relative to the ground because the transistors 451n and 451p have substantially the same characteristics as the first bias transistor 421n and the second bias transistor 421p, respectively, and the transistors 452n and 452p have substantially the same characteristics as the third bias transistor 423n and the fourth bias transistor 423p, respectively.

As illustrated in FIG. 43 and FIG. 44, as described above, the seventh transistor 521 in the replica circuit 511 has substantially the same temperature as the amplifier transistor 501. For example, as the temperature of the seventh transistor 521 increases, the amount of the base current of the seventh transistor 521 increases, that is, the amount of the shunt current increases.

As the amount of the shunt current increases, the amount of current flowing from the intermediate node N1 to the ground through the transistor 451p, the transistor 452p, and the resistance element 453p decreases. Accordingly, the voltage between the first end and the second end of the resistance element 453p becomes low. As a result, the fourth bias voltage VB4 becomes low. Further, in addition to the fourth bias voltage VB4 becoming low, the base-emitter voltage Vbe of the transistor 452p and the base-emitter voltage Vbe of the transistor 451p become low. As a result, the third bias voltage VB3 also becomes low.

As the third bias voltage VB3 and the fourth bias voltage VB4 become low, the bias voltage to be supplied from the base bias circuit 406 to the amplifier transistor 501 becomes low. As a result, the amount of current flowing between the collector and the emitter of the amplifier transistor 501 can be decreased. Accordingly, the increase in the temperature of the amplifier transistor 501 can be suppressed. That is, the thermal runaway of the amplifier transistor 501 can be suppressed.

In contrast, as the temperature of the seventh transistor 521 decreases, the amount of the base current of the seventh transistor 521 decreases. That is, the amount of the shunt current decreases.

As the amount of the shunt current decreases, the amount of current flowing from the intermediate node N1 to the ground through the transistor 451*p*, the transistor 452*p*, and the resistance element 453*p* increases. Accordingly, the voltage between the first end and the second end of the resistance element 453*p* becomes high. As a result, the fourth bias voltage VB4 becomes high. Further, in addition to the fourth bias voltage VB4 becoming high, the base-emitter voltage Vbe of the transistor 452*p* and the base-emitter voltage Vbe of the transistor 451*p* become high. As a result, the third bias voltage VB3 also becomes high.

As the third bias voltage VB3 and the fourth bias voltage VB4 become high, the bias voltage to be supplied from the base bias circuit 406 to the amplifier transistor 501 becomes high. As a result, the amount of current flowing between the collector and the emitter of the amplifier transistor 501 can be increased. Thus, the decrease in the temperature of the amplifier transistor 501 can be suppressed.

That is, with a configuration in which the temperature change of the seventh transistor 521 is substantially the same as the temperature change of the amplifier transistor 501 and the change in current based on the temperature change of the seventh transistor 521 is fed back to the reference circuit 444*a*, a bias for reducing the temperature change of the amplifier transistor 501 can be supplied to the amplifier transistor 501.

A second example of the reference circuit 444 according to the seventh embodiment will be described.

Figure 45:
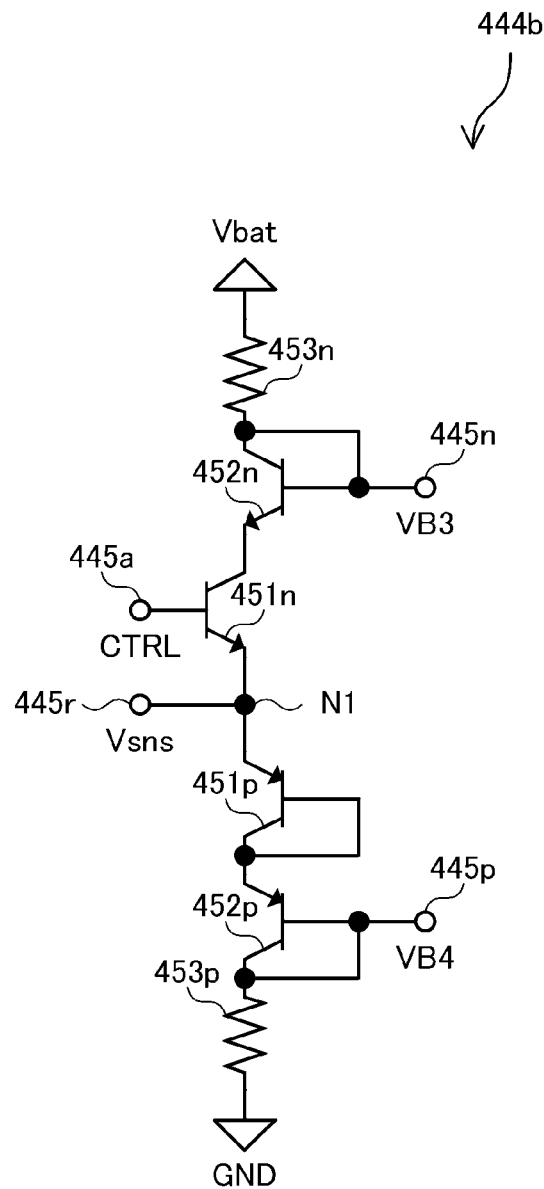
FIG. 45 is a circuit diagram of a second example of the reference circuit 444.

FIG. 45 is a circuit diagram of the second example of the reference circuit 444. As illustrated in FIG. 45, in the second example of the reference circuit 444 (which may be hereinafter referred to as a reference circuit 444*b*), as compared with the reference circuit 443*b* illustrated in FIG. 38, the shunt terminal 445*r* is further connected.

The difference from the reference circuit 443*b* will be described hereinafter. The reference circuit 444*b* includes an intermediate node N1 between the emitter of the transistor 451*n* and the emitter of the transistor 451*p*. For example, a current is supplied to the control terminal 445*a* as the control signal CTRL. The shunt terminal 445*r* is connected to the intermediate node N1.

In the reference circuit 444*b*, a current is adjusted as the control signal CTRL to adjust a current flowing from the resistance element 453*n* to the ground through the intermediate node N1. That is, the third bias voltage VB3 and the fourth bias voltage VB4 can be adjusted by using the current of the control signal CTRL.

Further, the changes in the third bias voltage VB3 and the fourth bias voltage VB4 in response to the shunt current are similar to the changes in the third bias voltage VB3 and the fourth bias voltage VB4 in the reference circuit 444*a* (see FIG. 44) in response to the shunt current.

A third example of the reference circuit 444 according to the seventh embodiment will be described.

Figure 46:
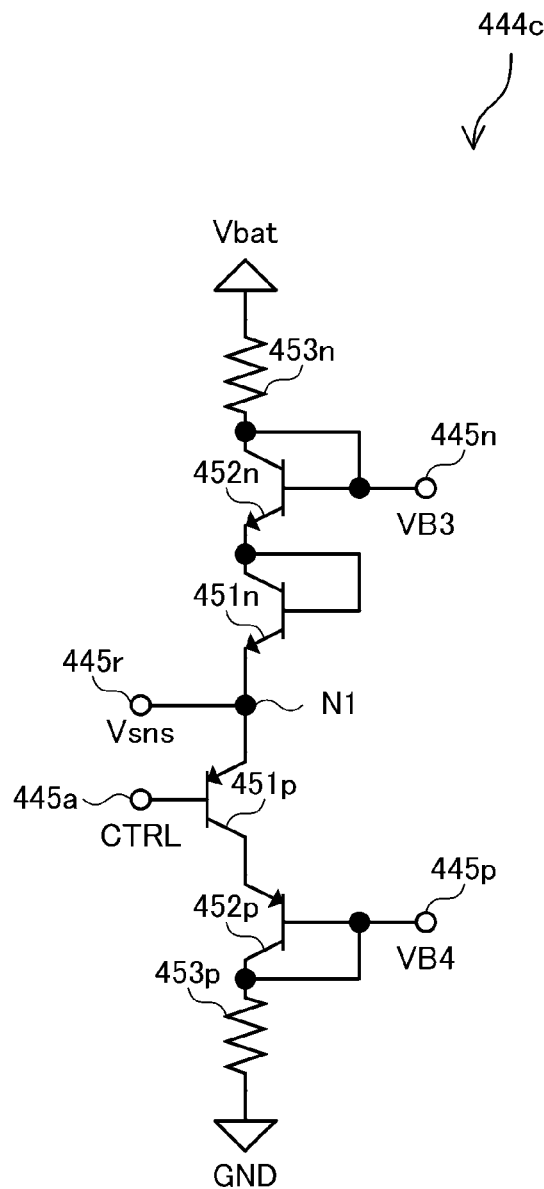
FIG. 46 is a circuit diagram of a third example of the reference circuit 444.

FIG. 46 is a circuit diagram of the third example of the reference circuit 444. As illustrated in FIG. 46, in the third example of the reference circuit 444 (which may be hereinafter referred to as a reference circuit 444*c*), as compared with the reference circuit 443*c* illustrated in FIG. 39, the shunt terminal 445*r* is further connected.

The difference from the reference circuit 443*c* will be described hereinafter. The reference circuit 444*c* includes an intermediate node N1 between the emitter of the transistor 451*n* and the emitter of the transistor 451*p*. For example, a current is supplied to the control terminal 445*a* as the control signal CTRL. The shunt terminal 445*r* is connected to the intermediate node N1.

In the reference circuit 444*c*, a current is adjusted as the control signal CTRL to adjust a current flowing from the resistance element 453*n* to the ground through the intermediate node N1. That is, the third bias voltage VB3 and the fourth bias voltage VB4 can be adjusted by using the current of the control signal CTRL.

Further, the changes in the third bias voltage VB3 and the fourth bias voltage VB4 in response to the shunt current are similar to the changes in the third bias voltage VB3 and the fourth bias voltage VB4 in the reference circuit 444*a* (see FIG. 44) in response to the shunt current.

A fourth example of the reference circuit 444 according to the seventh embodiment will be described.

Figure 47:
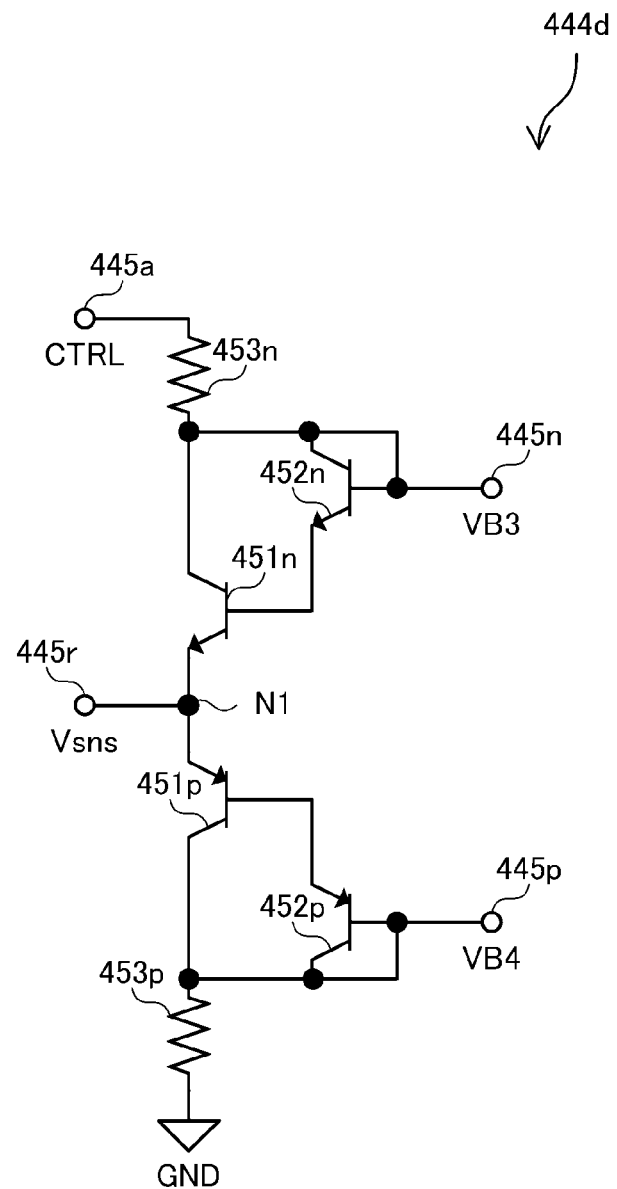
FIG. 47 is a circuit diagram of a fourth example of the reference circuit 444.

FIG. 47 is a circuit diagram of the fourth example of the reference circuit 444. As illustrated in FIG. 47, in the fourth example of the reference circuit 444 (which may be hereinafter referred to as a reference circuit 444*d*), as compared with the reference circuit 443*d* illustrated in FIG. 40, the shunt terminal 445*r* is further connected.

The difference from the reference circuit 443*d* will be described hereinafter. The reference circuit 444*d* includes an intermediate node N1 between the emitter of the transistor 451*n* and the emitter of the transistor 451*p*. For example, a current is supplied to the control terminal 445*a* as the control signal CTRL. The shunt terminal 445*r* is connected to the intermediate node N1.

In the reference circuit 444*d*, a current is adjusted as the control signal CTRL to adjust a current flowing from the resistance element 453*n* to the ground through the intermediate node N1. That is, the third bias voltage VB3 and the fourth bias voltage VB4 can be adjusted by using the current of the control signal CTRL.

As the amount of the shunt current increases, the amount of current flowing from the intermediate node N1 to the ground through the resistance element 453*p* decreases. Accordingly, the voltage between the first end and the second end of the resistance element 453*p* becomes low. As a result, the fourth bias voltage VB4 becomes low. Further, in addition to the fourth bias voltage VB4 becoming low, the base-emitter voltage Vbe of the transistor 452*p* and the base-emitter voltage Vbe of the transistor 451*p* become low. As a result, the third bias voltage VB3 also becomes low.

Conversely, as the amount of the shunt current decreases, the amount of current flowing from the intermediate node N1 to the ground through the resistance element 453*p* increases. Accordingly, the voltage between the first end and the second end of the resistance element 453*p* becomes high. As a result, the fourth bias voltage VB4 becomes high. Further, in addition to the fourth bias voltage VB4 becoming high, the base-emitter voltage Vbe of the transistor 452*p* and the base-emitter voltage Vbe of the transistor 451*p* become high. As a result, the third bias voltage VB3 also becomes high.

A fifth example of the reference circuit 444 according to the seventh embodiment will be described.

Figure 48:
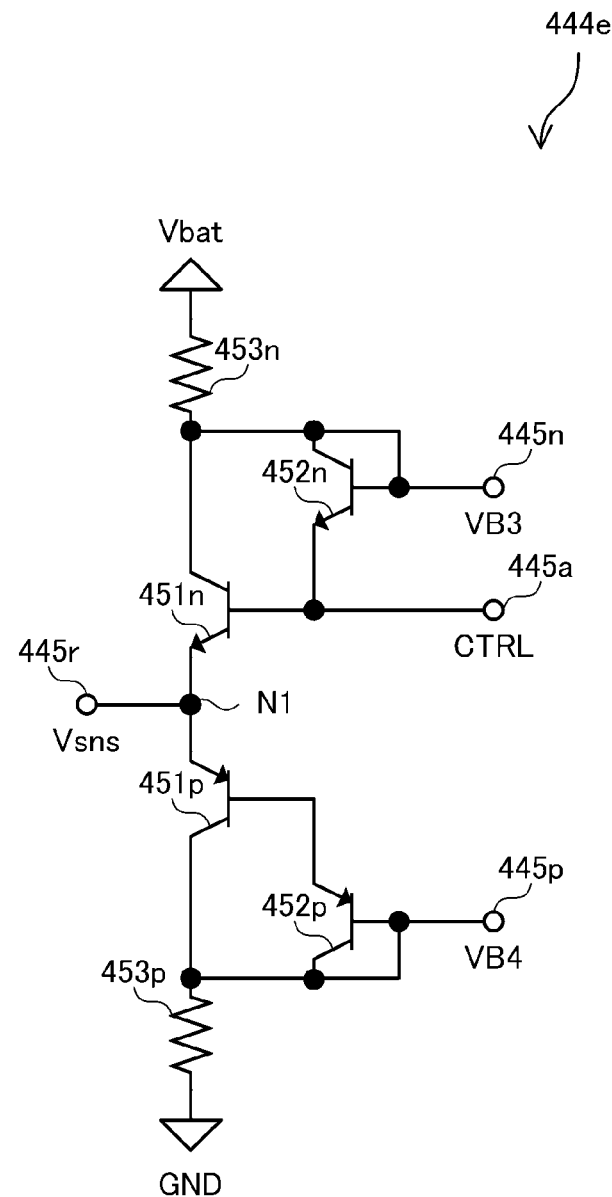
FIG. 48 is a circuit diagram of a fifth example of the reference circuit 444.

FIG. 48 is a circuit diagram of the fifth example of the reference circuit 444. As illustrated in FIG. 48, in the fifth example of the reference circuit 444 (which may be hereinafter referred to as a reference circuit 444*e*), as compared with the reference circuit 443e illustrated in FIG. 41, the shunt terminal 445r is further connected.

The difference from the reference circuit 443e will be described hereinafter. The reference circuit 444e includes an intermediate node N1 between the emitter of the transistor 451n and the emitter of the transistor 451p. For example, a current is supplied to the control terminal 445a as the control signal CTRL. The shunt terminal 445r is connected to the intermediate node N1.

In the reference circuit 444e, a current is adjusted as the control signal CTRL to adjust a current flowing from the resistance element 453n to the ground through the intermediate node N1. That is, the third bias voltage VB3 and the fourth bias voltage VB4 can be adjusted by using the current of the control signal CTRL.

Further, the changes in the third bias voltage VB3 and the fourth bias voltage VB4 in response to the shunt current are similar to the changes in the third bias voltage VB3 and the fourth bias voltage VB4 in response to the shunt current in the reference circuit 444d (see FIG. 47).

A sixth example of the reference circuit 444 according to the seventh embodiment will be described.

Figure 49:
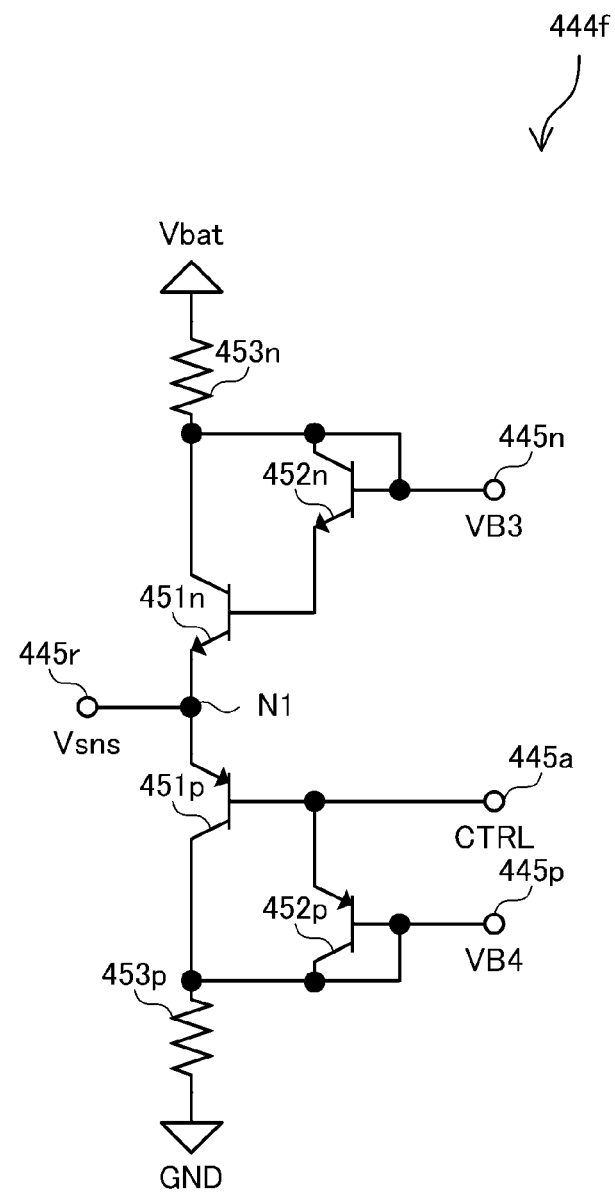
FIG. 49 is a circuit diagram of a sixth example of the reference circuit 444.

FIG. 49 is a circuit diagram of the sixth example of the reference circuit 444. As illustrated in FIG. 49, in the sixth example of the reference circuit 444 (which may be hereinafter referred to as a reference circuit 444f), as compared with the reference circuit 443f illustrated in FIG. 42, the shunt terminal 445r is further connected.

The difference from the reference circuit 443f will be described hereinafter. The reference circuit 444f includes an intermediate node N1 between the emitter of the transistor 451n and the emitter of the transistor 451p. For example, a current is supplied to the control terminal 445a as the control signal CTRL. The shunt terminal 445r is connected to the intermediate node N1.

In the reference circuit 444f, a current is adjusted as the control signal CTRL to adjust a current flowing from the resistance element 453n to the ground through the intermediate node N1. That is, the third bias voltage VB3 and the fourth bias voltage VB4 can be adjusted by using the current of the control signal CTRL.

Further, the changes in the third bias voltage VB3 and the fourth bias voltage VB4 in response to the shunt current are similar to the changes in the third bias voltage VB3 and the fourth bias voltage VB4 in response to the shunt current in the reference circuit 444d (see FIG. 47).

A seventh example of the reference circuit 444 according to the seventh embodiment will be described.

Figure 50:
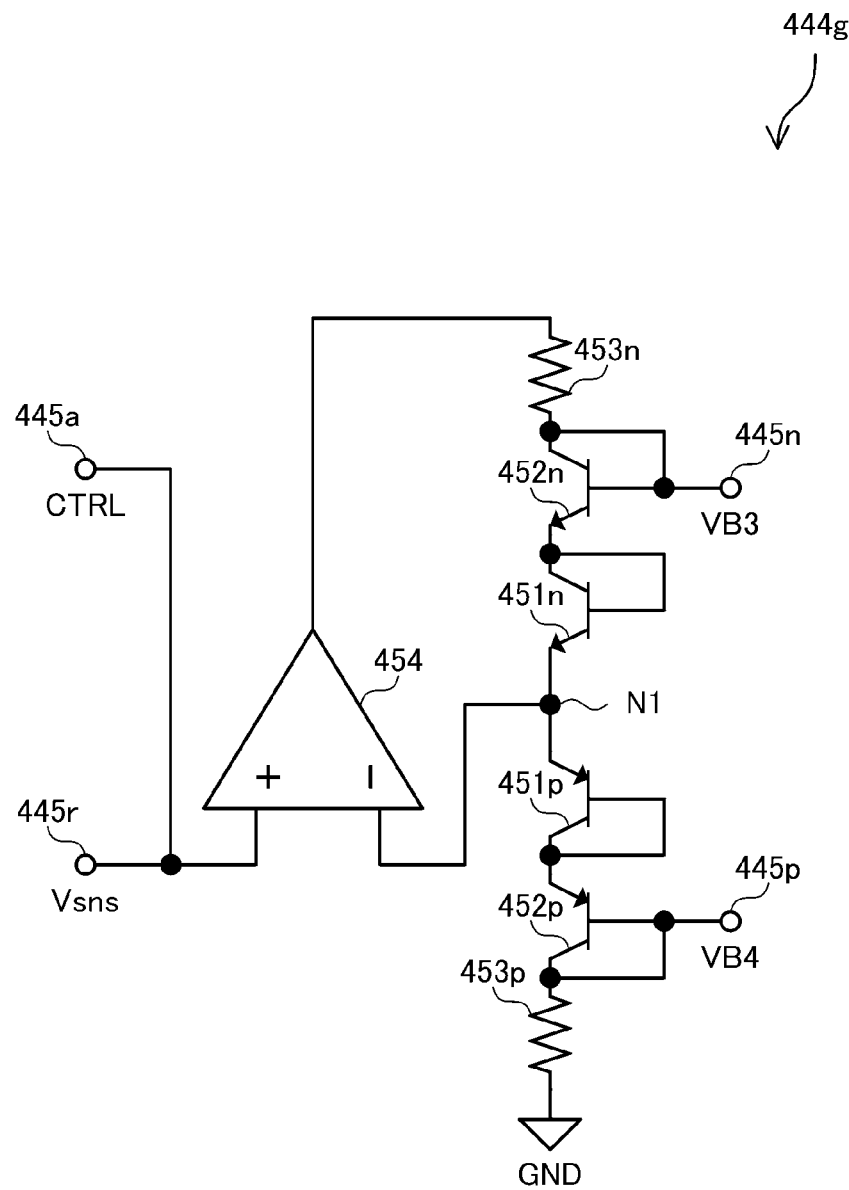
FIG. 50 is a circuit diagram of a seventh example of the reference circuit 444.

FIG. 50 is a circuit diagram of the seventh example of the reference circuit 444. As illustrated in FIG. 50, the seventh example of the reference circuit 444 (which may be hereinafter referred to as a reference circuit 444g) further includes an operational amplifier 454, as compared with the reference circuit 444a illustrated in FIG. 44.

The difference from the reference circuit 444a will be described hereinafter. The operational amplifier 454 has a non-inverting input terminal connected to the control terminal 445a and the shunt terminal 445r, an inverting input terminal connected to the intermediate node N1, and an output terminal connected to the first end of the resistance element 453n.

Due to the negative feedback of the operational amplifier 454, the voltage across the intermediate node N1 is the same voltage as the reference voltage Vsns of the shunt terminal 445r. Thus, the third bias voltage VB3 is a voltage obtained by adding the base-emitter voltage Vbe of the transistor 451n and the base-emitter voltage Vbe of the transistor 452n to the voltage across the intermediate node N1. The fourth bias voltage VB4 is a voltage obtained by subtracting the base-emitter voltage Vbe of the transistor 451p and the base-emitter voltage Vbe of the transistor 452p from the voltage across the intermediate node N1. For example, a current is supplied to the control terminal 445a as the control signal CTRL.

Accordingly, for example, as the temperature of the amplifier transistor 501 increases and the base-emitter voltage Vbe of the seventh transistor 521 thermally coupled to the amplifier transistor 501 becomes low, the reference voltage Vsns becomes low because the control terminal 445a can be regarded as a constant current source. As a result, the third bias voltage VB3 and the fourth bias voltage VB4 can be made low. Conversely, as the temperature of the amplifier transistor 501 decreases and the base-emitter voltage Vbe of the seventh transistor 521 thermally coupled to the amplifier transistor 501 becomes high, the reference voltage Vsns becomes high because the control terminal 445a can be regarded as a constant current source. As a result, the third bias voltage VB3 and the fourth bias voltage VB4 can be made high.

An eighth example of the reference circuit 444 according to the seventh embodiment will be described.

Figure 51:
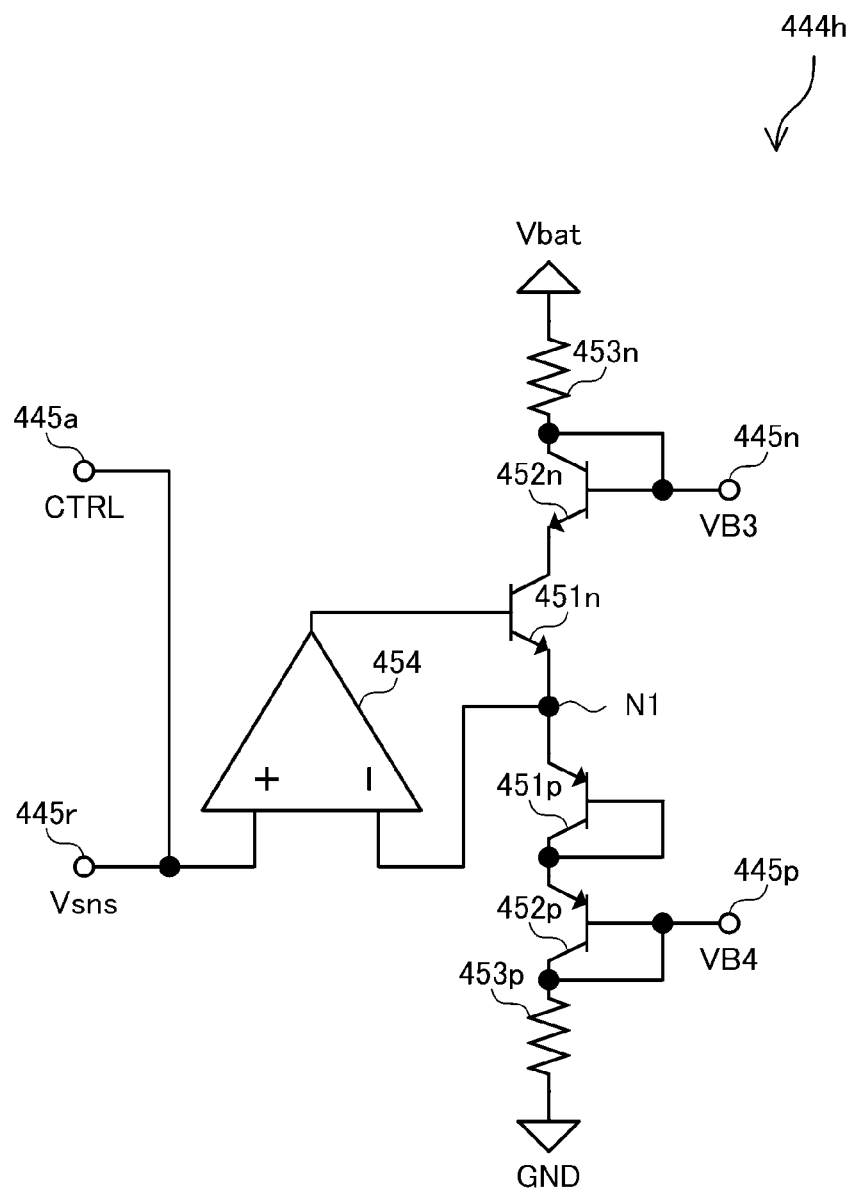
FIG. 51 is a circuit diagram of an eighth example of the reference circuit 444.

FIG. 51 is a circuit diagram of the eighth example of the reference circuit 444. As illustrated in FIG. 51, the eighth example of the reference circuit 444 (which may be hereinafter referred to as a reference circuit 444h) further includes an operational amplifier 454, as compared with the reference circuit 444b illustrated in FIG. 45.

The difference from the reference circuit 444b will be described hereinafter. The operational amplifier 454 has a non-inverting input terminal connected to the control terminal 445a and the shunt terminal 445r, an inverting input terminal connected to the intermediate node N1, and an output terminal connected to the base of the transistor 451n.

Due to the negative feedback of the operational amplifier 454, the voltage across the intermediate node N1 is the same voltage as the reference voltage Vsns of the shunt terminal 445r. The changes in the third bias voltage VB3 and the fourth bias voltage VB4 in response to a change in the reference voltage Vsns are similar to the changes in the third bias voltage VB3 and the fourth bias voltage VB4 in response to a change in the reference voltage Vsns in the reference circuit 444g (see FIG. 50).

A ninth example of the reference circuit 444 according to the seventh embodiment will be described.

Figure 52:
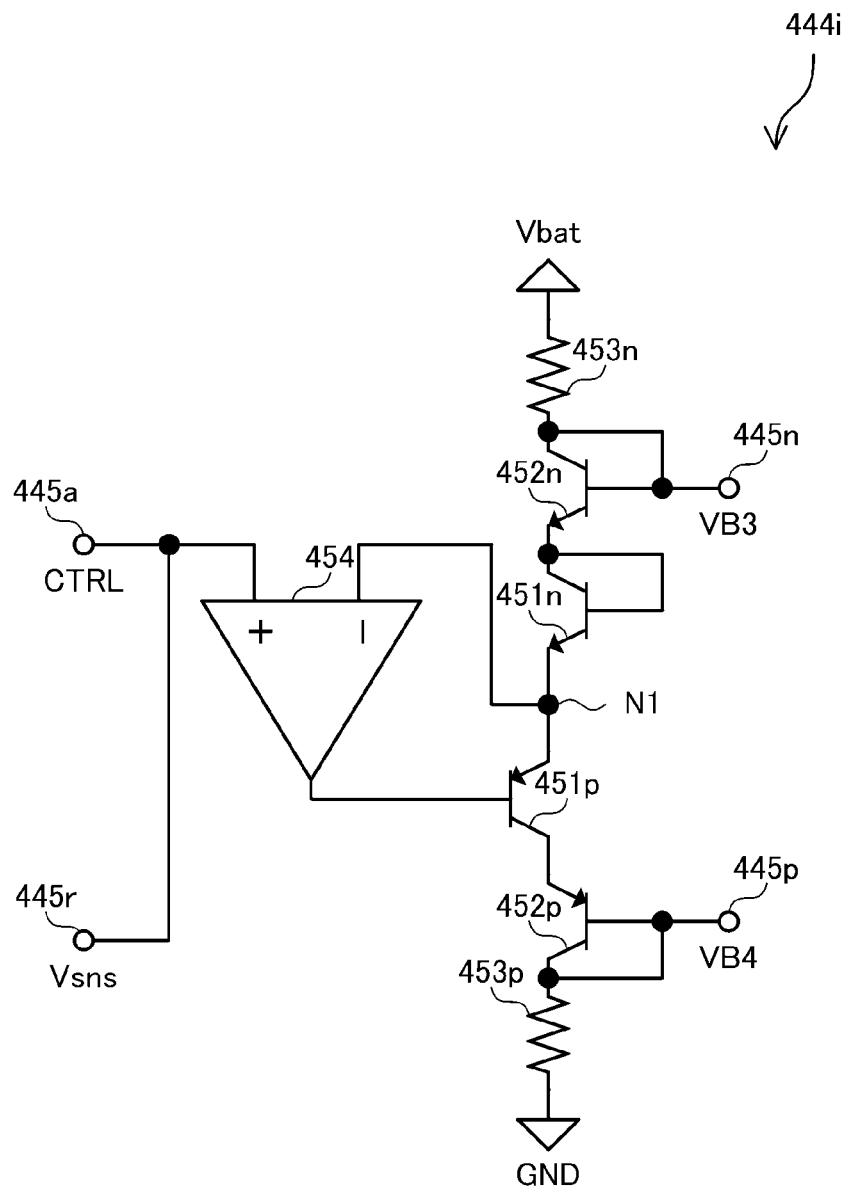
FIG. 52 is a circuit diagram of a ninth example of the reference circuit 444.

FIG. 52 is a circuit diagram of the ninth example of the reference circuit 444. As illustrated in FIG. 52, the ninth example of the reference circuit 444 (which may be hereinafter referred to as a reference circuit 444i) further includes an operational amplifier 454, as compared with the reference circuit 444c illustrated in FIG. 46.

The difference from the reference circuit 444c will be described hereinafter. The operational amplifier 454 has a non-inverting input terminal connected to the control terminal 445a and the shunt terminal 445r, an inverting input terminal connected to the intermediate node N1, and an output terminal connected to the base of the transistor 451p.

Due to the negative feedback of the operational amplifier 454, the voltage across the intermediate node N1 is the same voltage as the reference voltage Vsns of the shunt terminal 445r. The changes in the third bias voltage VB3 and the fourth bias voltage VB4 in response to a change in the reference voltage Vsns are similar to the changes in the third bias voltage VB3 and the fourth bias voltage VB4 in response to a change in the reference voltage Vsns in the reference circuit 444*g* (see FIG. 50).

A tenth example of the reference circuit 444 according to the seventh embodiment will be described.

Figure 53:
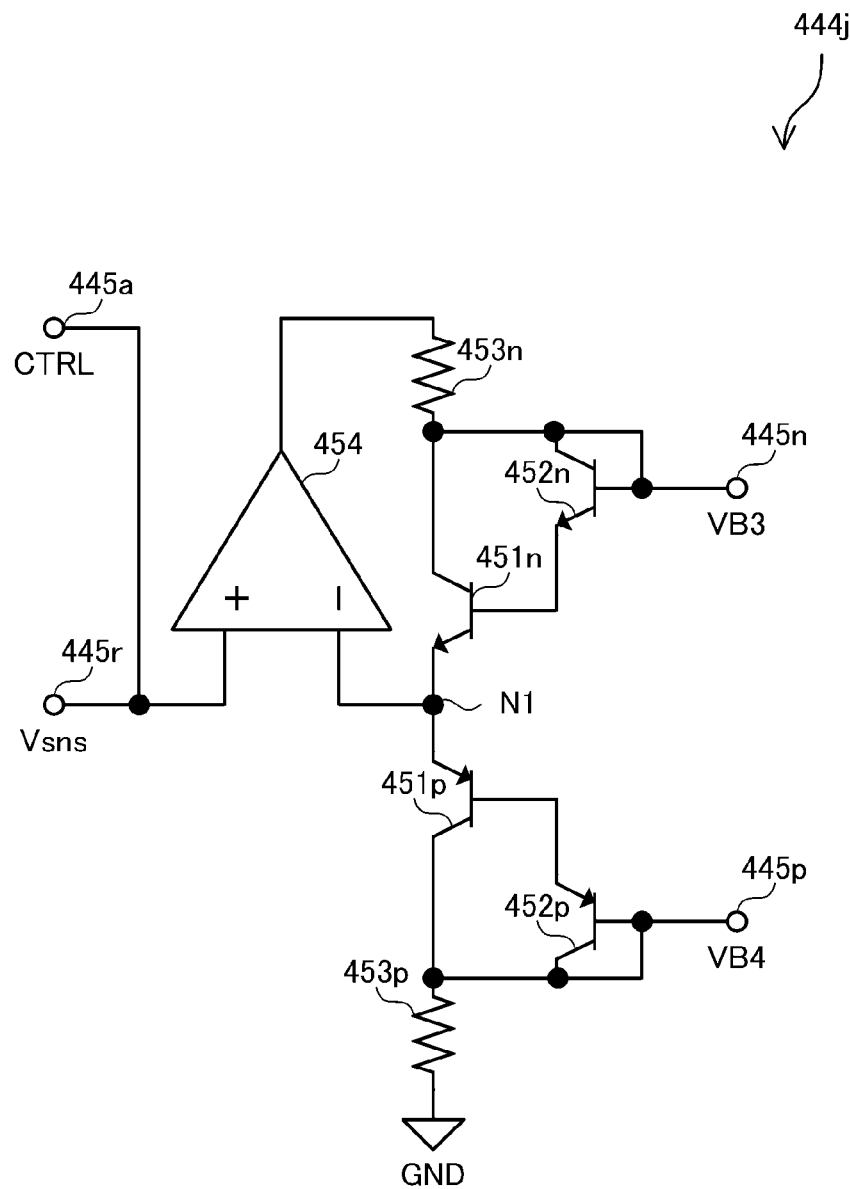
FIG. 53 is a circuit diagram of a tenth example of the reference circuit 444.

FIG. 53 is a circuit diagram of the tenth example of the reference circuit 444. As illustrated in FIG. 53, the tenth example of the reference circuit 444 (which may be hereinafter referred to as a reference circuit 444*j*) further includes an operational amplifier 454, as compared with the reference circuit 444*d* illustrated in FIG. 47.

The difference from the reference circuit 444*d* will be described hereinafter. The operational amplifier 454 has a non-inverting input terminal connected to the control terminal 445*a* and the shunt terminal 445*r*, an inverting input terminal connected to the intermediate node N1, and an output terminal connected to the first end of the resistance element 453*n*.

Due to the negative feedback of the operational amplifier 454, the voltage across the intermediate node N1 is the same voltage as the reference voltage Vsns of the shunt terminal 445*r*. The changes in the third bias voltage VB3 and the fourth bias voltage VB4 in response to a change in the reference voltage Vsns are similar to the changes in the third bias voltage VB3 and the fourth bias voltage VB4 in response to a change in the reference voltage Vsns in the reference circuit 444*g* (see FIG. 50).

An eleventh example of the reference circuit 444 according to the seventh embodiment will be described.

Figure 54:
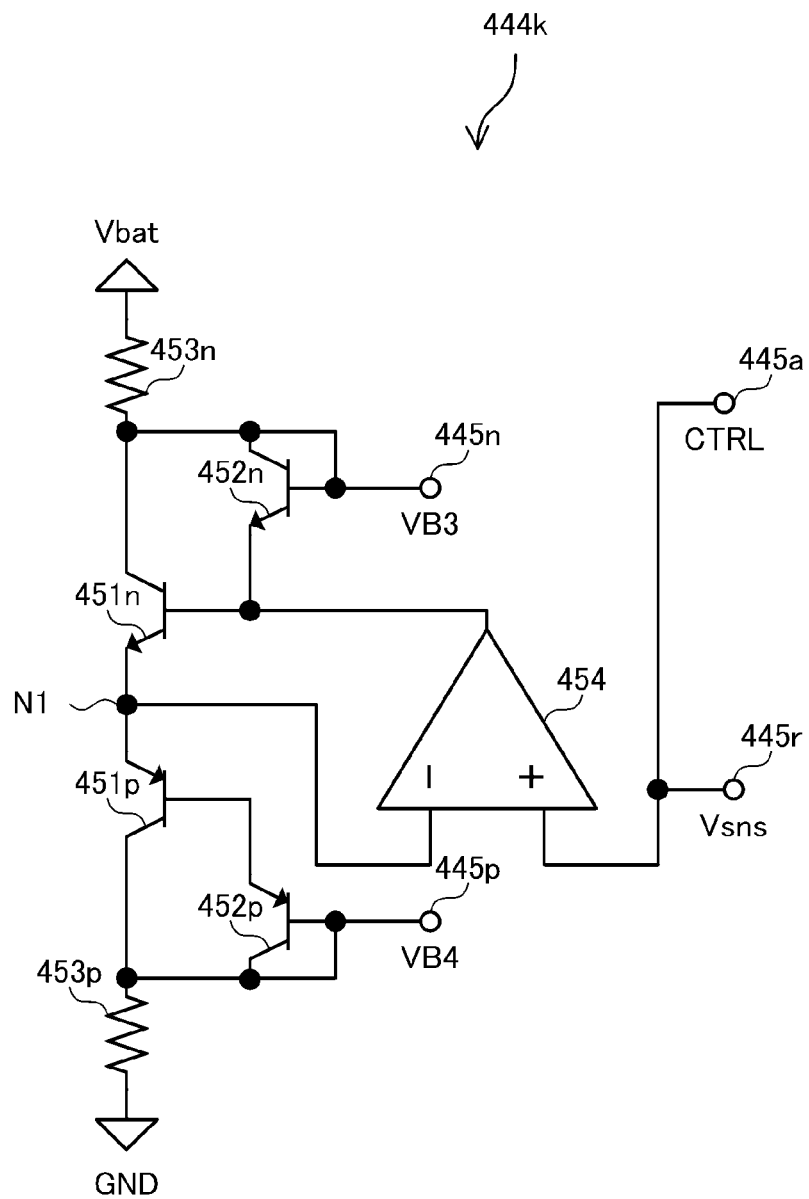
FIG. 54 is a circuit diagram of an eleventh example of the reference circuit 444.

FIG. 54 is a circuit diagram of the eleventh example of the reference circuit 444. As illustrated in FIG. 54, the eleventh example of the reference circuit 444 (which may be hereinafter referred to as a reference circuit 444*k*) further includes an operational amplifier 454, as compared with the reference circuit 444*e* illustrated in FIG. 48.

The difference from the reference circuit 444*e* will be described hereinafter. The operational amplifier 454 has a non-inverting input terminal connected to the control terminal 445*a* and the shunt terminal 445*r*, an inverting input terminal connected to the intermediate node N1, and an output terminal connected to the base of the transistor 451*n*.

Due to the negative feedback of the operational amplifier 454, the voltage across the intermediate node N1 is the same voltage as the reference voltage Vsns of the shunt terminal 445*r*. The changes in the third bias voltage VB3 and the fourth bias voltage VB4 in response to a change in the reference voltage Vsns are similar to the changes in the third bias voltage VB3 and the fourth bias voltage VB4 in response to a change in the reference voltage Vsns in the reference circuit 444*g* (see FIG. 50).

A twelfth example of the reference circuit 444 according to the seventh embodiment will be described.

Figure 55:
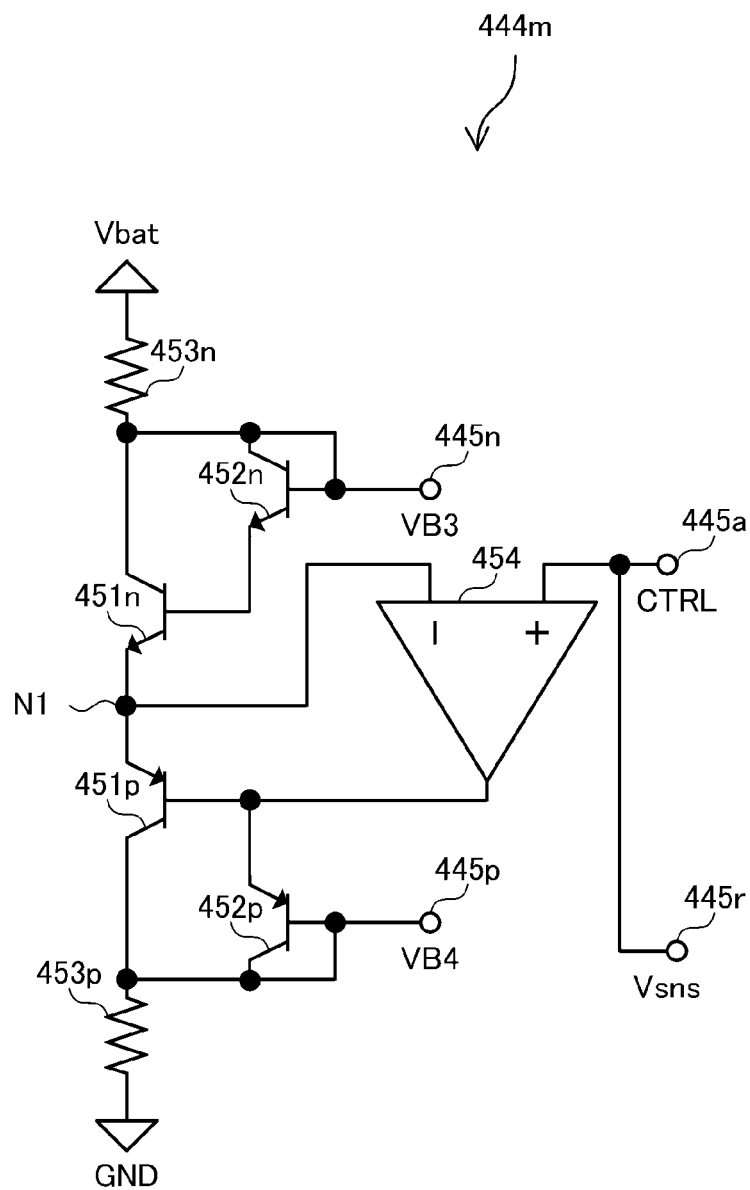
FIG. 55 is a circuit diagram of a twelfth example of the reference circuit 444.

FIG. 55 is a circuit diagram of the twelfth example of the reference circuit 444. As illustrated in FIG. 55, the twelfth example of the reference circuit 444 (which may be hereinafter referred to as a reference circuit 444*m*) further includes an operational amplifier 454, as compared with the reference circuit 444*f* illustrated in FIG. 49.

The difference from the reference circuit 444*f* will be described hereinafter. The operational amplifier 454 has a non-inverting input terminal connected to the control terminal 445*a* and the shunt terminal 445*r*, an inverting input terminal connected to the intermediate node N1, and an output terminal connected to the base of the transistor 451*p*.

Due to the negative feedback of the operational amplifier 454, the voltage across the intermediate node N1 is the same voltage as the reference voltage Vsns of the shunt terminal 445*r*. The changes in the third bias voltage VB3 and the fourth bias voltage VB4 in response to a change in the reference voltage Vsns are similar to the changes in the third bias voltage VB3 and the fourth bias voltage VB4 in response to a change in the reference voltage Vsns in the reference circuit 444*g* (see FIG. 50).

In the first to seventh embodiments, the base bias circuits 401 to 406 include the first application circuit 431*n* and the second application circuit 431*p*. However, it is not limited to this configuration. It is not necessary for the base bias circuits 401 to 406 to include the first application circuit 431*n* or the second application circuit 431*p*. Specifically, if the turn-on voltage of the amplifier transistor 501 is substantially the same as the turn-on voltages of the first bias transistor 421*n* and the second bias transistor 421*p*, the first bias transistor 421*n* and the second bias transistor 421*p* can supply a bias to the amplifier transistor 501 without the first application circuit 431*n* and the second application circuit 431*p*.

While the power amplifier device 11 includes the module substrate 310, it is not limited to this configuration. It is not necessary for the power amplifier device 11 to include the module substrate 310.

Exemplary embodiments of the present disclosure have been described. The power amplifier circuits 61 to 66 include the amplifier transistor 501, the resistance element 502, the first bias transistor 421*n*, and the second bias transistor 421*p*. The amplifier transistor 501 has a base to which the input signal RFin is to be supplied, and is configured to amplify the input signal RFin and output the amplified signal. The resistance element 502 has a first end, and a second end electrically connected to the base of the amplifier transistor 501. The first bias transistor 421*n* has a collector to which the first voltage V1 is to be applied, a base to which the first bias voltage VB1 is to be applied, and an emitter electrically connected to the first end of the resistance element 502 and configured to supply a bias current to the base of the amplifier transistor 501 through the resistance element 502. The second bias transistor 421*p* has an emitter electrically connected to the emitter of the first bias transistor 421*n* and the first end of the resistance element 502, a base to which the second bias voltage VB2 is to be applied, and a collector to which the second voltage V2 lower than the first voltage V1 is to be applied.

With this configuration, in the AC component included in the base bias current Ieef flowing from the Bout terminal 425 disposed between the emitter of the first bias transistor 421*n* and the emitter of the second bias transistor 421*p* to the resistance element 502, a current having a positive instantaneous value is allowed to flow to the resistance element 502 through the base to the emitter of the first bias transistor 421*n*, and a current having a negative instantaneous value is allowed to flow from the resistance element 502 to the base of the second bias transistor 421*p* through the emitter of the second bias transistor 421*p*. As a result, the base bias circuits 401 to 406 in the power amplifier circuits 61 to 66 can be prevented from being brought into the cut-off state. Thus, even if the AC component included in the base bias current Ieef is changed in amplitude, a change in the time average of the base bias current Ieef can be suppressed. Since a change in the time average of the base bias current Ieef can be suppressed, a change in the operating point of the amplifier transistor 501 can be suppressed. Accordingly, a change in the amplification factor of the amplifier transistor 501 can be suppressed regardless of the magnitude of the amplitude of the RF current in the input signal RFin. Thus, it is possible to suppress a change in the operating point of the amplifier transistor 501 and suppress deterioration in the linearity of a relationship between input and output.

The power amplifier circuits 61 to 63 include the first application circuit 431n and the second application circuit 431p. The first application circuit 431n is disposed between the terminal Tbat and the collector of the first bias transistor 421n and is configured to apply the first voltage V1 lower than the battery voltage Vbat of the terminal Tbat to the collector of the first bias transistor 421n. The second application circuit 431p is disposed between the ground and the collector of the second bias transistor 421p and is configured to apply the second voltage V2 higher than the ground to the collector of the second bias transistor 421p.

With this configuration, the voltage across the emitter of the first bias transistor 421n can be made high by using the first voltage V1 and the second voltage V2, as compared with a configuration that does not include the first application circuit 431n or the second application circuit 431p. As a result, for example, even if the turn-on voltage of the amplifier transistor 501 is higher than the turn-on voltages of the first bias transistor 421n and the second bias transistor 421p, the voltage across the emitter of the first bias transistor 421n can be set to a voltage suitable for the bias of the amplifier transistor 501.

The power amplifier circuits 62 and 63 include the reference circuits 441 and 442, respectively. The reference circuits 441 and 442 include a first diode, a second diode, and the control terminal 445a. The first diode has an anode connected to the base of the first bias transistor 421n, and a cathode. The second diode has an anode connected to the cathode of the first diode, and a cathode connected to the base of the second bias transistor 421p. The control terminal 445a is a terminal for controlling a current flowing from the cathode of the first diode to the anode of the second diode.

Typically, as the temperature of the amplifier transistor 501 increases, the turn-on voltage of the amplifier transistor 501 becomes low. In this situation, continuous supply of a constant bias to the base of the amplifier transistor 501 may cause an increase in the amount of current flowing through the amplifier transistor 501, a further increase in the temperature of the amplifier transistor 501, and a further decrease in the turn-on voltage of the amplifier transistor 501, leading to thermal runaway of the amplifier transistor 501. In the configuration described above, since a current flows through the first diode and the second diode, the first bias voltage VB1 is a voltage obtained by adding the forward voltage of the first diode and the forward voltage of the second diode to the second bias voltage VB2. Since the forward voltage of the first diode and the forward voltage of the second diode become low as the temperatures of the first diode and the second diode increase, the first bias voltage VB1 can be made low at high temperatures and therefore the bias voltage to be applied to the base of the amplifier transistor 501 can be made low. That is, if the temperature of the first diode and the second diode increases due to heat generated by the amplifier transistor 501 or, in a high-temperature environment, due to heat from the environment, the bias voltage to be applied to the base of the amplifier transistor 501 can be made low. Thus, the amplifier transistor 501 is biased at an appropriate operating point, and the thermal runaway of the amplifier transistor 501 can be suppressed.

In the power amplifier circuit 63, the reference circuit 442 includes the shunt terminal 444r connected to the cathode of the first diode and configured to shunt a portion of the current flowing from the cathode of the first diode to the anode of the second diode to the replica circuit 511.

With this configuration, the shunt current shunted from the shunt terminal 445r can be adjusted to change the current flowing through the second diode, and the forward voltage of the second diode can be changed to change the first bias voltage VB1. Thus, the first bias voltage VB1 can be adjusted not only by current control with the control terminal 445a but also by controlling the shunt current shunted from the shunt terminal 445r.

In the power amplifier circuit 63, the reference circuits 442g, 442h, 442i, 442j, 442k, and 442m include the operational amplifier 454 having an inverting input terminal connected to the cathode of the first diode and a non-inverting input terminal connected to the shunt terminal 445r and the control terminal 445a.

With this configuration, the voltage across the cathode of the first diode is the same as the reference voltage Vsns of the shunt terminal 445r due to the negative feedback of the operational amplifier 454. Thus, the reference voltage Vsns can be adjusted to adjust the first bias voltage VB1 and the second bias voltage VB2.

In the reference circuits 441a, 441b, and 441c in the power amplifier circuit 62 and the reference circuits 442a, 442b, 442c, 442g, 442h, and 442i in the power amplifier circuit 63, the first diode is the transistor 451n that is diode connected and that has substantially the same characteristics as the first bias transistor 421n. The second diode is the transistor 451p that is diode connected and that has substantially the same characteristics as the second bias transistor 421p.

With this configuration, the temperature change of the forward voltage of the first diode, or the temperature change of the base-emitter voltage Vbe of the transistor 451n, can be made to match the temperature change of the base-emitter voltage Vbe of the first bias transistor 421n. Further, the temperature change of the forward voltage of the second diode, or the temperature change of the base-emitter voltage Vbe of the transistor 451p, can be made to match the temperature change of the base-emitter voltage Vbe of the second bias transistor 421p. Accordingly, even if the temperature changes, the first bias voltage VB1 can be prevented from deviating from a voltage suitable for the base bias of the first bias transistor 421n.

In the reference circuits 441d, 441e, and 441f in the power amplifier circuit 62 and the reference circuits 442a, 442b, 442c, 442j, 442k, and 442m in the power amplifier circuit 63, the first diode is included in the transistor 451n having substantially the same characteristics as the first bias transistor 421n. The second diode is included in the transistor 451p having substantially the same characteristics as the second bias transistor 421p.

With this configuration, the temperature change of the forward voltage of the first diode, or the temperature change of the base-emitter voltage Vbe of the transistor 451n, can be made to match the temperature change of the base-emitter voltage Vbe of the first bias transistor 421n. Further, the temperature change of the forward voltage of the second diode, or the temperature change of the base-emitter voltage Vbe of the transistor 451p, can be made to match the temperature change of the base-emitter voltage Vbe of the second bias transistor 421p. Accordingly, even if the temperature changes, the first bias voltage VB1 can be prevented from deviating from a voltage suitable for the base bias of the first bias transistor 421n.

Further, the reference circuit 441 in the power amplifier circuit 62 and the reference circuit 442 in the power amplifier circuit 63 include the third application circuit 455. The third application circuit 455 is disposed between the ground and the cathode of the second diode and is configured to apply the second bias voltage VB2 to the cathode of the second diode.

With this configuration, the second bias voltage VB2 suitable for bias can be applied to the base of the second bias transistor 421p.

Further, the power amplifier circuits 64 to 66 include the third bias transistor 423n and the fourth bias transistor 423p. The third bias transistor 423n has a collector to which the battery voltage Vbat of the terminal Tbat is to be applied as the first voltage V1, an emitter connected to the base of the first bias transistor 421n and configured to apply the first bias voltage VB1 to the base of the first bias transistor 421n, and a base to which the third bias voltage VB3 for controlling a current flowing from the collector to the emitter is to be applied. The fourth bias transistor 423p has a collector to which zero volts at the ground is to be applied as the second voltage V2, an emitter connected to the base of the second bias transistor 421p and configured to apply the second bias voltage VB2 to the base of the second bias transistor 421p, and a base to which the fourth bias voltage VB4 for controlling a current flowing from the emitter to the collector is to be applied.

The configuration described above in which the third bias transistor 423n and the first bias transistor 421n are Darlington connected to each other provides a higher current amplification factor than a configuration that includes only the first bias transistor 421n. Likewise, the configuration in which the fourth bias transistor 423p and the second bias transistor 421p are Darlington connected to each other provides a higher current amplification factor than a configuration that includes only the second bias transistor 421p. As a result, the current flowing from the terminal Tbat to the ground through the first bias transistor 421n and the second bias transistor 421p can be large. Thus, the bias current to be supplied to the amplifier transistor 501 can be large.

In addition, the impedance of the terminal Tn seen from the Bout terminal 425 can be set to (1/hfen) as compared with a configuration that does not include Darlington-connected transistors. Likewise, the impedance of the terminal Tp seen from the Bout terminal 425 can be set to (1/hfep) as compared with a configuration that does not include Darlington-connected transistors. As a result, the output impedance of the base bias circuits 404 to 406 can be reduced, and the base bias circuits 404 to 406 can thus be brought close to an ideal bias supply source. In terms of the AC input signal RFin, the terminal Tn and the terminal Tp can be grounded with lower impedances.

In addition, as compared with a configuration that does not include Darlington-connected transistors, the voltage across the emitter of the first bias transistor 421n can be made high by using the base-emitter voltage Vbe of the third bias transistor 423n and the base-emitter voltage Vbe of the fourth bias transistor 423p. As a result, for example, even if the turn-on voltage of the amplifier transistor 501 is higher than the turn-on voltages of the first bias transistor 421n and the second bias transistor 421p, the voltage across the emitter of the first bias transistor 421n can be set to a voltage suitable for the bias of the amplifier transistor 501.

Further, the power amplifier circuits 65 and 66 include the reference circuits 443 and 444, respectively. The reference circuits 443 and 444 include a third diode, a fourth diode, a fifth diode, a sixth diode, and the control terminal 445a. The third diode has an anode connected to the base of the third bias transistor 423n, and a cathode. The fourth diode has an anode connected to the cathode of the third diode, and a cathode. The fifth diode has an anode connected to the cathode of the fourth diode, and a cathode. The sixth diode has an anode connected to the cathode of the fifth diode, and a cathode connected to the base of the fourth bias transistor 423p. The control terminal 445a is a terminal for controlling a current flowing from the cathode of the third diode to the anode of the sixth diode.

In the configuration described above, since a current flows through the third to sixth diodes, the third bias voltage VB3 is a voltage obtained by adding the forward voltage of the third diode, the forward voltage of the fourth diode, the forward voltage of the fifth diode, and the forward voltage of the sixth diode to the fourth bias voltage VB4. Since these forward voltages become low as the temperatures of the third to sixth diodes increase, the third bias voltage VB3 can be made low at high temperatures and therefore the bias voltage to be applied to the base of the amplifier transistor 501 can be made low. That is, if the temperatures of the third to sixth diodes increase due to heat generated by the amplifier transistor 501 or, in a high-temperature environment, due to heat from the environment, the bias voltage to be applied to the base of the amplifier transistor 501 can be made low. Thus, the amplifier transistor 501 is biased at an appropriate operating point, and the thermal runaway of the amplifier transistor 501 can be suppressed.

While the difference between the potential of the base of the Darlington-connected third bias transistor 423n and the potential of the base of the Darlington-connected fourth bias transistor 423p is the sum of the four base-emitter voltages Vbe, the difference between the potential of the anode of the third diode and the potential of the cathode of the sixth diode is the sum of the four forward voltages. As a result, the third bias voltage VB3 and the fourth bias voltage VB4 suitable for bias can be applied to the base of the third bias transistor 423n and the base of the fourth bias transistor 423p, respectively.

In the power amplifier circuit 66, the reference circuit 444 includes the shunt terminal 445r connected to the cathode of the fourth diode and configured to shunt a portion of the current flowing from the cathode of the fourth diode to the anode of the fifth diode to the replica circuit 511.

With this configuration, the shunt current shunted from the shunt terminal 445r can be adjusted to change the current flowing through the fifth diode and the sixth diode, and the forward voltage of the fifth diode and the forward voltage of the sixth diode can be changed to change the third bias voltage VB3. Thus, the third bias voltage VB3 can be adjusted not only by current control with the control terminal 445a but also by controlling the shunt current shunted from the shunt terminal 445r.

In the power amplifier circuit 66, the reference circuits 444g, 444h, 444i, 444j, 444k, and 444m include the operational amplifier 454 having an inverting input terminal connected to the cathode of the fourth diode and a non-inverting input terminal connected to the shunt terminal 445r and the control terminal 445a.

With this configuration, the voltage across the cathode of the fourth diode is the same as the reference voltage Vsns of the shunt terminal 445r due to the negative feedback of the operational amplifier 454. Thus, the reference voltage Vsns can be adjusted to adjust the third bias voltage VB3 and the fourth bias voltage VB4.

In the reference circuit 443a in the power amplifier circuit 65 and the reference circuits 444a and 444g in the power amplifier circuit 66, the third diode is the transistor 452n that is diode connected and that has substantially the same characteristics as the third bias transistor 423n. The fourth diode is the transistor 451n that is diode connected and that has substantially the same characteristics as the first bias transistor 421n. The fifth diode is the transistor 451p that is diode connected and that has substantially the same characteristics as the second bias transistor 421p. The sixth diode is the transistor 452p that is diode connected and that has substantially the same characteristics as the fourth bias transistor 423p.

With this configuration, the temperature change of the sum of the respective forward voltages of the third to sixth diodes, or the sum of the respective base-emitter voltages Vbe of the transistors 452n and 452p and the transistors 451n and 451p, can be made to match the temperature change of the sum of the respective base-emitter voltages Vbe of the first bias transistor 421n, the second bias transistor 421p, the third bias transistor 423n, and the fourth bias transistor 423p. Accordingly, even if the temperature changes, the third bias voltage VB3 can be prevented from deviating from a voltage suitable for the base bias of the third bias transistor 423n.

In the reference circuit 443b in the power amplifier circuit 65 and the reference circuits 444b and 444h in the power amplifier circuit 66, the third diode is the transistor 452n that is diode connected and that has substantially the same characteristics as the third bias transistor 423n. The fourth diode is included in the transistor 451n having substantially the same characteristics as the first bias transistor 421n. The fifth diode is the transistor 451p that is diode connected and that has substantially the same characteristics as the second bias transistor 421p. The sixth diode is the transistor 452p that is diode connected and that has substantially the same characteristics as the fourth bias transistor 423p.

With this configuration, the temperature change of the sum of the respective forward voltages of the third to sixth diodes, or the sum of the respective base-emitter voltages Vbe of the transistors 452n and 452p and the transistors 451n and 451p, can be made to match the temperature change of the sum of the respective base-emitter voltages Vbe of the first bias transistor 421n, the second bias transistor 421p, the third bias transistor 423n, and the fourth bias transistor 423p. Accordingly, even if the temperature changes, the third bias voltage VB3 can be prevented from deviating from a voltage suitable for the base bias of the third bias transistor 423n.

In the reference circuit 443c in the power amplifier circuit 65 and the reference circuits 444c and 444i in the power amplifier circuit 66, the third diode is the transistor 452n that is diode connected and that has substantially the same characteristics as the third bias transistor 423n. The fourth diode is the transistor 451n that is diode connected and that has substantially the same characteristics as the first bias transistor 421n. The fifth diode is included in the transistor 451p having substantially the same characteristics as the second bias transistor 421p. The sixth diode is the transistor 452p that is diode connected and that has substantially the same characteristics as the fourth bias transistor 423p.

With this configuration, the temperature change of the sum of the respective forward voltages of the third to sixth diodes, or the sum of the respective base-emitter voltages Vbe of the transistors 452n and 452p and the transistors 451n and 451p, can be made to match the temperature change of the sum of the respective base-emitter voltages Vbe of the first bias transistor 421n, the second bias transistor 421p, the third bias transistor 423n, and the fourth bias transistor 423p. Accordingly, even if the temperature changes, the third bias voltage VB3 can be prevented from deviating from a voltage suitable for the base bias of the third bias transistor 423n.

In the reference circuits 443d, 443e, and 443f in the power amplifier circuit 65 and the reference circuits 444d, 444e, 444f, 444j, 444k, and 444m in the power amplifier circuit 66, the third diode is the transistor 452n that is diode connected and that has substantially the same characteristics as the third bias transistor 423n. The fourth diode is included in the transistor 451n having substantially the same characteristics as the first bias transistor 421n. The fifth diode is included in the transistor 451p having substantially the same characteristics as the second bias transistor 421p. The sixth diode is the transistor 452p that is diode connected and that has substantially the same characteristics as the fourth bias transistor 423p.

With this configuration, the temperature change of the sum of the respective forward voltages of the third to sixth diodes, or the sum of the respective base-emitter voltages Vbe of the transistors 452n and 452p and the transistors 451n and 451p, can be made to match the temperature change of the sum of the respective base-emitter voltages Vbe of the first bias transistor 421n, the second bias transistor 421p, the third bias transistor 423n, and the fourth bias transistor 423p. Accordingly, even if the temperature changes, the third bias voltage VB3 can be prevented from deviating from a voltage suitable for the base bias of the third bias transistor 423n.

In the power amplifier circuits 63 and 66, the replica circuit 511 includes a seventh diode. The seventh diode is thermally coupled to the amplifier transistor 501, and has an anode connected to the shunt terminal 445r of the reference circuit 442 or 444, and a cathode that is grounded.

With this configuration, the temperature of the seventh diode can be substantially the same temperature as the temperature of the amplifier transistor 501. In the seventh diode, a forward voltage corresponding to the temperature is generated, and a forward current corresponding to the temperature flows. Thus, in the reference circuit 442, the first bias voltage VB1 and the second bias voltage VB2 can be adjusted in accordance with the forward voltage or forward current of the seventh diode. In the reference circuit 444, the third bias voltage VB3 and the fourth bias voltage VB4 can be adjusted in accordance with the forward voltage or forward current of the seventh diode. That is, the forward voltage or forward current of the seventh diode corresponding to the temperature of the amplifier transistor 501 can be fed back to the base bias of the amplifier transistor 501.

In the power amplifier circuits 63 and 66, the seventh diode is the seventh transistor 521 that is diode connected and that has substantially the same characteristics as the amplifier transistor 501.

With this configuration, the temperature change of the forward voltage of the seventh diode, or the temperature change of the base-emitter voltage Vbe of the seventh transistor 521, which is close to the temperature change of the base-emitter voltage Vbe of the amplifier transistor 501, can be achieved. Further, the temperature change of the forward current of the seventh diode, or the temperature change of the base current of the seventh transistor 521, which is close to the temperature change of the base current of the amplifier transistor 501, can be achieved. As a result, the base bias of the amplifier transistor 501 can be accurately adjusted.

In the power amplifier circuits 63 and 66, the seventh diode is included in the seventh transistor 521 having substantially the same characteristics as the amplifier transistor 501.

With this configuration, for example, the seventh transistor 521 is caused to perform an amplification operation similar to that of the amplifier transistor 501, whereby the temperature change of the forward voltage of the seventh diode, or the temperature change of the base-emitter voltage Vbe of the seventh transistor 521, which is closer to the temperature change of the base-emitter voltage Vbe of the amplifier transistor 501, can be achieved. Further, the temperature change of the forward current of the seventh diode, or the temperature change of the base current of the seventh transistor 521, which is closer to the temperature change of the base current of the amplifier transistor 501, can be achieved. As a result, the base bias of the amplifier transistor 501 can be more accurately adjusted.

In the power amplifier circuits 61 to 66, each of the first bias transistor 421n and the second bias transistor 421p is a bipolar transistor.

With this configuration, the first bias transistor 421n and the second bias transistor 421p are controlled by using current, whereby the bias to be provided to the amplifier transistor 501 can be adjusted.

Alternatively, in the power amplifier circuits 61 to 66, each of the first bias transistor 421n and the second bias transistor 421p may be a field-effect transistor.

With this configuration, the first bias transistor 421n and the second bias transistor 421p are controlled by using voltage, whereby the bias to be provided to the amplifier transistor 501 can be adjusted.

The power amplifier devices 11 and 11a include the first member 110 having the first circuit 400, the second member 210 having the second circuit 500, and the member-to-member connection conductor 351a, the bonding wire 352a, or a bump that electrically connects the first circuit 400 and the second circuit 500 to each other. The second member 210 is mounted on the first member 110. The second circuit 500 includes the amplifier transistor 501 and the resistance element 502. The amplifier transistor 501 has a base to which the input signal RFin is to be supplied, and is configured to amplify the input signal RFin and output the amplified signal. The resistance element 502 has a first end, and a second end electrically connected to the base of the amplifier transistor 501. The first circuit 400 includes the first bias transistor 421n and the second bias transistor 421p. The first bias transistor 421n has a collector to which the first voltage V1 is to be applied, a base to which the first bias voltage VB1 is to be applied, and an emitter electrically connected to the first end of the resistance element 502 and configured to supply a bias current to the base of the amplifier transistor 501 through the resistance element 502. The second bias transistor 421p has an emitter electrically connected to the emitter of the first bias transistor 421n and the first end of the resistance element 502, a base to which the second bias voltage VB2 is to be applied, and a collector to which the second voltage V2 lower than the first voltage V1 is to be applied.

With this configuration, in the AC component included in the base bias current Ieef flowing from the Bout terminal 425 disposed between the emitter of the first bias transistor 421n and the emitter of the second bias transistor 421p to the resistance element 502, a current having a positive instantaneous value is allowed to flow to the resistance element 502 through the base to the emitter of the first bias transistor 421n, and a current having a negative instantaneous value is allowed to flow from the resistance element 502 to the base of the second bias transistor 421p through the emitter of the second bias transistor 421p. As a result, the base bias circuits 401 to 406 in the power amplifier circuits 61 to 66 can be prevented from being brought into the cut-off state. Thus, even if the AC component included in the base bias current Ieef is changed in amplitude, a change in the time average of the base bias current Ieef can be suppressed. Since a change in the time average of the base bias current Ieef can be suppressed, a change in the operating point of the amplifier transistor 501 can be suppressed. Accordingly, a change in the amplification factor of the amplifier transistor 501 can be suppressed regardless of the magnitude of the amplitude of the RF current in the input signal RFin. Thus, it is possible to suppress a change in the operating point of the amplifier transistor 501 and suppress deterioration in the linearity of a relationship between input and output.

The RF circuit module 300 includes the power amplifier device 11, and the module substrate 310 having the substrate-side electrodes 311 and 312. The first member 110 has the first conductor protrusions 116 to be connected to the substrate-side electrodes 311 in the module substrate 310, and is flip-chip bonded to the module substrate 310 through the first conductor protrusions 116. The member-to-member connection conductor 351a is a conductor formed on or in any one of the first member 110 and the second member 210 and is configured to electrically connect the first circuit 400 and the second circuit 500 to each other without the intervention of the module substrate 310. The second member 210 has the second conductor protrusions 216 to be connected to the substrate-side electrodes 312 in the module substrate 310.

As described above, the first member 110 is flip-chip bonded to the module substrate 310. This configuration eliminates the need for a space for pads and wires for wire bonding, leading to a reduction in the entire size of the power amplifier device 11. Further, the first member 110 has the first conductor protrusions 116 to be connected to the substrate-side electrodes 311 in the module substrate 310, and the second member 210 has the second conductor protrusions 216 to be connected to the substrate-side electrodes 312 in the module substrate 310. With this configuration, the first circuit 400 and the second circuit 500 can be electrically connected to the module substrate 310. In addition, the first circuit 400 and the second circuit 500 are electrically connected to each other through the member-to-member connection conductor 351a without the intervention of the module substrate 310. This configuration eliminates the need to provide the module substrate 310 with wiring for connecting the first circuit 400 and the second circuit 500 to each other. As a result, the entire size of the power amplifier device 11 can be reduced. Since heat generated by the amplifier transistor 501 and the like included in the second circuit 500 formed in the second member 210 can be conducted through two paths, that is, the heat radiation path to the first member 110 and the heat radiation path to the module substrate 310, it is possible to radiate and exhaust heat with high efficiency. As a result, it is possible to provide the power amplifier device 11 reduced in size without constraints to heat radiation properties or the power amplifier device 11 having heat radiation properties with a small size.

In the power amplifier devices 11 and 11a, the first member 110 is a member made of an elemental semiconductor. The second member 210 is a member made of a compound semiconductor.

With this configuration, in the second member 210, the high-performance amplifier transistor 501 can be made of a compound semiconductor, for example, GaAs. The first member 110 can be made of, as a material, an elemental semiconductor, for example, Si, which is suitable for forming an npn-type bipolar junction transistor (BJT), a pnp-type BJT, an N-channel FET, and a P-channel FET. As a result, the first bias transistor 421*n* and the second bias transistor 421*p* can be easily formed in the first member 110.

In the power amplifier devices 11 and 11*a*, the first member 110 has larger thermal conductivity than the second member 210.

With this configuration, in the second member 210 having low thermal conductivity, heat generated by the amplifier transistor 501 is radiated in a small amount. However, as a result of the conduction of the heat to the first member 110 through the member-to-member connection conductor 351*a*, the heat can be radiated in the first member 110. The temperature increase of the amplifier transistor 501 can therefore be effectively suppressed.

In the power amplifier devices 11 and 11*a*, the second member 210 has a smaller thickness than the first member 110.

As described above, the thin second member 210 is mounted on the thick first member 110. This configuration can reduce the overall thickness of the power amplifier device 11 having a two-chip stack structure.

The embodiments described above are intended to facilitate understanding of the present disclosure and are not to be used to construe the present disclosure in a limiting fashion. The present disclosure may be modified/improved without departing from the gist thereof, and the present disclosure also includes its equivalents. That is, the embodiments may be appropriately modified in design by a person skilled in the art, and such modifications also fall within the scope of the present disclosure so long as the modifications include the features of the present disclosure. For example, the elements included in the embodiments and the arrangement, materials, conditions, shapes, sizes, and so on thereof are not limited to those illustrated exemplarily but can be modified as appropriate. In addition, it is to be understood that the embodiments are for illustrative purposes and that partial substitutions or combinations of components illustrated in different embodiments can be made. Such substitutions or combinations also fall within the scope of the present disclosure so long as the substitutions or combinations include the features of the present disclosure.

What is claimed is:

1. A power amplifier circuit comprising:
   an amplifier transistor having a base to which a radio frequency signal is to be supplied and configured to amplify the radio frequency signal and output the amplified radio frequency signal;
   a resistance element having a first end, and a second end electrically connected to the base of the amplifier transistor;
   a first bias transistor having a collector to which a first voltage is to be applied, a base to which a first bias voltage is to be applied, and an emitter electrically connected to the first end of the resistance element and configured to supply a bias current to the base of the amplifier transistor through the resistance element;
   a second bias transistor having an emitter electrically connected to the emitter of the first bias transistor and the first end of the resistance element, a base to which a second bias voltage is to be applied, and a collector to which a second voltage lower than the first voltage is to be applied; and
   a reference circuit including
      a first diode having an anode connected to the base of the first bias transistor, and a cathode,
      a second diode having an anode connected to the cathode of the first diode, and a cathode connected to the base of the second bias transistor, and
      a control terminal configured to control a current flowing from the cathode of the first diode to the anode of the second diode.

2. The power amplifier circuit according to claim 1, further comprising:
   a first application circuit disposed between a power supply and the collector of the first bias transistor and configured to apply the first voltage to the collector of the first bias transistor, the first voltage being lower than a voltage of the power supply; and
   a second application circuit disposed between ground and the collector of the second bias transistor and configured to apply the second voltage to the collector of the second bias transistor, the second voltage being higher than the ground.

3. The power amplifier circuit according to claim 1, wherein
   the reference circuit further includes a shunt terminal connected to the cathode of the first diode and configured to shunt a portion of the current flowing from the cathode of the first diode to the anode of the second diode to an external circuit.

4. The power amplifier circuit according to claim 3, wherein
   the reference circuit further includes an operational amplifier having an inverting input terminal connected to the cathode of the first diode, and a non-inverting input terminal connected to the shunt terminal and the control terminal.

5. The power amplifier circuit according to claim 1, wherein
   the reference circuit further includes a third application circuit disposed between ground and the cathode of the second diode and configured to apply the second bias voltage to the cathode of the second diode.

6. The power amplifier circuit according to claim 1, further comprising:
   a third bias transistor having a collector to which the first voltage is to be applied, an emitter connected to the base of the first bias transistor and configured to apply the first bias voltage to the base of the first bias transistor, and a base to which a third bias voltage for controlling a current flowing from the collector to the emitter is to be applied; and
   a fourth bias transistor having a collector to which the second voltage is to be applied, an emitter connected to the base of the second bias transistor and configured to apply the second bias voltage to the base of the second bias transistor, and a base to which a fourth bias voltage for controlling a current flowing from the emitter to the collector is to be applied.

7. The power amplifier circuit according to claim 6, wherein
   the reference circuit further includes
      a third diode having an anode connected to the base of the third bias transistor, and a cathode,
      a fourth diode having an anode connected to the cathode of the third diode, and a cathode,
      a fifth diode having an anode connected to the cathode of the fourth diode, and a cathode,
      a sixth diode having an anode connected to the cathode of the fifth diode, and a cathode connected to the base of the fourth bias transistor, and
      the control terminal is further configured to control a current flowing from the cathode of the third diode to the anode of the sixth diode.

8. The power amplifier circuit according to claim 7, wherein
the reference circuit further includes a shunt terminal connected to the cathode of the fourth diode and configured to shunt a portion of current flowing from the cathode of the fourth diode to the anode of the fifth diode to an external circuit.

9. The power amplifier circuit according to claim 8, wherein
the reference circuit further includes an operational amplifier having an inverting input terminal connected to the cathode of the fourth diode, and a non-inverting input terminal connected to the shunt terminal and the control terminal.

10. The power amplifier circuit according to claim 7, wherein
the third diode is a diode-connected transistor having a characteristic that is substantially the same as a characteristic of the third bias transistor,
the fourth diode is a diode-connected transistor having a characteristic that is substantially the same as a characteristic of the first bias transistor,
the fifth diode is included in a transistor having a characteristic that is substantially the same as a characteristic of the second bias transistor, and
the sixth diode is a diode-connected transistor having a characteristic that is substantially the same as a characteristic of the fourth bias transistor.

11. The power amplifier circuit according to claim 3, wherein
the external circuit includes a seventh diode, and
the seventh diode is thermally coupled to the amplifier transistor, and has an anode connected to the shunt terminal in the reference circuit, and a cathode that is grounded.

12. The power amplifier circuit according to claim 1, wherein
the first bias transistor and the second bias transistor are each a bipolar transistor.

13. The power amplifier circuit according to claim 1, wherein
the first bias transistor and the second bias transistor are each a field-effect transistor,
a gate of the field-effect transistor corresponds to the base of the first bias transistor or the second bias transistor,
a source of the field-effect transistor corresponds to the emitter of the first bias transistor or the second bias transistor, and
a drain of the field-effect transistor corresponds to the collector of the first bias transistor or the second bias transistor.

14. A power amplifier device comprising:
a first member including a first circuit;
a second member including a second circuit; and
a member-to-member connection conductor configured to electrically connect the first circuit and the second circuit to each other, wherein
the second member is mounted on the first member,
the second circuit includes
an amplifier transistor having a base to which a radio frequency signal is to be supplied and configured to amplify the radio frequency signal and output the amplified radio frequency signal, and
a resistance element having a first end, and a second end electrically connected to the base of the amplifier transistor, and
the first circuit includes
a first bias transistor having a collector to which a first voltage is to be applied, a base to which a first bias voltage is to be applied, and an emitter electrically connected to the first end of the resistance element and configured to supply a bias current to the base of the amplifier transistor through the resistance element, and
a second bias transistor having an emitter electrically connected to the emitter of the first bias transistor and the first end of the resistance element, a base to which a second bias voltage is to be applied, and a collector to which a second voltage lower than the first voltage is to be applied.

15. The power amplifier device according to claim 14, wherein
the first member is a member made of an elemental semiconductor, and
the second member is a member made of a compound semiconductor.

16. The power amplifier device according to claim 14, wherein
the first member has larger thermal conductivity than the second member.

17. The power amplifier device according to claim 14, wherein
the second member has a smaller thickness than the first member.

18. An RF circuit module comprising:
the power amplifier device according to claim 14; and
a substrate having an electrode, wherein
the first member has a first member-side conductor protrusion portion to be connected to the electrode of the substrate, and is flip-chip bonded to the substrate through the first member-side conductor protrusion portion,
the member-to-member connection conductor is a conductor formed on or in any one of the first member and the second member and electrically connects the first circuit and the second circuit to each other without intervention of the substrate, and
the second member has a second member-side conductor protrusion portion to be connected to the electrode of the substrate.

* * * * *